US012684818B2

(12) United States Patent
Pan et al.

(10) Patent No.: US 12,684,818 B2
(45) Date of Patent: Jul. 14, 2026

(54) SEMICONDUCTOR DEVICE AND METHOD FOR MANUFACTURING THEREOF

(71) Applicant: TAIWAN SEMICONDUCTOR MANUFACTURING COMPANY, LTD., Hsinchu (TW)

(72) Inventors: Kuan-Ting Pan, Taipei (TW); Kuo-Cheng Chiang, Hsinchu (TW); Shi Ning Ju, Hsinchu (TW); Chia-Hao Chang, Hsinchu (TW); Chih-Hao Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 497 days.

(21) Appl. No.: 18/106,724

(22) Filed: Feb. 7, 2023

(65) Prior Publication Data

US 2024/0154014 A1 May 9, 2024

Related U.S. Application Data

(60) Provisional application No. 63/422,944, filed on Nov. 5, 2022.

(51) Int. Cl.
*H01L 29/423* (2006.01)
*H10D 30/67* (2025.01)
(Continued)

(52) U.S. Cl.
CPC ..... *H10D 30/6735* (2025.01); *H10D 30/6757* (2025.01); *H10D 62/121* (2025.01);
(Continued)

(58) Field of Classification Search
CPC ........... H10D 30/6735; H10D 30/6757; H10D 62/121; H10D 62/151; H10D 64/017;
(Continued)

(56) References Cited

U.S. PATENT DOCUMENTS 9,105,490 B2    8/2015   Wang et al.
9,236,267 B2    1/2016   De et al.
(Continued)

FOREIGN PATENT DOCUMENTS

CN        114446952 A      5/2022
TW        202238996 A     10/2022
WO    WO-2022170605 A1 *  8/2022    ............. H10D 30/43

OTHER PUBLICATIONS

Examination Report dated Sep. 5, 2025 of the corresponding German patent application 102023126775.2.

*Primary Examiner* — Jarrett J Stark

(74) *Attorney, Agent, or Firm* — NZ Carr Law Office

(57) ABSTRACT

The present disclosure provides a forksheet structure in a semiconductor device and methods of manufacturing thereof. The forksheet structure according to the present disclosure includes a dielectric wall disposed between two channel regions inside a gate structure and without extending through the sidewall spacers to the source/drain regions. In some embodiments, a cut metal gate (CMG) dielectric structure is formed in the gate structure along with the dielectric walls. A gate dielectric layer is in contact with the dielectric wall. In some embodiments, the dielectric layer surrounds semiconductor channels in the channel region. In other embodiments, the gate dielectric layer surrounds a portion of the semiconductor channels in the channel region, for example forming a π-shape cross sectional profile around the semiconductor channel.

20 Claims, 62 Drawing Sheets

(51) Int. Cl.

| | |
|---|---|
| *H10D 62/10* | (2025.01) |
| *H10D 62/13* | (2025.01) |
| *H10D 64/01* | (2025.01) |
| *H10D 84/01* | (2025.01) |
| *H10D 84/03* | (2025.01) |
| *H10W 20/00* | (2026.01) |

(52) U.S. Cl.
   CPC ......... *H10D 62/151* (2025.01); *H10D 64/017* (2025.01); *H10D 64/021* (2025.01); *H10D 84/013* (2025.01); *H10D 84/0147* (2025.01); *H10D 84/0158* (2025.01); *H10D 84/038* (2025.01); *H10W 20/033* (2026.01)

(58) Field of Classification Search
   CPC .............. H10D 64/021; H10D 84/013; H10D 84/0147; H10D 84/0158; H10D 84/038; H10D 30/797; H10D 62/822; H10D 84/83; H10D 84/85; H10D 84/0172; H10D 84/0193; H10D 84/853; H01L 21/76843; H10W 20/033
   See application file for complete search history.

(56) References Cited

U.S. PATENT DOCUMENTS

| | | | | |
|---|---|---|---|---|
| 9,236,300 | B2 | | 1/2016 | Liaw |
| 9,406,804 | B2 | | 8/2016 | Huang et al. |
| 9,443,769 | B2 | | 9/2016 | Wang et al. |
| 9,520,482 | B1 | | 12/2016 | Chang et al. |
| 9,548,366 | B1 | | 1/2017 | Ho et al. |
| 9,576,814 | B2 | | 2/2017 | Wu et al. |
| 9,831,183 | B2 | | 11/2017 | Lin et al. |
| 9,859,386 | B2 | | 1/2018 | Ho et al. |
| 10,741,450 | B2 | * | 8/2020 | Chang ............... H01L 21/31111 |
| 10,867,101 | B1 | * | 12/2020 | Lin ...................... G06F 30/392 |
| 2016/0111449 | A1 | * | 4/2016 | Hafez ................. H10D 86/215 |
| | | | | 438/275 |
| 2017/0229451 | A1 | * | 8/2017 | Chang ................. H10D 62/115 |
| 2021/0193821 | A1 | | 6/2021 | Dentoni Litta et al. |
| 2021/0376076 | A1 | | 12/2021 | Su et al. |
| 2022/0093592 | A1 | * | 3/2022 | Guler ................. H10D 84/038 |
| 2022/0254776 | A1 | | 8/2022 | Cheng et al. |
| 2022/0359514 | A1 | * | 11/2022 | Huang .................. H10D 30/43 |
| 2022/0359661 | A1 | * | 11/2022 | Liaw ..................... H10D 84/83 |
| 2023/0024357 | A1 | * | 1/2023 | Huang ............... H10D 84/013 |
| 2023/0060825 | A1 | * | 3/2023 | Kao .................. H10D 30/6735 |
| 2023/0097948 | A1 | * | 3/2023 | Mehandru ........... H10D 84/038 |
| | | | | 257/288 |
| 2023/0317810 | A1 | * | 10/2023 | You .................... H10D 30/6735 |
| | | | | 257/370 |
| 2023/0335610 | A1 | * | 10/2023 | Huang .............. H10D 30/6219 |
| 2024/0170331 | A1 | * | 5/2024 | Kang ................. H10D 62/121 |
| 2024/0258415 | A1 | * | 8/2024 | Chiang .............. H10D 30/014 |
| 2024/0395861 | A1 | * | 11/2024 | Wang ................. H10D 62/121 |
| 2024/0421200 | A1 | * | 12/2024 | Lin ...................... H10D 84/85 |
| 2025/0089309 | A1 | * | 3/2025 | Lin ..................... H10D 62/115 |

* cited by examiner

SEMICONDUCTOR DEVICE AND METHOD FOR MANUFACTURING THEREOF

CROSS-REFERENCE TO RELATED APPLICATIONS

This application claims priority to U.S. Provisional Application Ser. No. 63/422,944 filed Nov. 5, 2022, which is incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density, i.e., the number of interconnected devices per chip area, has generally increased while geometric size, i.e., the smallest component that can be created using a fabrication process, has decreased. Such advances have increased the complexity of manufacturing and processing ICs; similar developments in IC processing and manufacturing are being developed to meet this progress.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
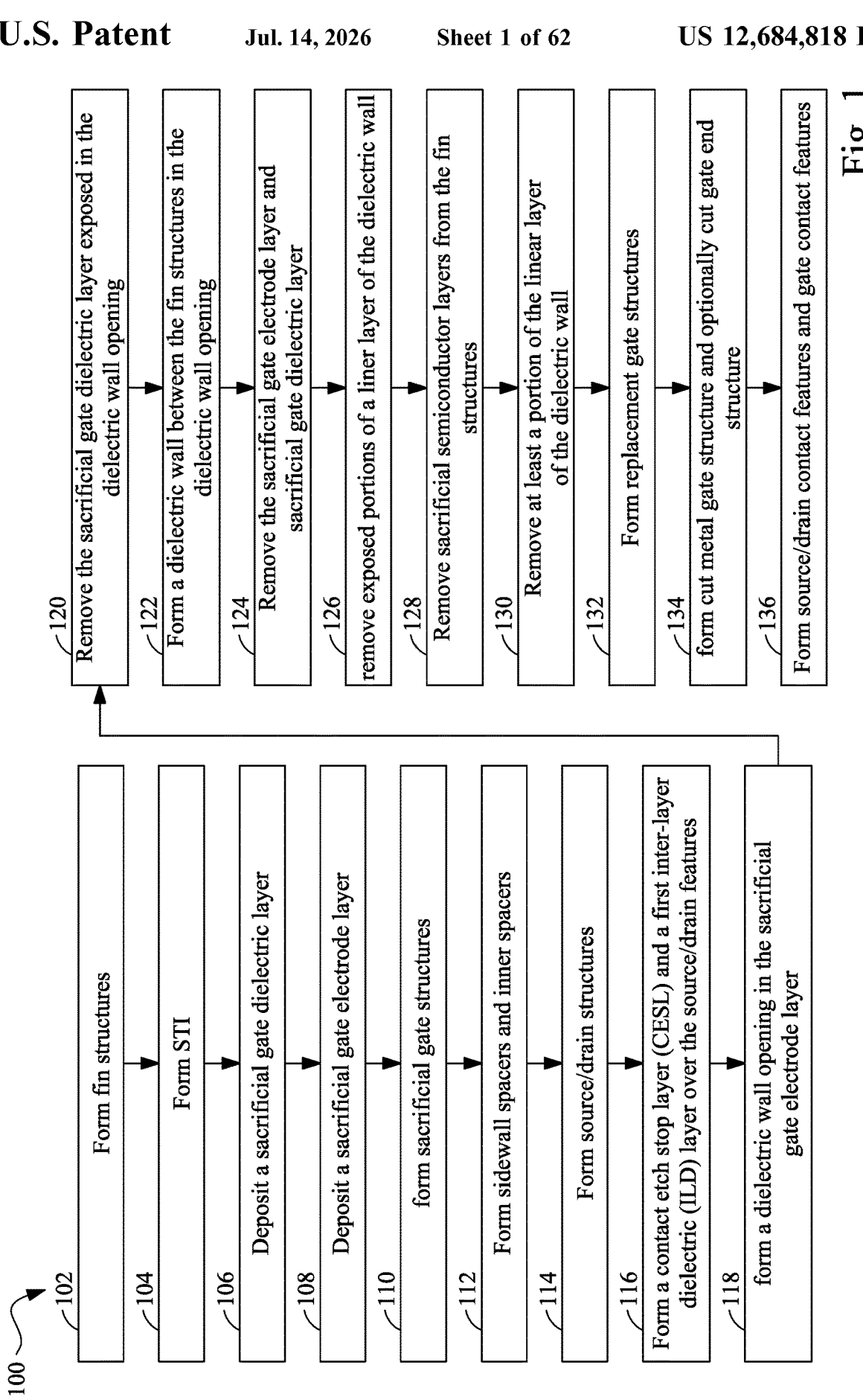
FIG. 1 is a flow chart of a method for manufacturing of a semiconductor device according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The foregoing broadly outlines some aspects of embodiments described in this disclosure. While some embodiments described herein are described in the context of nanosheet channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In addition, although method embodiments may be described in a particular order, various other method embodiments may be performed in any logical order and may include fewer or more steps than what is described herein. Source/drain region(s) may refer to a source or a drain, individually or collectively dependent upon the context.

The present disclosure provides a forksheet structure in a semiconductor device and methods of manufacturing thereof. The forksheet structure according to the present disclosure includes a dielectric wall disposed between two channel regions inside a gate structure and without extending through the sidewall spacers to the source/drain regions. In some embodiments, a cut metal gate (CMG) dielectric structure is formed in the gate structure along with the dielectric walls. A gate dielectric layer is in contact with the dielectric wall. In some embodiments, the dielectric layer surrounds semiconductor channels in the channel region. In other embodiments, the gate dielectric layer surrounds a portion of the semiconductor channels in the channel region, for example forming a π-shape cross sectional profile around the semiconductor channel.

Figure 2:
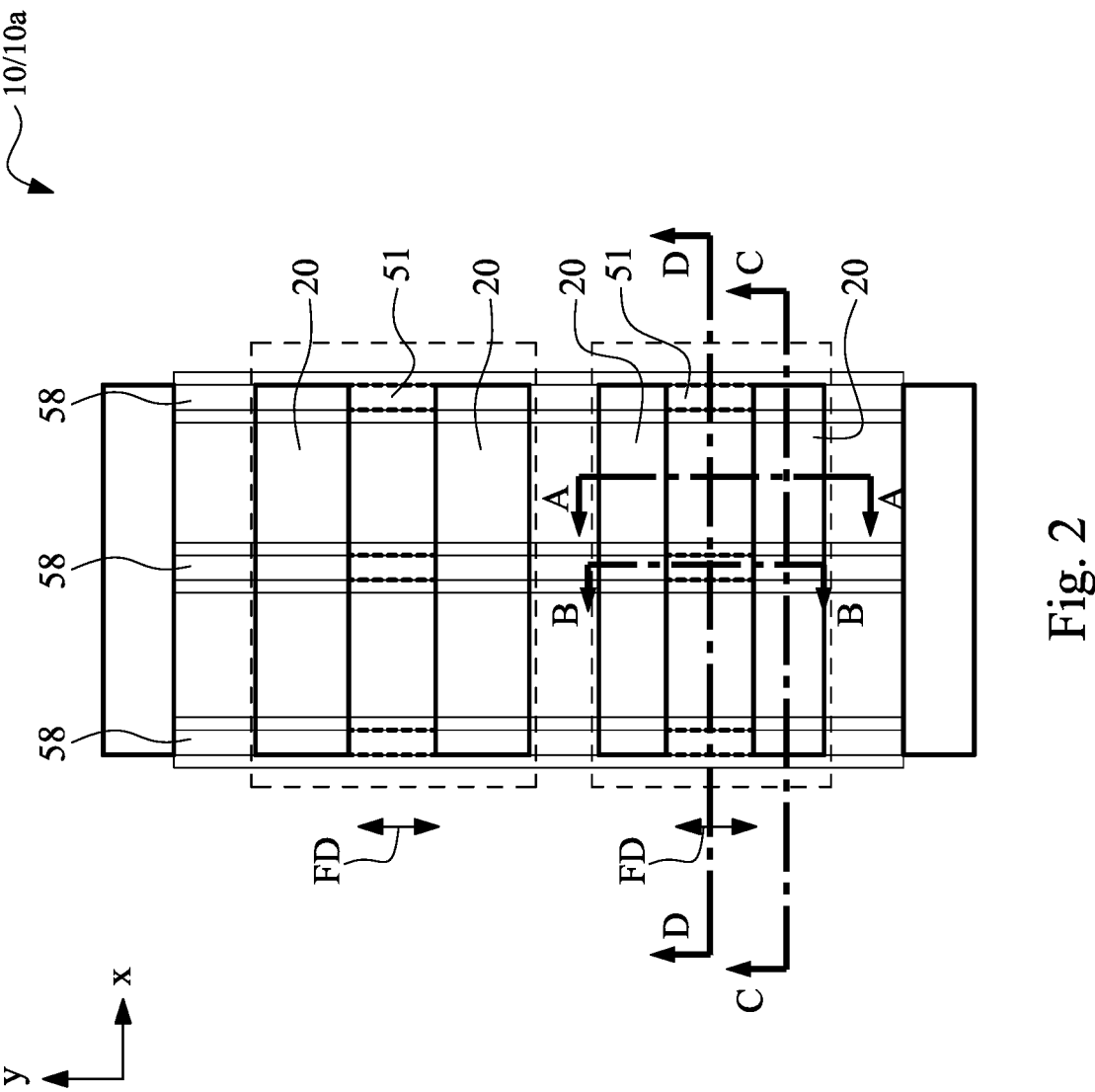
FIG. 2 is a schematic layout view of a semiconductor device according to embodiments of the present disclosure.

FIG. 1 is a flow chart of a method 100 for manufacturing of a semiconductor device 10 according to embodiments of the present disclosure. FIG. 2 is a schematic layout view of a semiconductor device 10 according to embodiments of the present disclosure. FIGS. 3-6, 7A-7C, 8A-8C, 9A-9C, 10A-10C, 11A-11C, 12A-12C, 13A-13C, 14A-14C, 15A-15C, 16A-16C, 17, 18A-18C, 19A-19C, 20A-20G, 21A-21B, and 22A-22D schematically illustrate various stages of manufacturing the semiconductor device 10 according to embodiments of the present disclosure. Additional operations can be provided before, during, and after operations/processes in the method 100, and some of the operations described below can be replaced or eliminated, for additional embodiments of the method. The order of the operations/processes may be interchangeable.

As shown in FIG. 2, the semiconductor device 10 may include multiple fin structures 20 along the x-axis, and multiple gate structures 58 along the y-axis. Dielectric walls 51 may be formed between neighboring fin structures 20 and within a gate structure 58 to form a forksheet structure. By forming the dielectric walls 51 within the gate structure, the semiconductor device 10 reduces a fin structure distance FD, which is defined as a distance of the gap between two neighboring fin structures 20, as illustrated in FIG. 2. In some embodiments, the fin structure distance FD may be reduced for a percentage in a range between 25% and 35% with the dielectric walls 51 described below.

Figure 3:
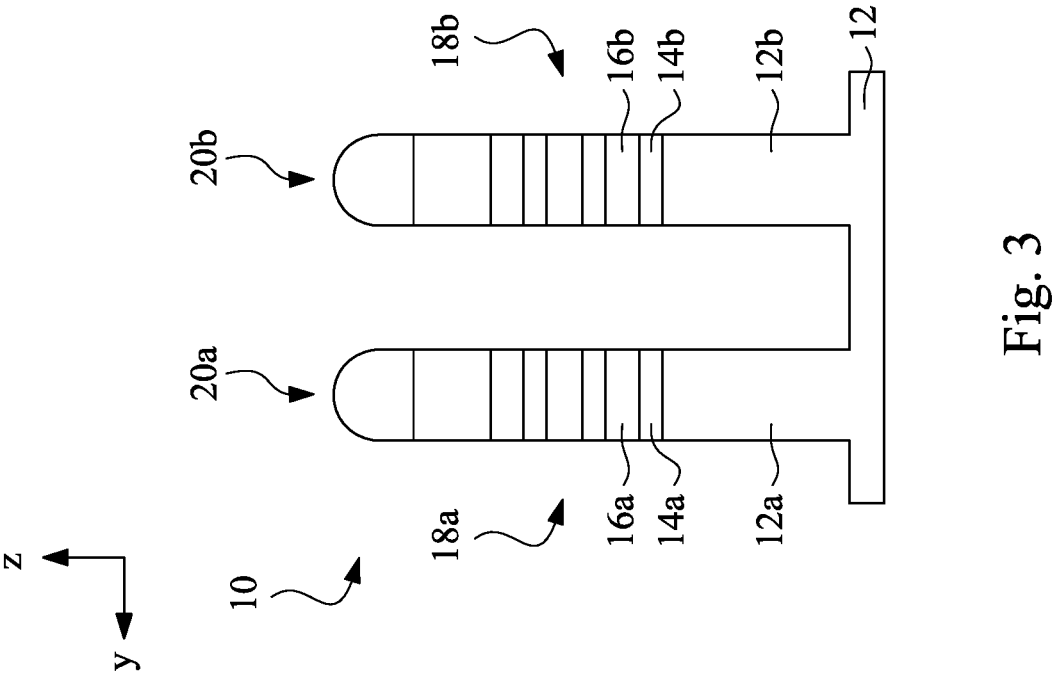

The method 100 begins at operation 102 where semiconductor fins 20a, 20b are formed over a substrate 12, as shown in FIG. 3. FIG. 3 is a schematic cross sectional view along the A-A line in FIG. 2. The substrate 12 is provided to form the semiconductor device 10 thereon. The substrate 12 may include a single crystalline semiconductor material such as, but not limited to Si, Ge, SiGe, GaAs, InSb, GaP, GaSb, InAlAs, InGaAs, GaSbP, GaAsSb, and InP. The substrate 12 may include various doping configurations depending on circuit design. For example, different doping profiles, e.g., n-wells, p-wells, may be formed in the substrate 12 in regions designed for different device types, such as n-type field effect transistors (nFET), and p-type field effect transistors (pFET). In some embodiments, the substrate 12 may be a silicon-on-insulator (SOI) substrate including an insulator structure (not shown) for enhancement.

In the embodiment shown in FIG. 3, the substrate 12 includes a p-doped region or p-well 12b and an n-doped region or n-well 12a. One or more n-type devices, such as nFETs, are to be formed over and/or within p-well 12b. One or more p-type devices, such as pFETs, are to be formed over and/or within n-well 12a. FIG. 3 shows that the p-well 12b is in a doped local region of a doped substrate, which is not limiting. In other embodiments, the p-well 12b and the n-well 12a may be separated by one or more insulation bodies, e.g., shallow trench insulation ("STI").

A semiconductor stack 18a may be formed over the n-well 12a and patterned to form the semiconductor fin 20a. The semiconductor stack 18a includes alternating semiconductor layers made of different materials to facilitate formation of nanosheet channels in a multi-gate n-type device, such as nanosheet channel pFETs. In some embodiments, the semiconductor stack 18a includes first semiconductor layers 14a interposed by second semiconductor layers 16a. The first semiconductor layers 14a and second semiconductor layers 16a have different compositions. In some embodiments, the two semiconductor layers 14a and 16a provide for different oxidation rates and/or different etch selectivity. In later fabrication stages, portions of the second semiconductor layers 16a form nanosheet channels in a multi-gate device. Three first semiconductor layers 14a and three second semiconductor layers 16a are alternately arranged as illustrated in FIG. 3 as an example. More or less semiconductor layers 14a and 16a may be included in the semiconductor stack 18a depending on the desired number of channels in the semiconductor device to be formed. In some embodiments, the number of semiconductor layers 14a and 16a is between 1 and 10.

In some embodiments, the first semiconductor layer 14a may include silicon germanium (SiGe). The first semiconductor layer 14a may be a SiGe layer including more than 25% Ge in molar ratio. For example, the first semiconductor layer 14a may be a SiGe layer including Ge in a molar ration in a range between 25% and 50%. In some embodiments, the first semiconductor layer 14a and the first semiconductor layer 14? have substantially the same composition. The second semiconductor layer 16a may include silicon, Ge, a compound semiconductor such as SiC, GeAs, GaP, InP, InAs, and/or InSb, an alloy semiconductor such as SiGe, GaAsP, AlInAs, AlGaAs, InGaAs, GaInP, and/or GaInAsP, or combinations thereof. In some embodiments, the second semiconductor layer 16a may be a Ge layer. The second semiconductor layer 16a may include p-type dopants, boron etc.

A semiconductor stack 18b may be formed over the p-well 12b and then patterned to form the semiconductor fin 20b. The semiconductor stack 18b includes alternating semiconductor layers made of different materials to facilitate formation of nanosheet channels in a multi-gate n-type device, such as nanosheet channel nFETs. In some embodiments, the semiconductor stack 18b includes third semiconductor layers 14b interposed by fourth semiconductor layers 16b. The third semiconductor layers 14b and fourth semiconductor layers 16b have different compositions. In some embodiments, the two semiconductor layers 14b and 16b provide for different oxidation rates and/or different etch selectivity. In later fabrication stages, portions of the fourth semiconductor layers 16b form nanosheet channels in a multi-gate device. Three third semiconductor layers 14b and three fourth semiconductor layers 16b are alternately arranged as illustrated in FIG. 3 as an example. More or less semiconductor layers 14b and 16b may be included in the semiconductor stack 18b depending on the desired number of channels in the semiconductor device to be formed. In some embodiments, the number of semiconductor layers 14b and 16b is between 1 and 10.

In some embodiments, the third semiconductor layer 14b may include silicon germanium (SiGe). The third semiconductor layer 14b may be a SiGe layer including more than 25% Ge in molar ratio. For example, the third semiconductor layer 14b may be a SiGe layer including Ge in a molar ration in a range between 25% and 50%. The fourth semiconductor layer 16b may include silicon (Si). In some embodiments, the fourth semiconductor layer 16b may include n-type dopants, such as phosphorus (P), arsenic (As), etc.

The semiconductor layers 14a, 14b, 16a, 16b may be formed by a molecular beam epitaxy (MBE) process, a metalorganic chemical vapor deposition (MOCVD) process, and/or other suitable epitaxial growth processes.

In some embodiments, each semiconductor layer 16a, 16b has a thickness in a range between about 5 nm and about 30 nm. In other embodiments, each second semiconductor layer 16a, 16b has a thickness in a range between about 10 nm and about 20 nm. In some embodiments, each semiconductor layer 16a, 16b has a thickness in a range between about 6 nm and about 12 nm. In some embodiments, the semiconductor layers 16a in the semiconductor stack 18a and the semiconductor layers 16b in the semiconductor stack 18b are uniform in thickness.

The semiconductor layers 14a, 14b may eventually be removed and serve to define a vertical distance between adjacent channel regions for a subsequently formed multi-gate device. In some embodiments, the thickness of the semiconductor layer 14a, 14b is equal to or greater than the thickness of the semiconductor layer 16a, 16b. In some embodiments, each semiconductor layer 14a, 14b has a thickness in a range between about 5 nm and about 50 nm. In other embodiments, each semiconductor layer 14a, 14b has a thickness in a range between about 10 nm and about 30 nm.

The semiconductor stacks 18a, 18b may be formed separately. For example, the semiconductor stack 18a is first formed over the entire substrate, i.e. over both the n-well 12a and the p-well 12b then recesses are formed in the semiconductor stacks 18a in areas over the p-well 12b to expose the p-well 12b, and the semiconductor stack 18b is then formed in the recesses over the p-well 12b while the semiconductor stack 18a is covered by a mask layer.

In FIG. 3, the semiconductor fins 20a, 20b are formed from the semiconductor stacks 18a, 18b and a portion of the n-well 12a, the p-well 12b underneath respectively. Each semiconductor fin 20a, 20b has an active portion formed from the semiconductor stacks 18a, 18b, and a well portion formed in the n-well 12a, the p-well 12b, respectively. A trench 21 is formed between the semiconductor fins 20a, 20b. The trench 21 has a width W1 along the y-axis. In some embodiments, the width W1 is in a range between about 30 nm and about 46 nm. In some embodiments, a dielectric wall is subsequently formed in portions the trench 21 between the semiconductor fins 20a, 20b to form a forksheet structure.

Figure 4:
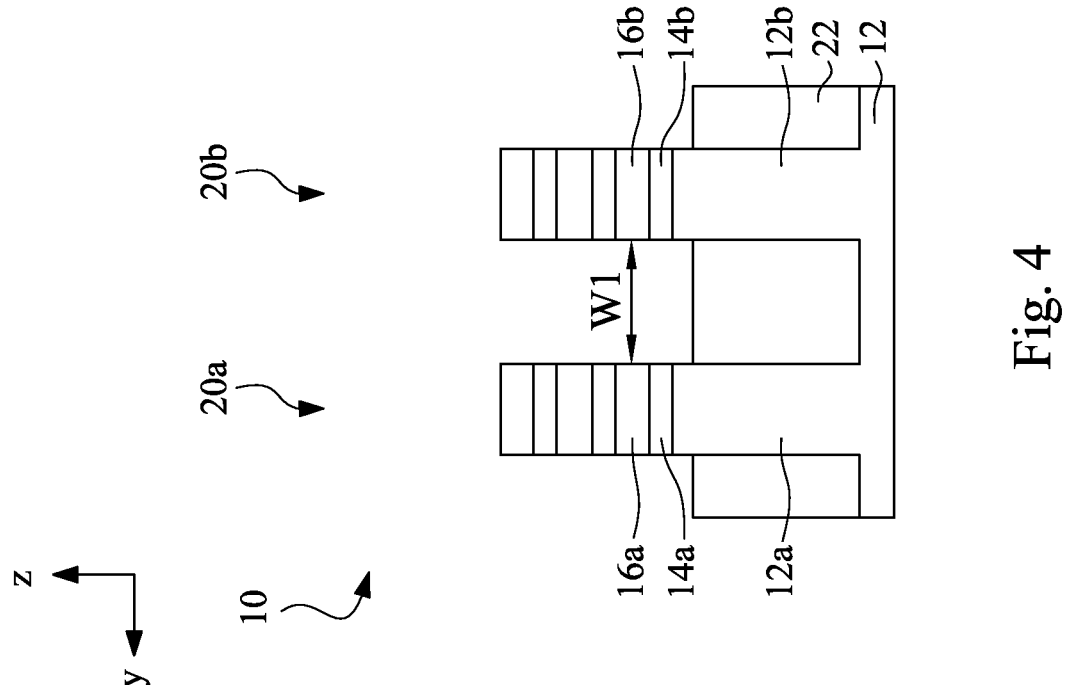
FIGS. 3-6, 7A-7C, 8A-8C, 9A-9C, 10A-10C, 11A-11C, 12A-12C, 13A-13C, 14A-14C, 15A-15C, 16A-16C, 17, 18A-18C, 19A-19C, 20A-20G, 21A-21B, and 22A-22D schematically illustrate various stages of manufacturing a semiconductor device according to embodiments of the present disclosure.

In operation 104, a shallow trench isolation (STI) layer 22 is formed, as shown in FIG. 4. FIG. 4 is a schematic cross sectional view along the A-A line in FIG. 2. An isolation material is filled in the trenches between the semiconductor fins 20a, 20b and then etched back to below the semiconductor stacks 18a, 18b of the semiconductor fins 20a, 20b. The isolation material is deposited over the substrate 12 to cover at least a part of the well portions of the semiconductor fins 20a, 20b. The isolation material may be formed by a high density plasma chemical vapor deposition (HDP-CVD), a flowable CVD (FCVD), or other suitable deposition process. In some embodiments, the isolation material may include silicon oxide, silicon nitride, silicon oxynitride, fluorine-doped silicate glass (FSG), a low-k dielectric, combinations thereof. In some embodiments, the isolation material is formed to cover the semiconductor fins 20a, 20b by a suitable deposition process to fill the trenches between the semiconductor fins 20a, 20b, and then recess etched using a suitable anisotropic etching process to expose the active portions of the semiconductor fins 20a, 20b resulting in the STI layer 22.

Figure 5:
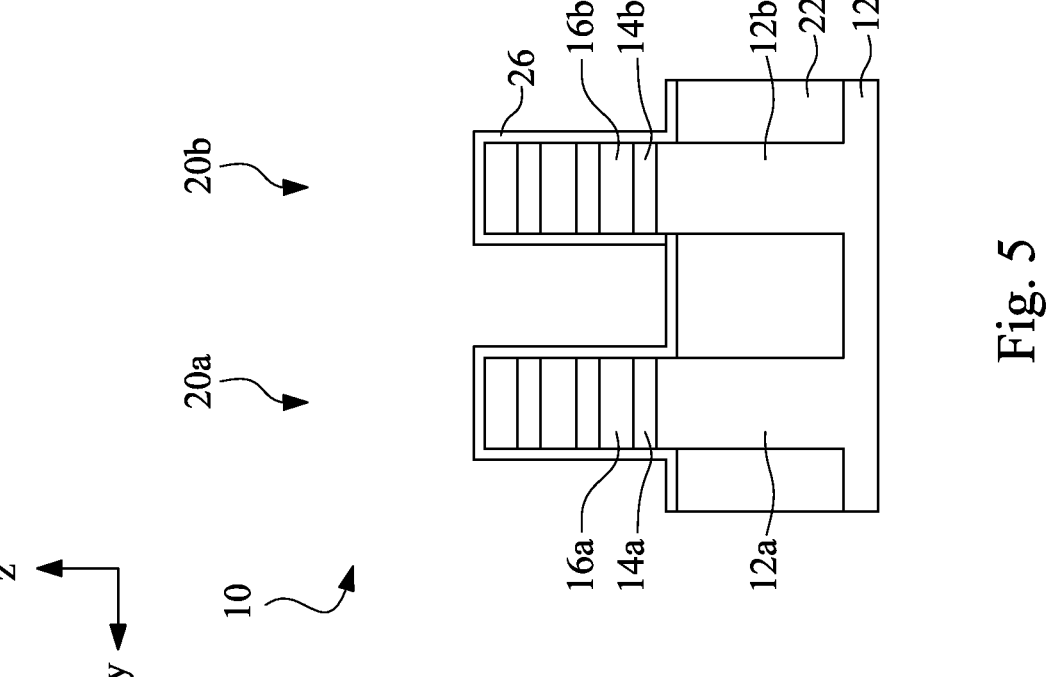

In operation 106, a sacrificial gate dielectric layer 26 is deposited over the exposed surfaces of the semiconductor device 10, as shown in FIG. 5. FIG. 5 is a schematic cross sectional view along the A-A line in FIG. 2. The sacrificial gate dielectric layer 26 may be formed conformally over the semiconductor fins 20a, 20b, and the isolation layer 22. In some embodiments, the sacrificial gate dielectric layer 26 may be deposited by a CVD process, a sub-atmospheric CVD (SACVD) process, a FCVD process, an ALD process, a PVD process, or other suitable process. The sacrificial gate dielectric layer 26 may include one or more layers of dielectric material, such as SiO₂, SiN, a high-k dielectric material, and/or other suitable dielectric material.

Figure 6:
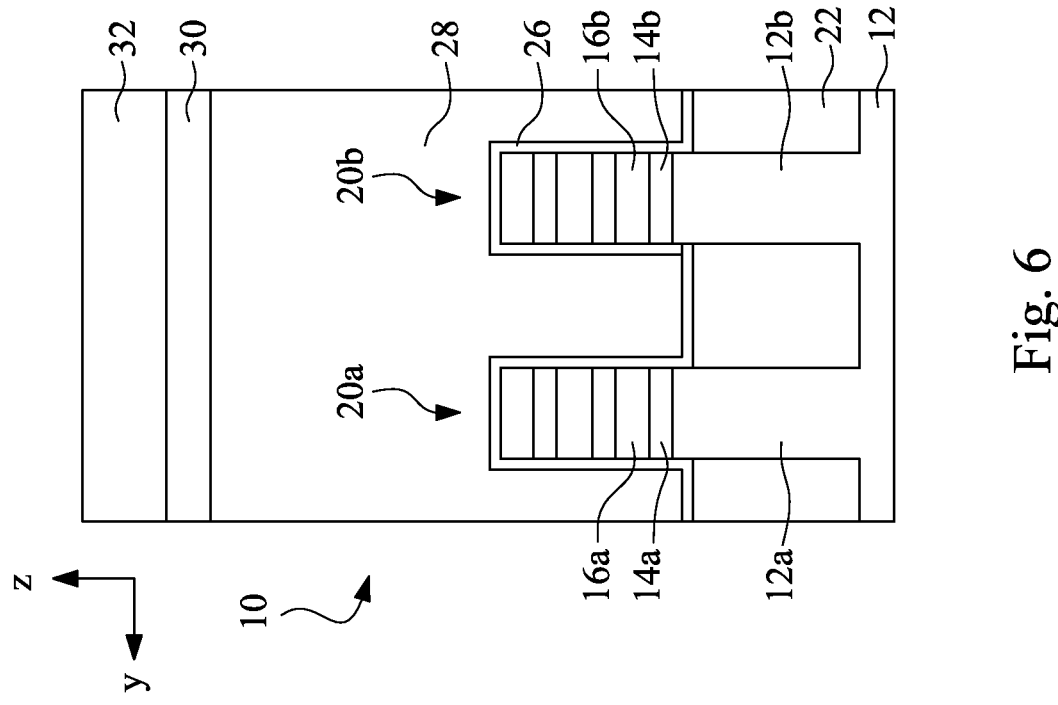

In operation 108, a sacrificial gate electrode layer 28 is deposited over the exposed surfaces of the semiconductor device 10, as shown in FIG. 6. FIG. 6 is a schematic cross sectional view along the A-A line in FIG. 2. The sacrificial gate electrode layer 28 may be blanket deposited on the over the sacrificial gate dielectric layer 26. The sacrificial gate electrode layer 28 includes silicon such as polycrystalline silicon or amorphous silicon. The thickness of the sacrificial gate electrode layer is in a range between about 42 nm and about 200 nm. In some embodiments, the sacrificial gate electrode layer 28 is subjected to a planarization operation. The sacrificial gate electrode layer 28 may be deposited using CVD, including LPCVD and PECVD, PVD, ALD, or other suitable process. Subsequently, the pad layer 30 and the mask layer 32 are formed over the sacrificial gate electrode layer 28. The pad layer 30 may include silicon nitride. The mask layer 32 may include silicon oxide.

Figures 7A, 7B:
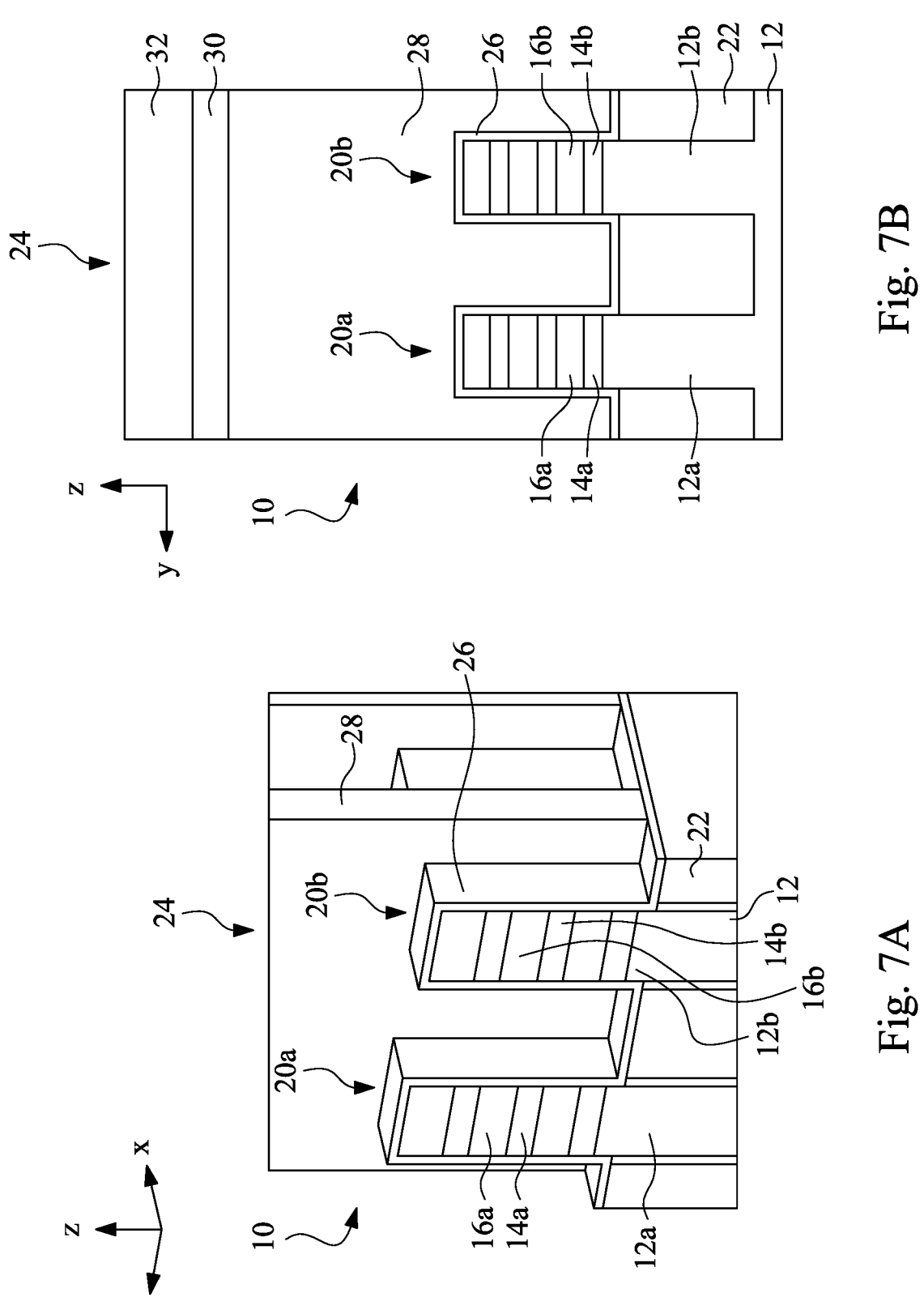
Figure 7C:
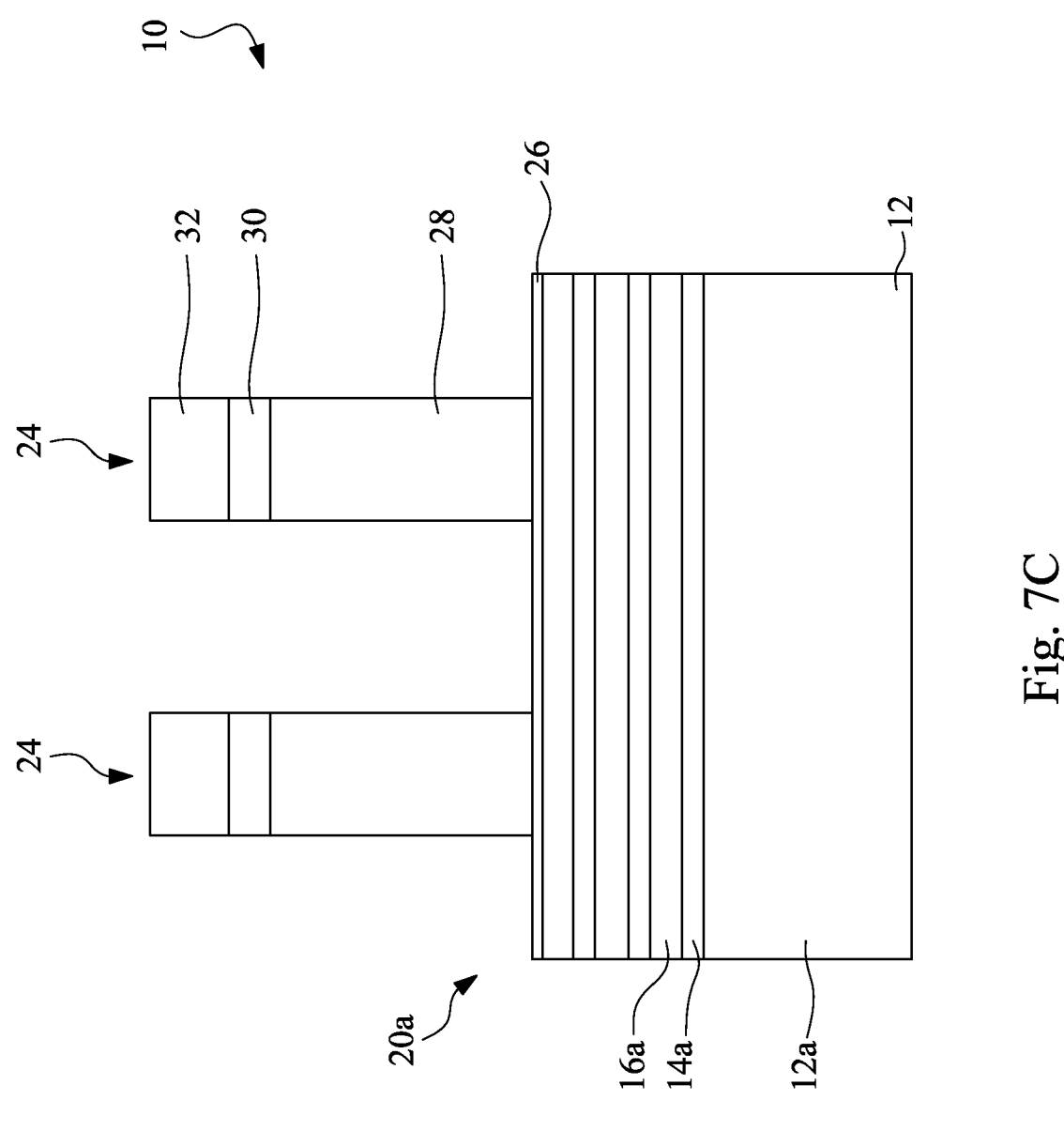
Figures 8A, 8B:
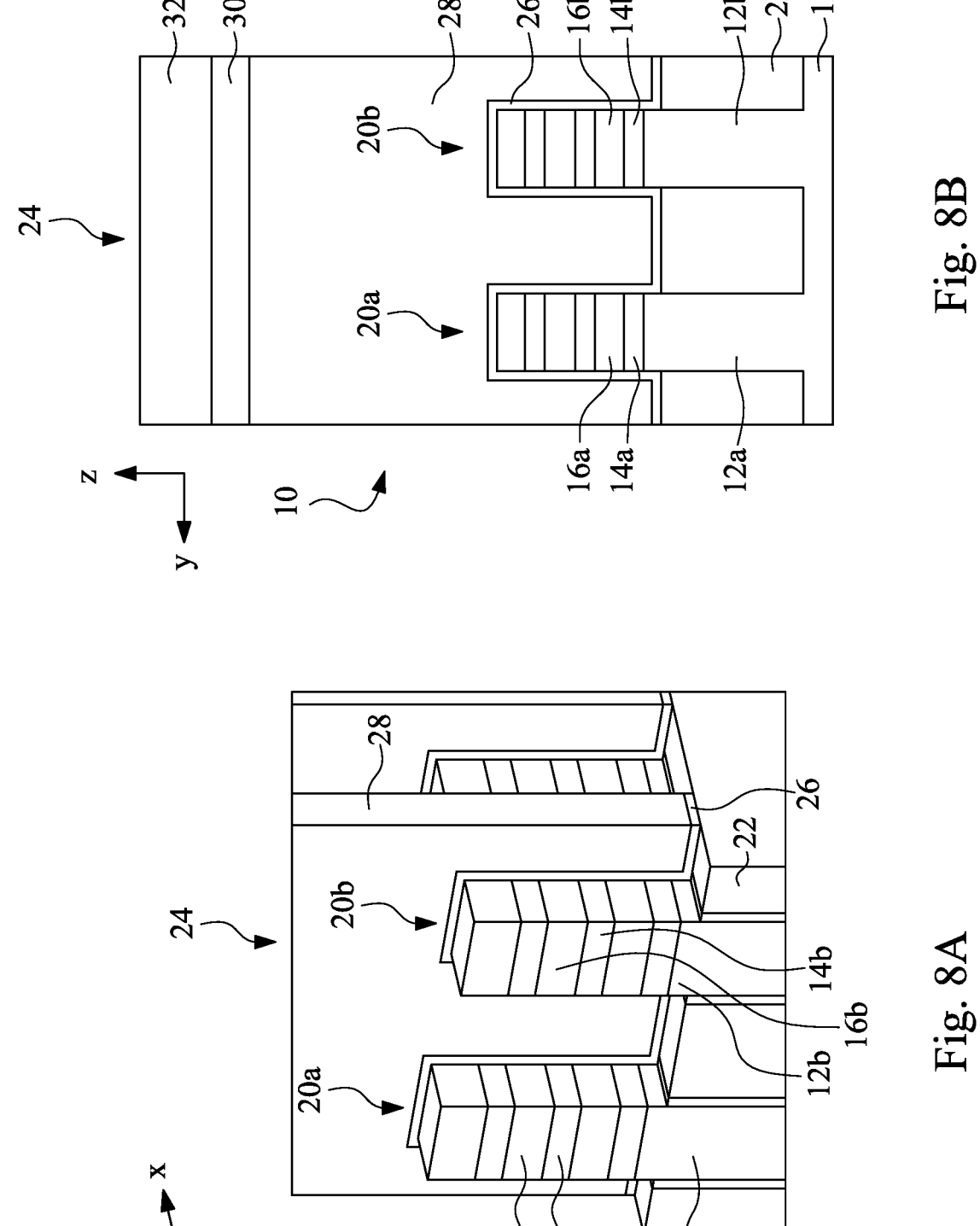
Figure 8C:
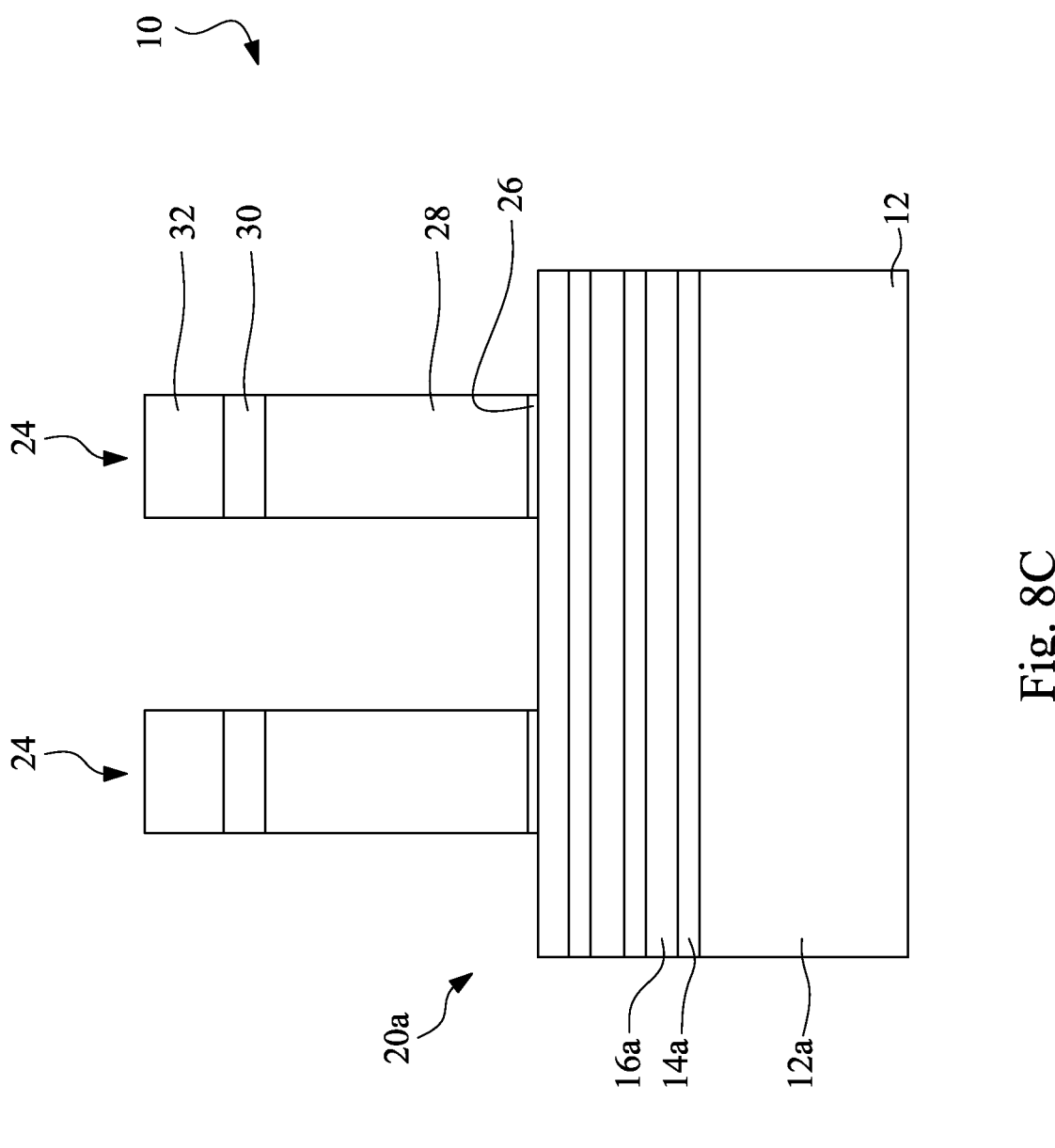

In operation 110, sacrificial gate structures 24 are formed, as shown in FIGS. 7A-7C and 8A-8C. FIGS. 7A and 8A are schematic perspective cross sectional views along the A-A line in FIG. 2. FIGS. 7B and 8B are schematic cross sectional views along the B-B line in FIG. 2. FIGS. 7C and 8C are schematic cross sectional views along the C-C line in FIG. 2.

The sacrificial gate structures 24 are formed over the isolation layer 22 and over the exposed portions of the semiconductor fins 20a, 20b. The sacrificial gate structures 24 are formed over portions of the semiconductor fins 20a, 20b which are to be channel regions. The sacrificial gate structures 24 may include the sacrificial gate dielectric layer 26, the sacrificial gate electrode layer 28, the pad layer 30, and the mask layer 32. A patterning operation is performed on the mask layer 32, the pad layer 30, the sacrificial gate electrode layer 28 and the sacrificial gate dielectric layer 26 to form the sacrificial gate structures 24.

Figure 9B:
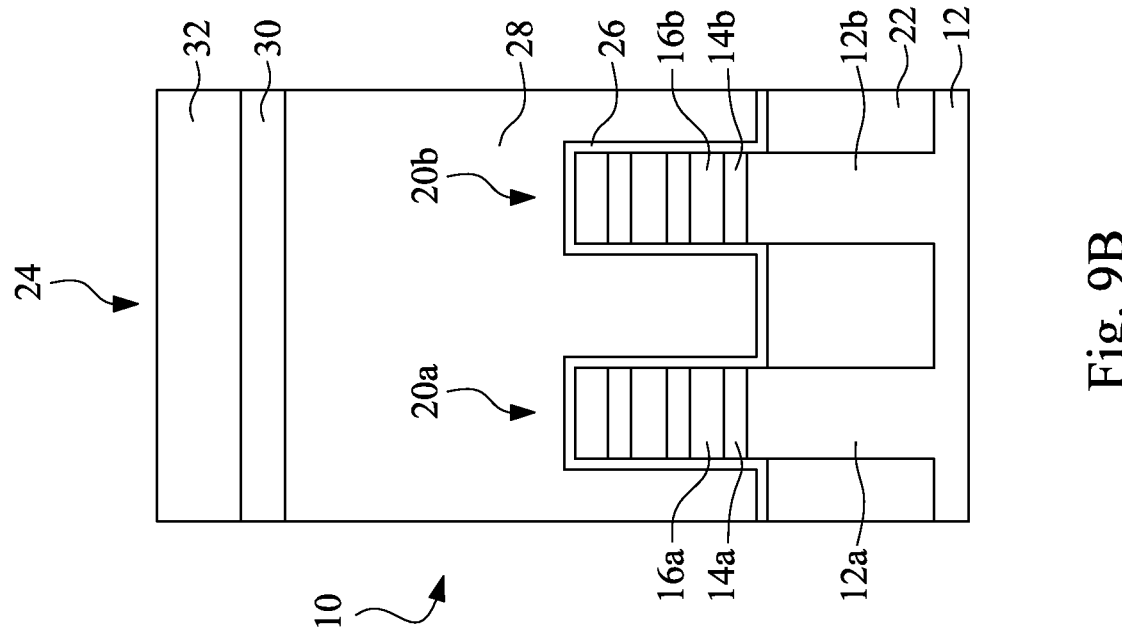
Figure 9A:
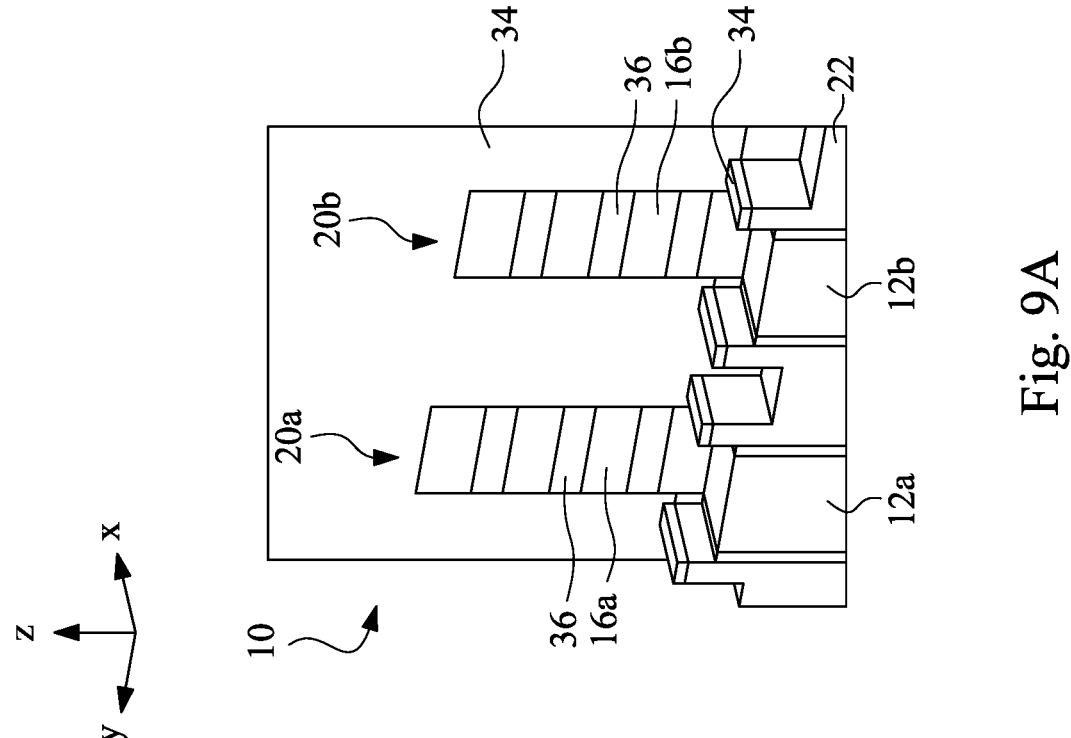
Figure 9C:
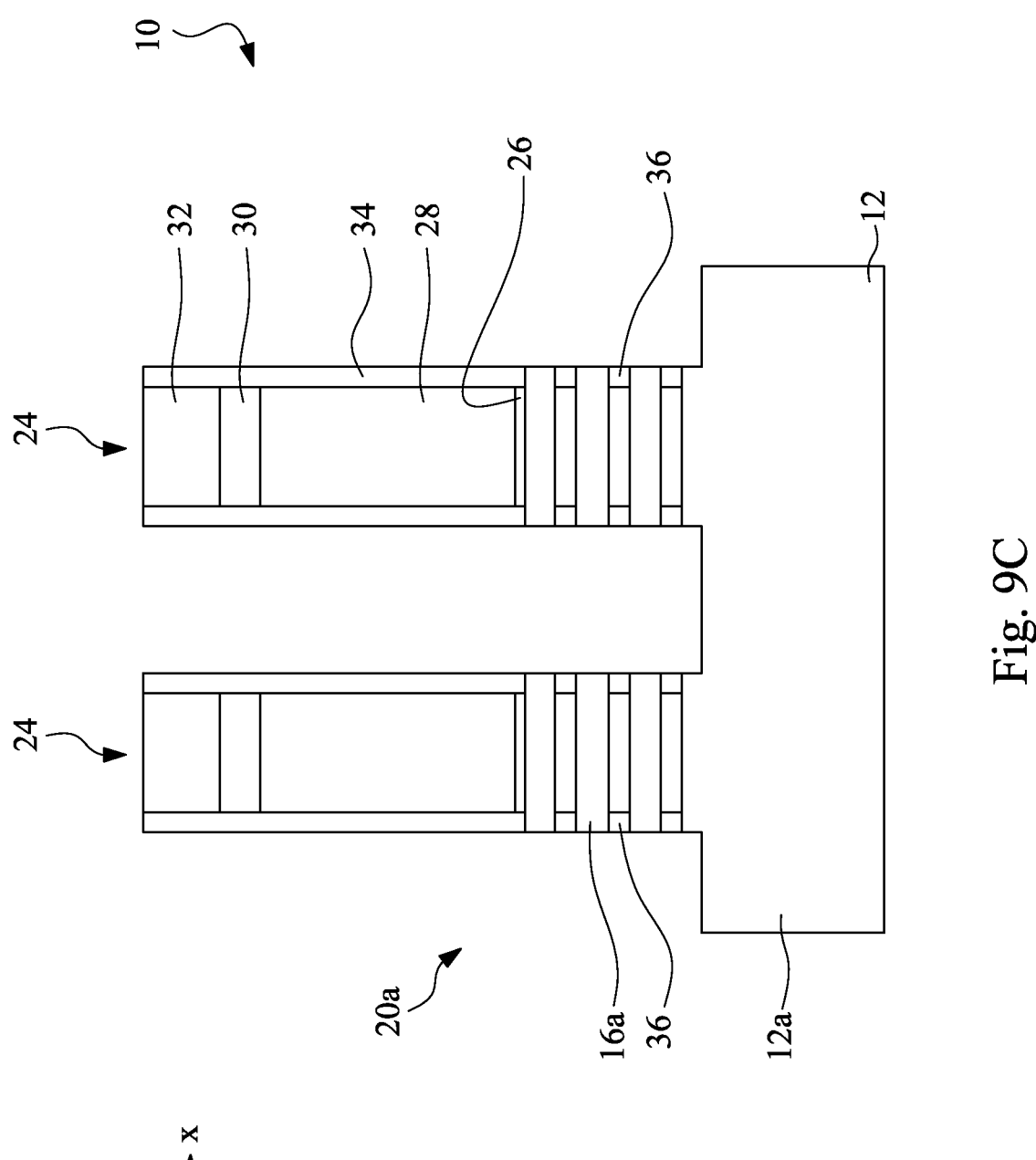

In operation 112, sidewall spacers 34 and inner spacers 36 are formed as shown in FIGS. 9A-9C. FIG. 9A is a schematic perspective cross sectional view along the A-A line in FIG. 2. FIG. 9B is a schematic cross sectional view along the B-B line in FIG. 2. FIG. 9C is a schematic cross sectional view along the C-C line in FIG. 2.

The sidewall spacers 34 are formed on sidewalls of the sacrificial gate structures. After the sacrificial gate structures 24 are formed, the sidewall spacers 34 are formed by a blanket deposition of an insulating material followed by anisotropic etch to remove insulating material from horizontal surfaces. The sidewall spacers 34 may have a thickness in a range between about 4 nm and about 7 nm. In some embodiments, the insulating material of the sidewall spacers 34 is a silicon nitride-based material, such as SiN, SiON, SiOCN or SiCN and combinations thereof.

The exposed semiconductor fins 20a, 20b are etched and the inner spacers 36 are formed. Even though described together in each operation, processes for regions for p-type devices, i.e. over the n-well 12a, and for n-type devices, i.e. over the p-well 12b, may be performed separately using patterned masks and different processing recipes.

The semiconductor fins 20a, 20b not covered by the sacrificial gate structures 24 are etched to expose well portions of the semiconductor fins 20a, 20b. In some embodiments, suitable dry etching and/or wet etching may be used to remove the semiconductor layers 14a, 14b, 16a, 16b, together or separately.

After recess etch of the semiconductor fins 20a, 20b, the inner spacers 36 are formed. To form the inner spacers 36, the semiconductor layers 14a, 14b under the sidewall spacers 34 are selectively etched from the semiconductor layers 16a, 16b along the horizontal direction, or x-direction, to form spacer cavities. In some embodiments, the semiconductor layers 14a, 14b can be selectively etched by using a wet etchant such as, but not limited to, ammonium hydroxide (NH₄OH), tetramethylammonium hydroxide (TMAH), ethylenediamine pyrocatechol (EDP), or potassium hydroxide (KOH) solutions. In some embodiments, an etching thickness of the semiconductor layers 14a, 14b is in a range between about 2 nm and about 10 nm along the X direction.

After forming the spacer cavities, the inner spacers 36 are formed in the spacer cavities by conformally deposit and then partially remove an insulating layer. The insulating layer can be formed by ALD or any other suitable method.

The subsequent etch process removes most of the insulating layer except inside the cavities, resulting in the inner spacers 36. The inner spacers 36 have a thickness along the X direction in a range from about 4 nm to about 7 nm.

Figure 10B:
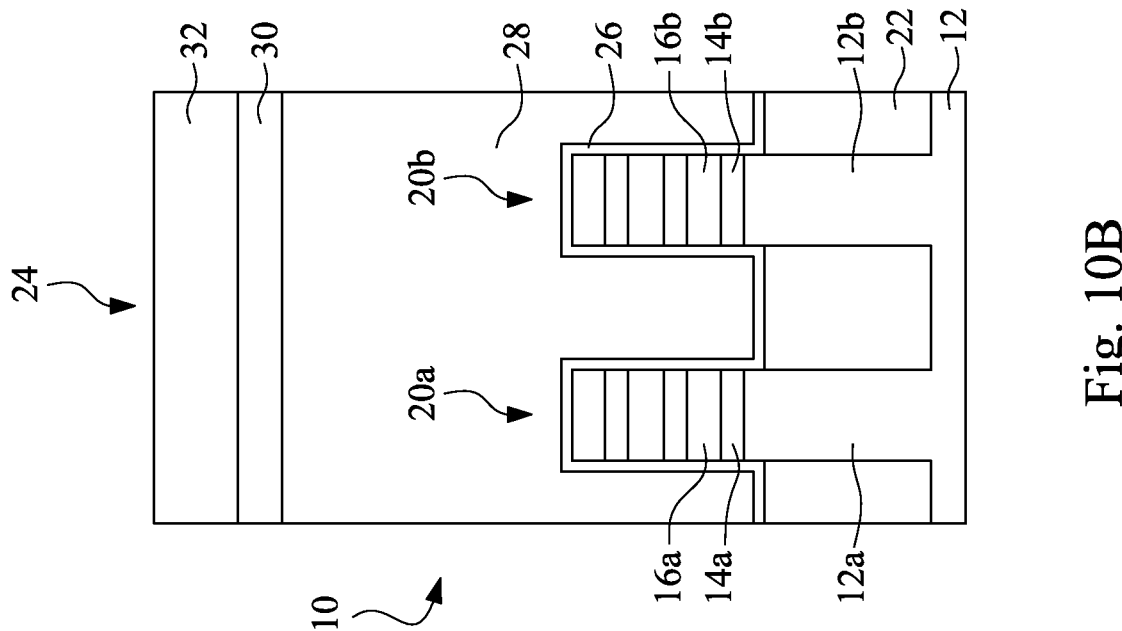
Figure 10A:
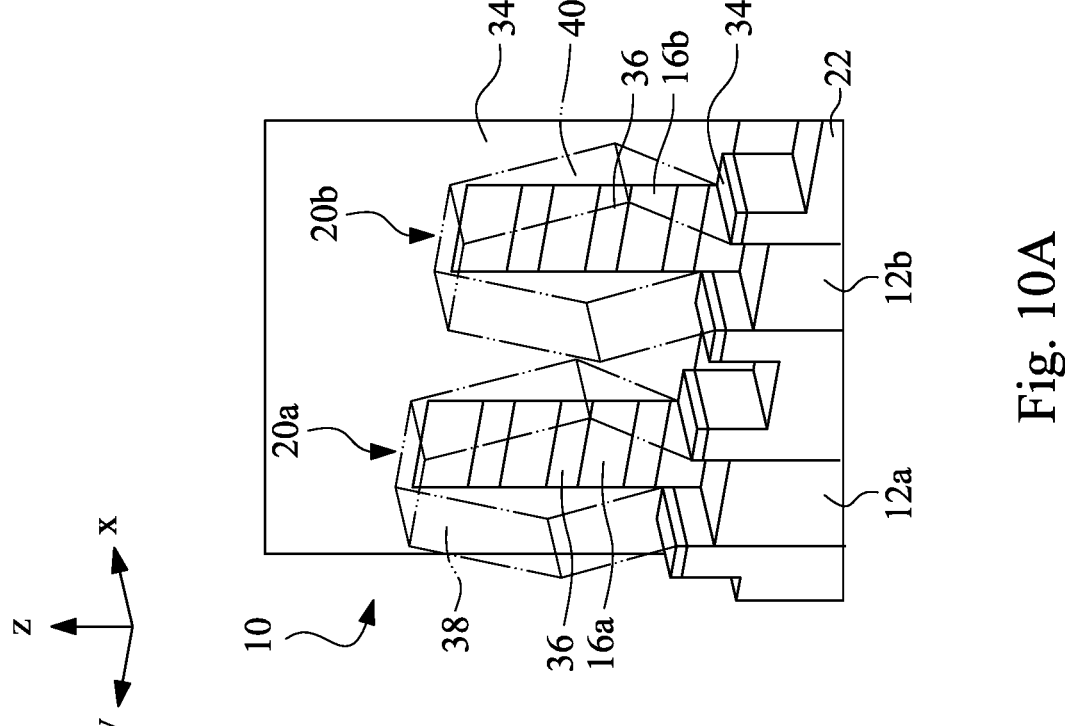
Figure 10C:
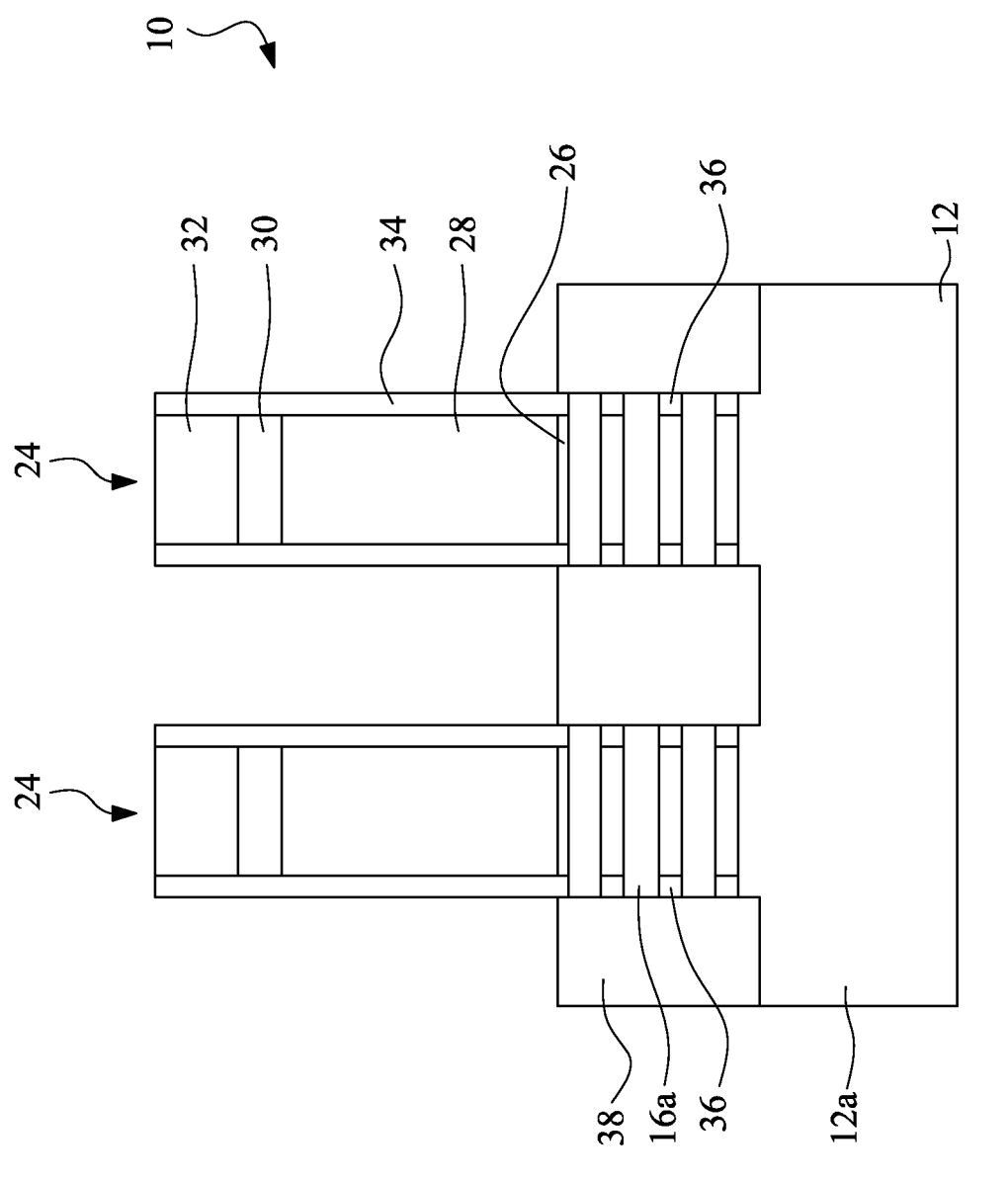

In operation 114, epitaxial source/drain regions 38, 40 are formed, as shown in FIGS. 10A-10C. FIG. 10A is a schematic perspective cross sectional view along the A-A line in FIG. 2. FIG. 10B is a schematic cross sectional view along the B-B line in FIG. 2. FIG. 10C is a schematic cross sectional view along the C-C line in FIG. 2. As discussed above, the epitaxial source/drain regions 38 for the p-type devices and the epitaxial source/drain regions 40 for the n-type devices are formed using patterned masks and different epitaxial processes.

The epitaxial source/drain regions 38 for the p-type devices may include one or more layers of Si, SiGe, Ge with p-type dopants, such as boron (B), for a p-type device, such as pFET. In some embodiments, the epitaxial source/drain regions 38 may be SiGeB material, wherein boron is a dopant. The epitaxial source/drain regions 40 for n-type devices may include one or more layers of Si, SiP, SiC and SiCP. The epitaxial source/drain regions 40 also include n-type dopants, such as phosphorus (P), arsenic (As), etc. In some embodiments, the epitaxial source/drain regions 40 may be a Si layer includes phosphorus dopants.

The epitaxial source/drain regions 38, 40 shown in FIG. 10A have a hexagonal shape. However, the epitaxial source/drain regions 38, 40 may be other shapes according to the design. The epitaxial source/drain regions 38 for the p-type devices and the epitaxial source/drain regions 40 for the n-type devices may have different shapes.

Figure 11B:
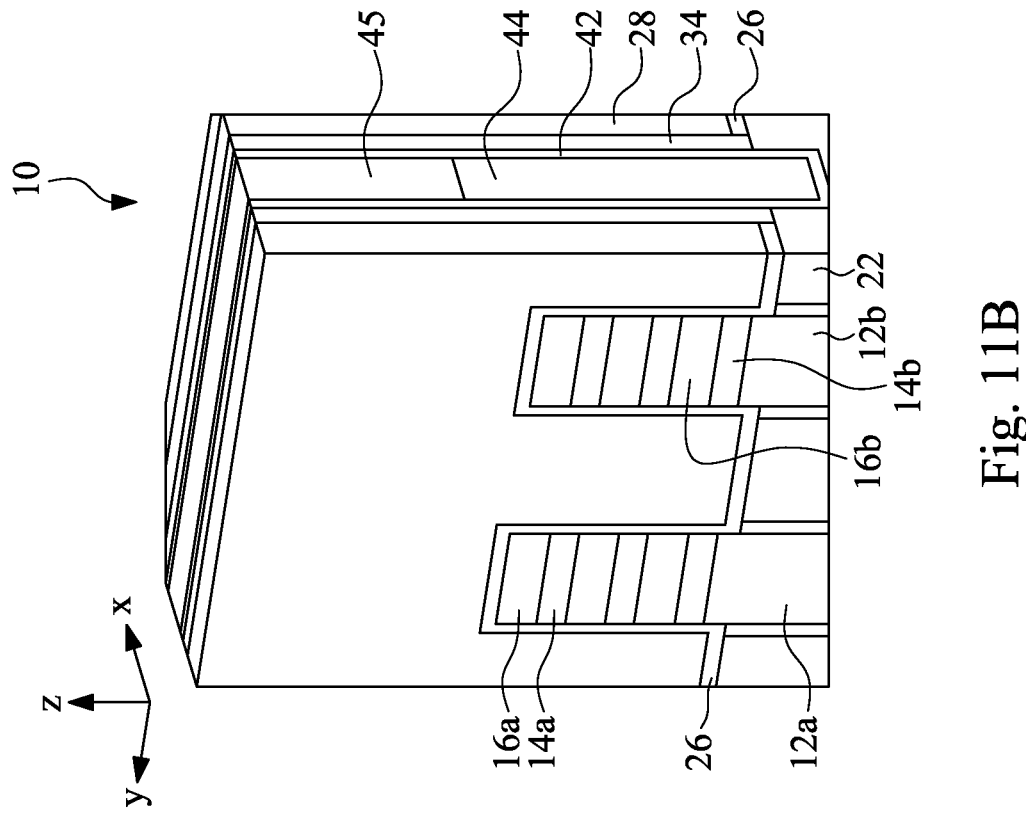
Figure 11A:
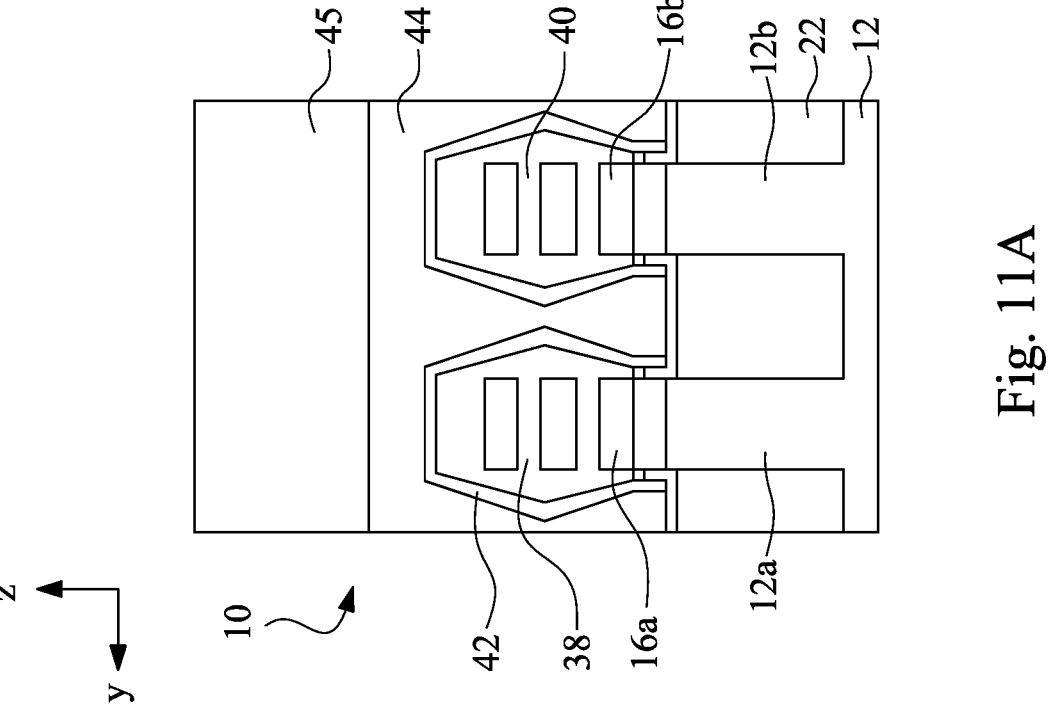
Figure 11C:
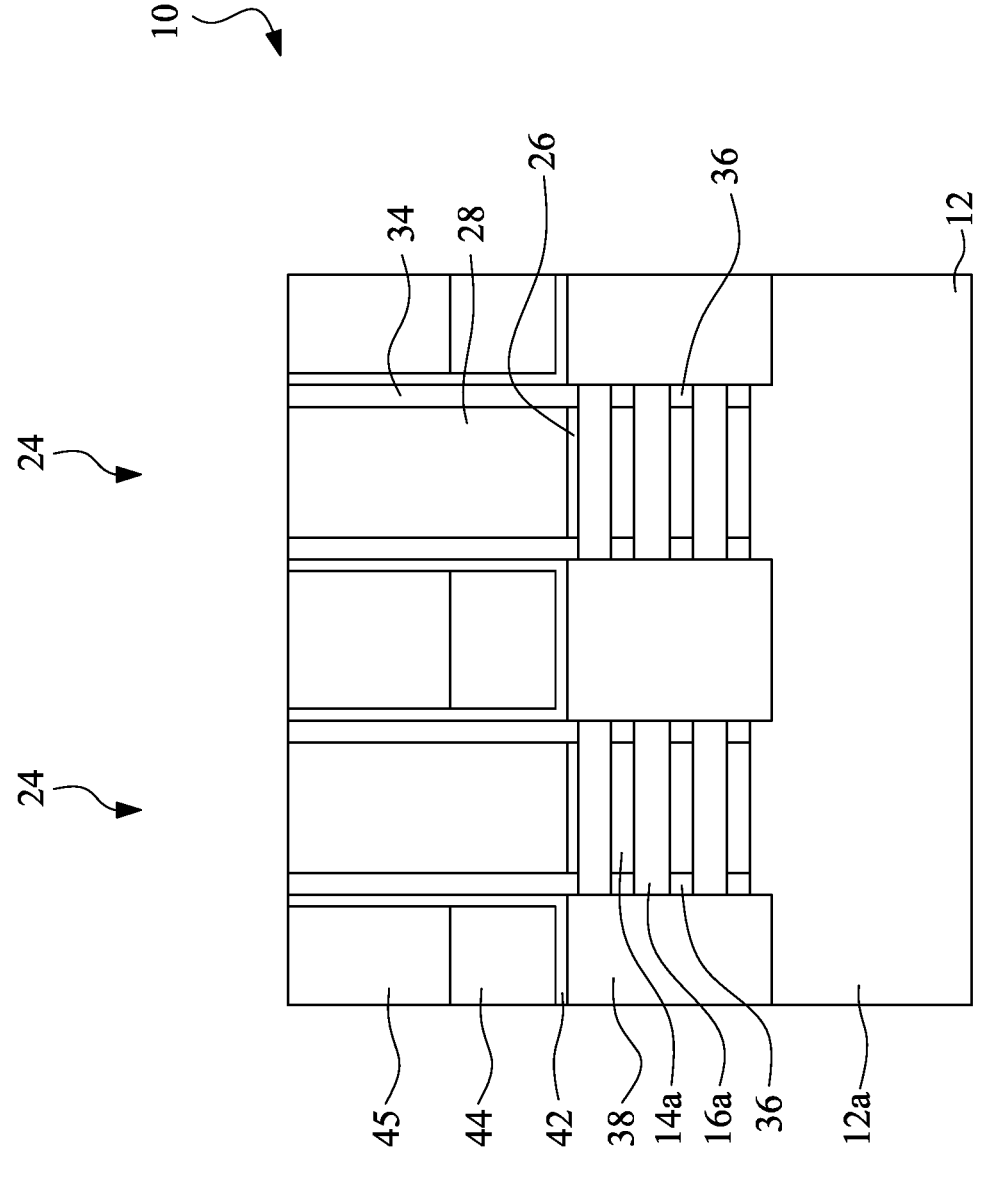

In operation 116, a contact etch stop layer (CESL) 42 and an interlayer dielectric (ILD) layer 44 are formed over the exposed surfaces as shown in FIGS. 11A-11C. FIG. 11A is a schematic cross sectional view along the A-A line in FIG. 2. FIG. 11B is a schematic perspective cross sectional view along the B-B line in FIG. 2. FIG. 11C is a schematic cross sectional view along the C-C line in FIG. 2. The CESL 42 is formed on the epitaxial source/drain regions 38, 40 the sidewall spacers 34, and the isolation layer 22. In some embodiments, the CESL 42 has a thickness in a range between about 4 nm and about 7 nm. The CESL 42 may include $Si_3N_4$, SiON, SiCN or any other suitable material, and may be formed by CVD, PVD, or ALD.

The interlayer dielectric (ILD) layer 44 is formed over the CESL 42. The materials for the ILD layer 44 include compounds comprising Si, O, C, and/or H, such as silicon oxide, SiCOH and SiOC. Organic materials, such as polymers, may be used for the ILD layer 44. The ILD layer 44 protects the epitaxial source/drain regions 38, 40 during the removal of the sacrificial gate structures 24.

A planarization process may be performed after depositing the ILD layer 44 to expose the sacrificial gate structures 24. In some embodiments, the ILD layer 44 may be etched back and a capping layer 45 may be deposited there above to provide protection during subsequent processes.

Figure 12B:
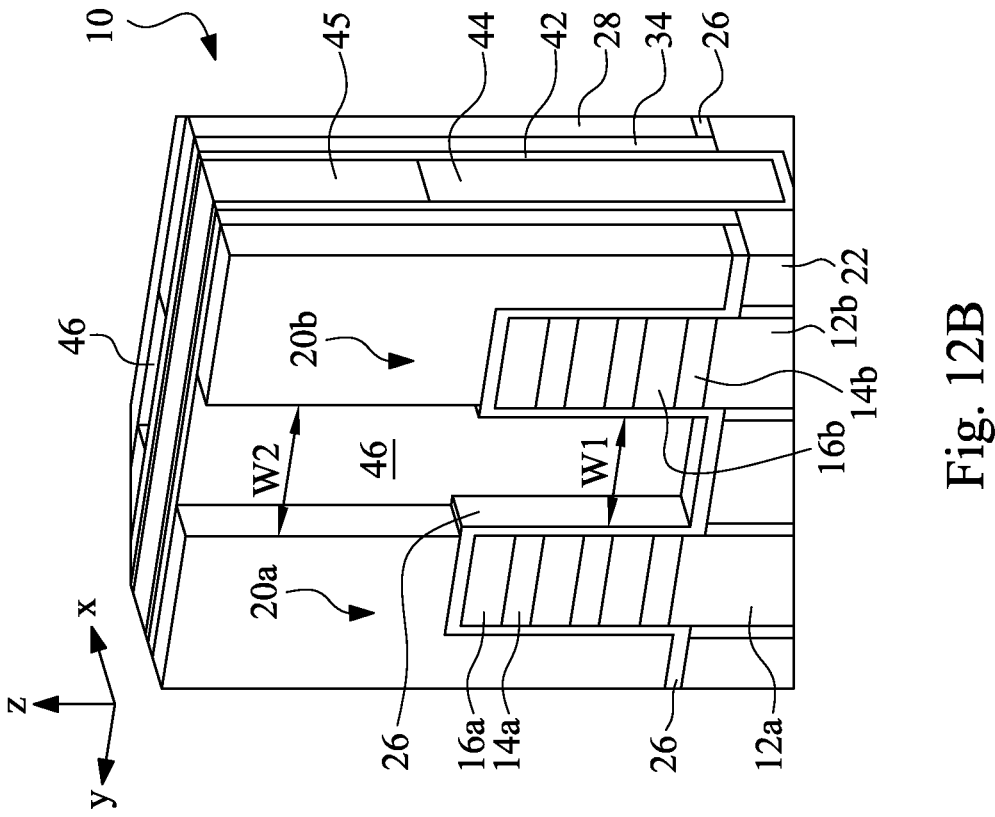
Figure 12A:
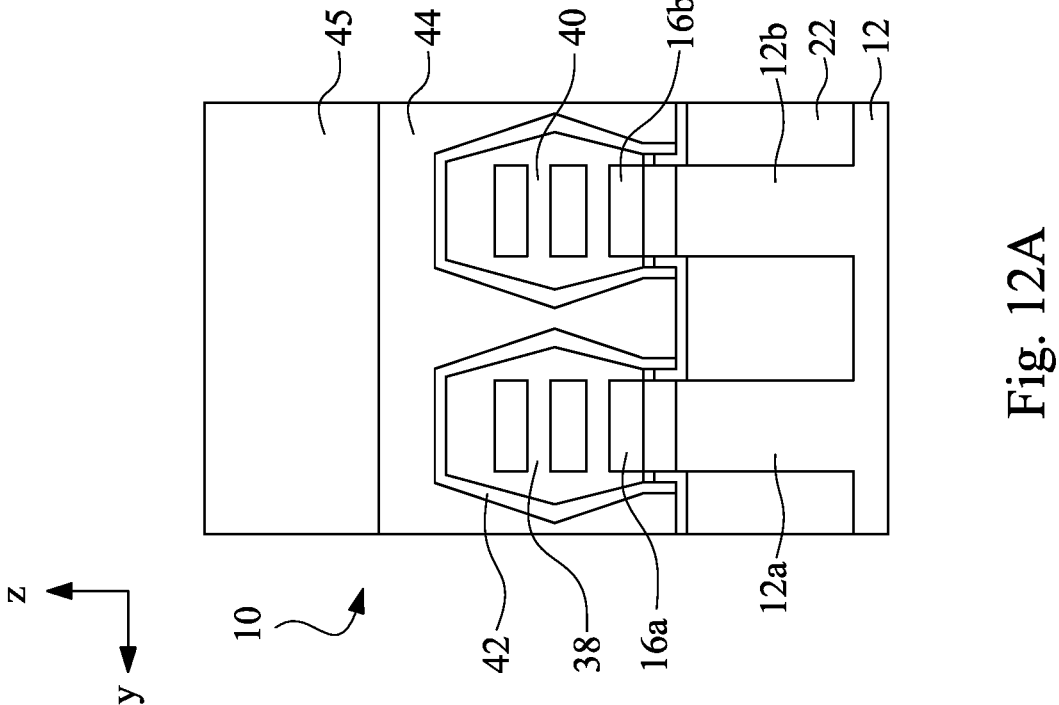
Figure 12C:
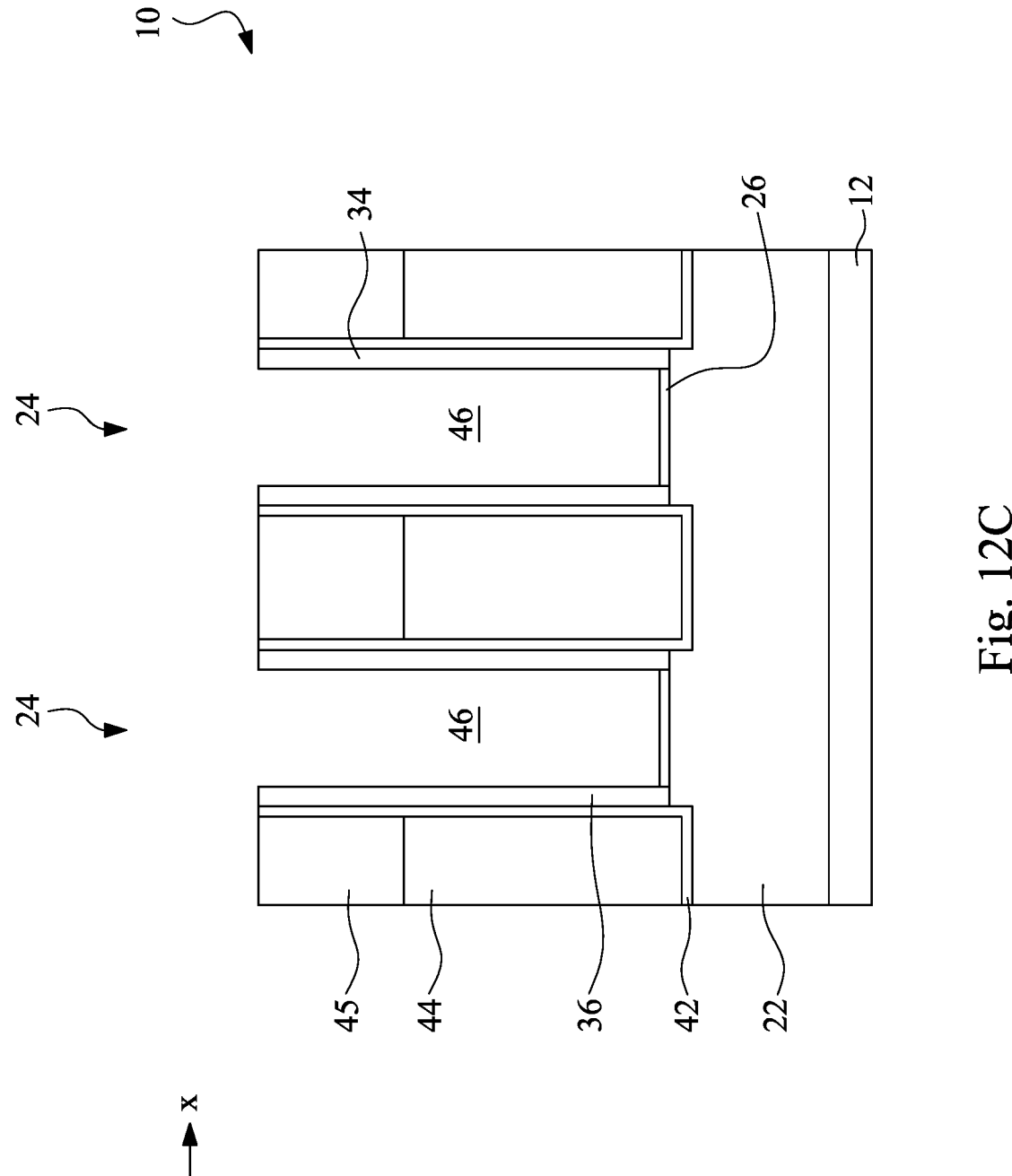

In operation 118, an opening 46 is formed in the sacrificial gate layer 28 to remove the sacrificial gate layer 28 between the fin structures 20a, 20b within the sacrificial gate structure 24, as shown in FIGS. 12A-12C. FIG. 12A is a schematic cross sectional view along the A-A line in FIG. 2. FIG. 12B is a schematic perspective cross sectional view along the B-B line in FIG. 2. FIG. 12C is a schematic cross sectional view along the D-D line in FIG. 2

The opening 46 may be formed using a suitable patterning and etching process. In some embodiments, the opening 46 is substantially aligned with the trenches between the fin structures 20a, 20b so that the sacrificial gate layer 28 between the fin structures 20a, 20b may be selectively removed. In some embodiments, the sacrificial gate dielectric layer 26 formed on sidewalls of the fin structures 20a, 20b are exposed by the opening 46, as shown in FIG. 12B. The opening 46 may have a width W2 along the y-axis. In some embodiments, the width W2 may be substantially similar to or slightly greater than the width W1 of the trench 21 between the fin structures 20a, 20b to ensure that the sacrificial gate dielectric layer 26 formed on sidewalls of the fin structures 20a, 20b are exposed by the opening 46. In the x-axis, the opening 46 terminates at the sidewall spacers 34 on both sides of the sacrificial gate structure 24.

Figure 13B:
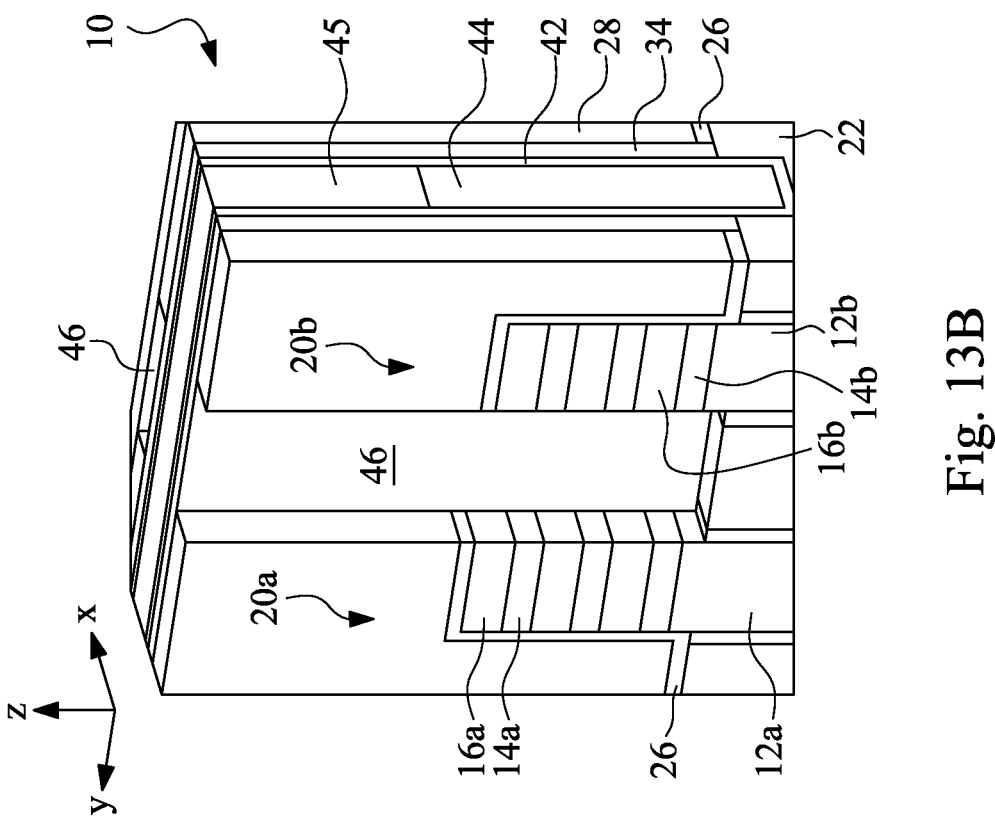
Figure 13A:
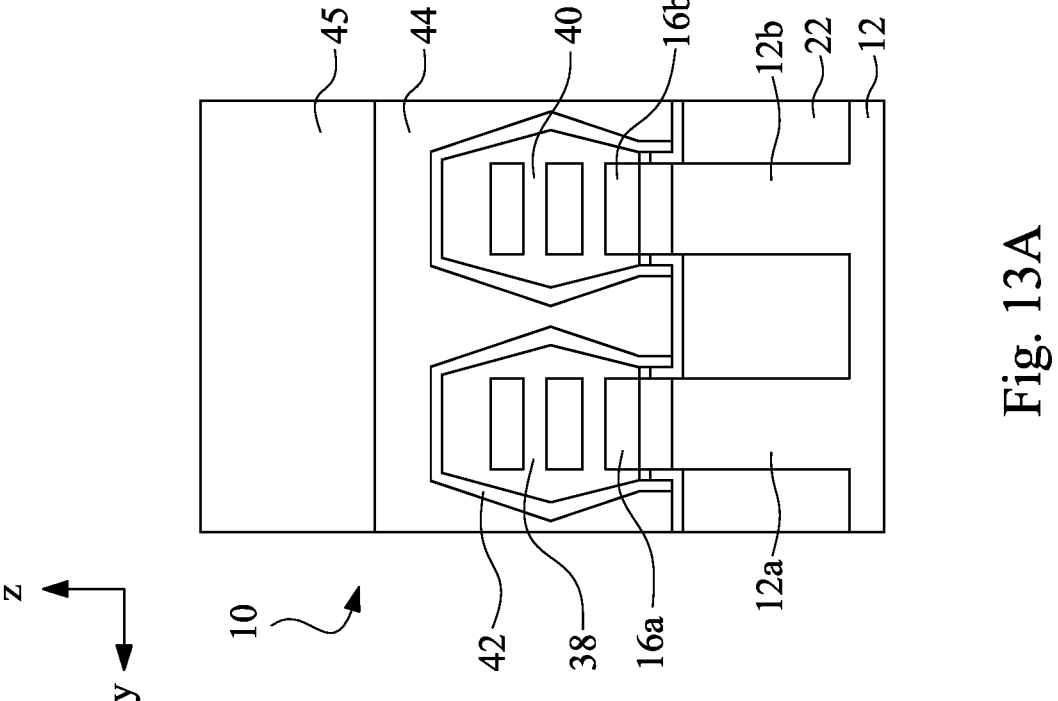
Figure 13C:
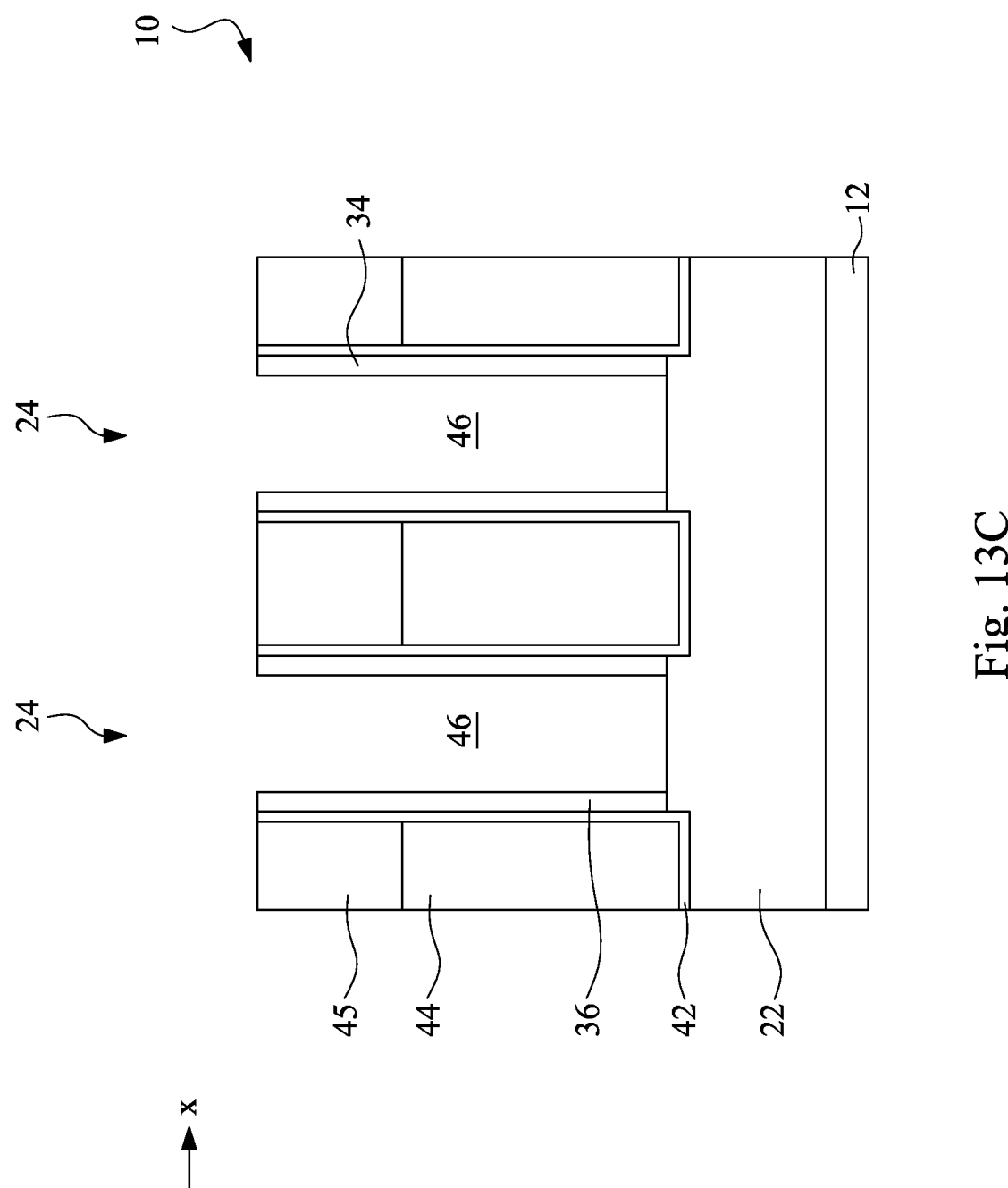

In operation 120, the sacrificial gate dielectric layer 26 exposed by the opening 46 is selectively removed as shown in FIGS. 13A-13C. FIG. 13A is a schematic cross sectional view along the A-A line in FIG. 2. FIG. 13B is a schematic perspective cross sectional view along the B-B line in FIG. 2. FIG. 13C is a schematic cross sectional view along the D-D line in FIG. 2. Portions of the sacrificial dielectric layer 26 exposed to the opening 46 are selectively removed and end surfaces of the semiconductor layers 14a, 14b, 16a, 16b of the fin structures 20a, 20b are exposed to the opening 46. After operation 120, the STI layer 22 may also be exposed to the opening 46.

Figure 14B:
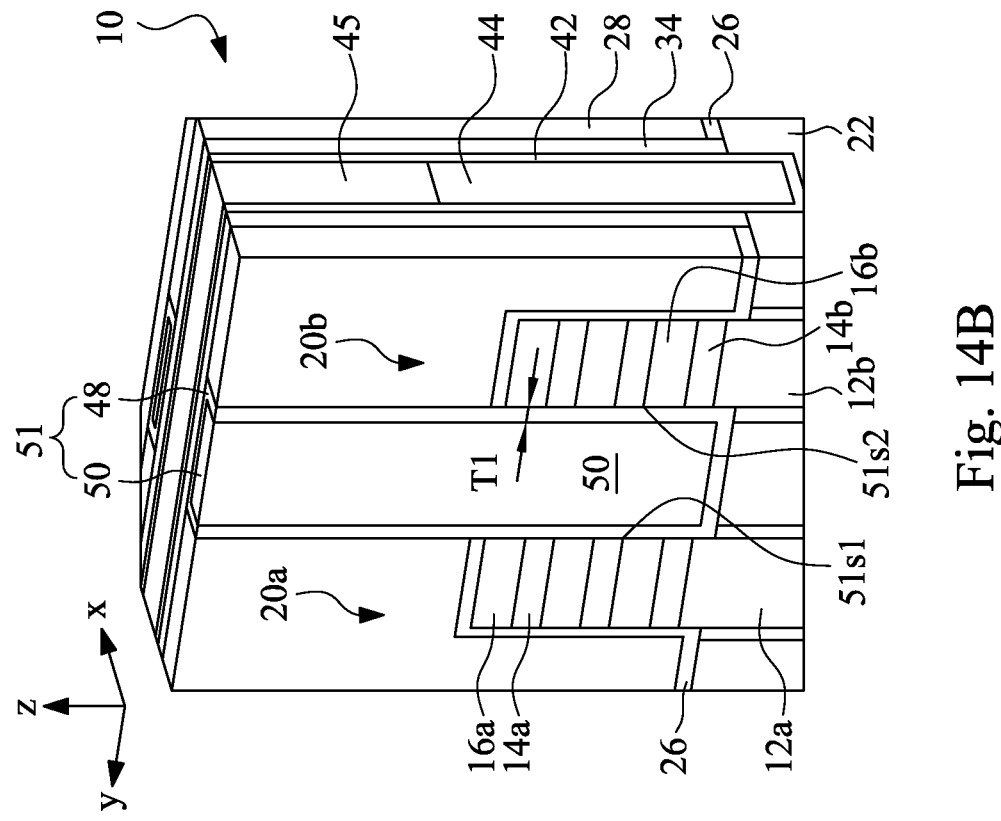
Figure 14A:
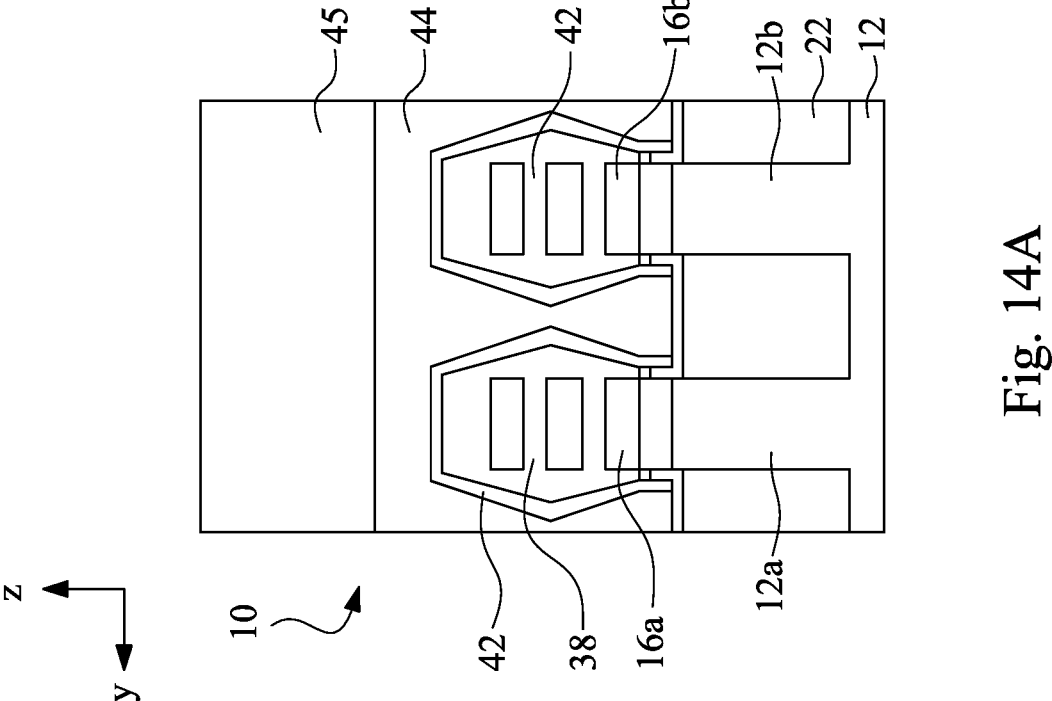
Figure 14C:
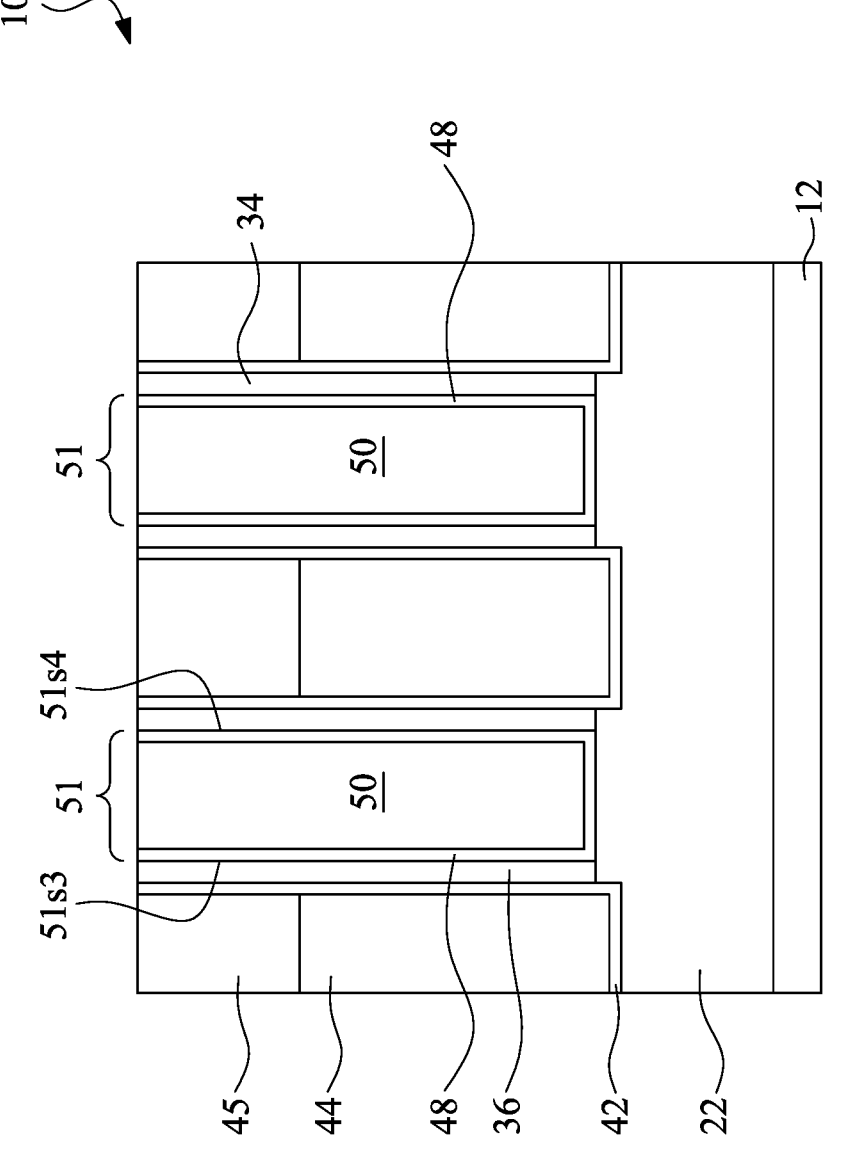
Figure 14C:
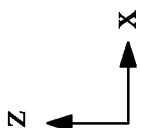

In operation 122, a dielectric wall 51 is formed in the opening 46, as shown in FIGS. 14A-14C. FIG. 14A is a schematic cross sectional view along the A-A line in FIG. 2. FIG. 14B is a schematic perspective cross sectional view along the B-B line in FIG. 2. FIG. 14C is a schematic cross sectional view along the D-D line in FIG. 2. The dielectric wall 51 may include one or more dielectric layers. In some embodiments, the dielectric wall 51 may be formed from one or more layers of low-k dielectric materials. For example, the dielectric wall 51 may be formed from one or more layers of dielectric materials having a dielectric constant lower than about 7. In some embodiments, the dielectric wall 51 is formed from one or more layers of SiO2, SiN, SiCN, SiOC, SiOCN, or other suitable dielectric material having a dielectric value less than 7.

As shown in FIGS. 14B and 14C, the dielectric wall 51 has two side surfaces 51s1, 51s2 in contact with the semiconductor fins 20a, 20b respectively, and two side surfaces 51s3, 51s3 in contact with the sidewall spacers 34 respectively. The dielectric wall 51 is disposed within the gate structure and terminates at the sidewall spacers 34 along the x-axis.

In some embodiments, the dielectric wall 51 includes a dielectric liner layer 48 and a dielectric filling layer 50. The dielectric liner layer 48 may be formed from a dielectric material that can be selectively removed from the dielectric filling layer 50. In some embodiments, the dielectric liner layer 48 may be a SiN layer and the dielectric filling layer 50 includes SiO2. In some embodiments, the dielectric liner layer 48 may be conformally deposited on all exposed surfaces of the opening 46. In some embodiments, the dielectric liner layer 48 may be used to define a gate end cap on a channel in a forksheet structure. For example, a thickness T1 of the dielectric liner layer 48 on an end surface of the semiconductor layers 16a, 16b may be used to define a thickness of the gate end cap. In some embodiments, the thickness T1 may be in a range between about 2 nm and about 5 nm.

In some embodiments, the dielectric wall 51 may be formed from a single layer of dielectric material and no gate structure is present between the semiconductor layers 16a, 16b and the dielectric wall 51 in the resulting forksheet structure.

After formation of the dielectric wall 51, a replacement gate process may be performed to form gate structures on two sides of the dielectric wall 51. Operations 124 to 132 describe a replace gate sequence according to embodiments of the present disclosure.

Figure 15B:
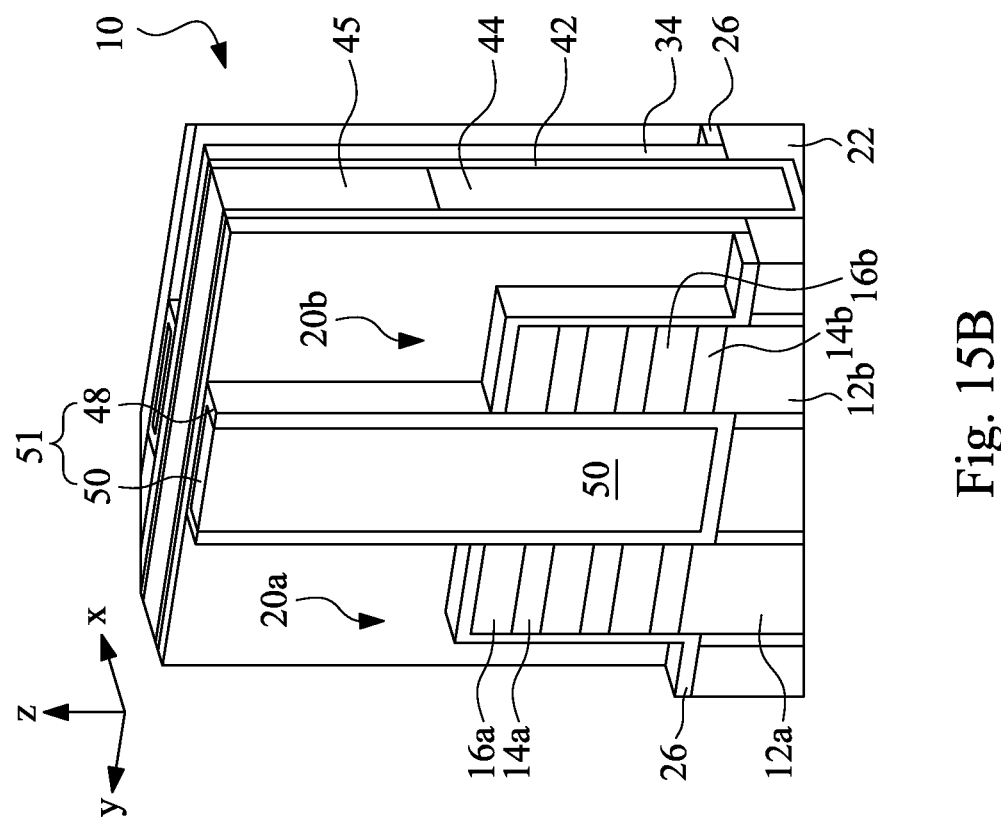
Figure 15A:
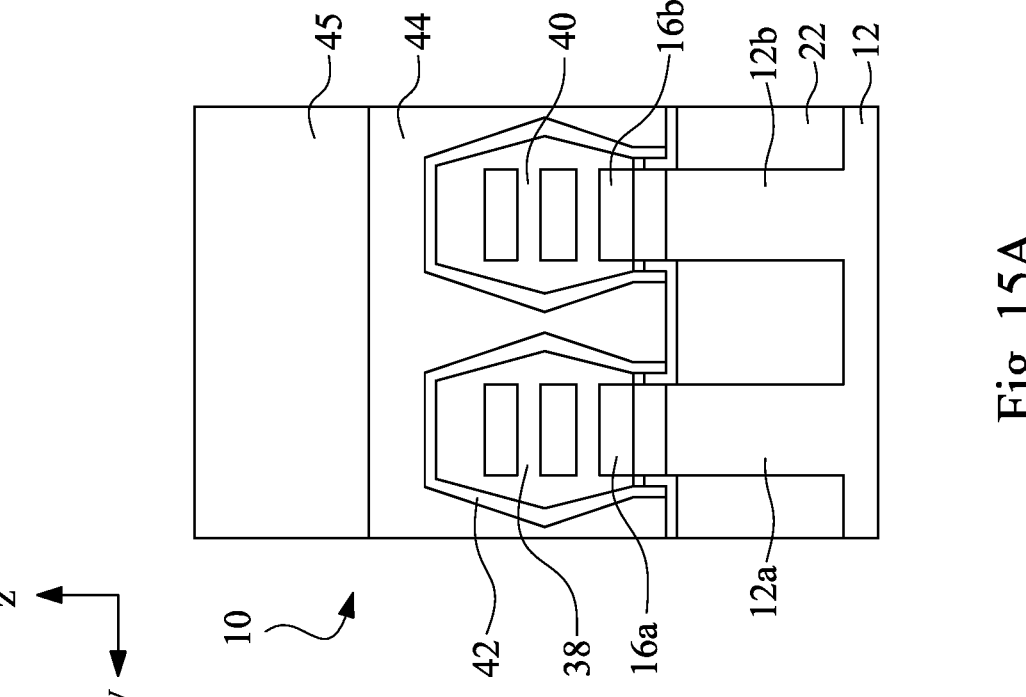
Figure 15C:
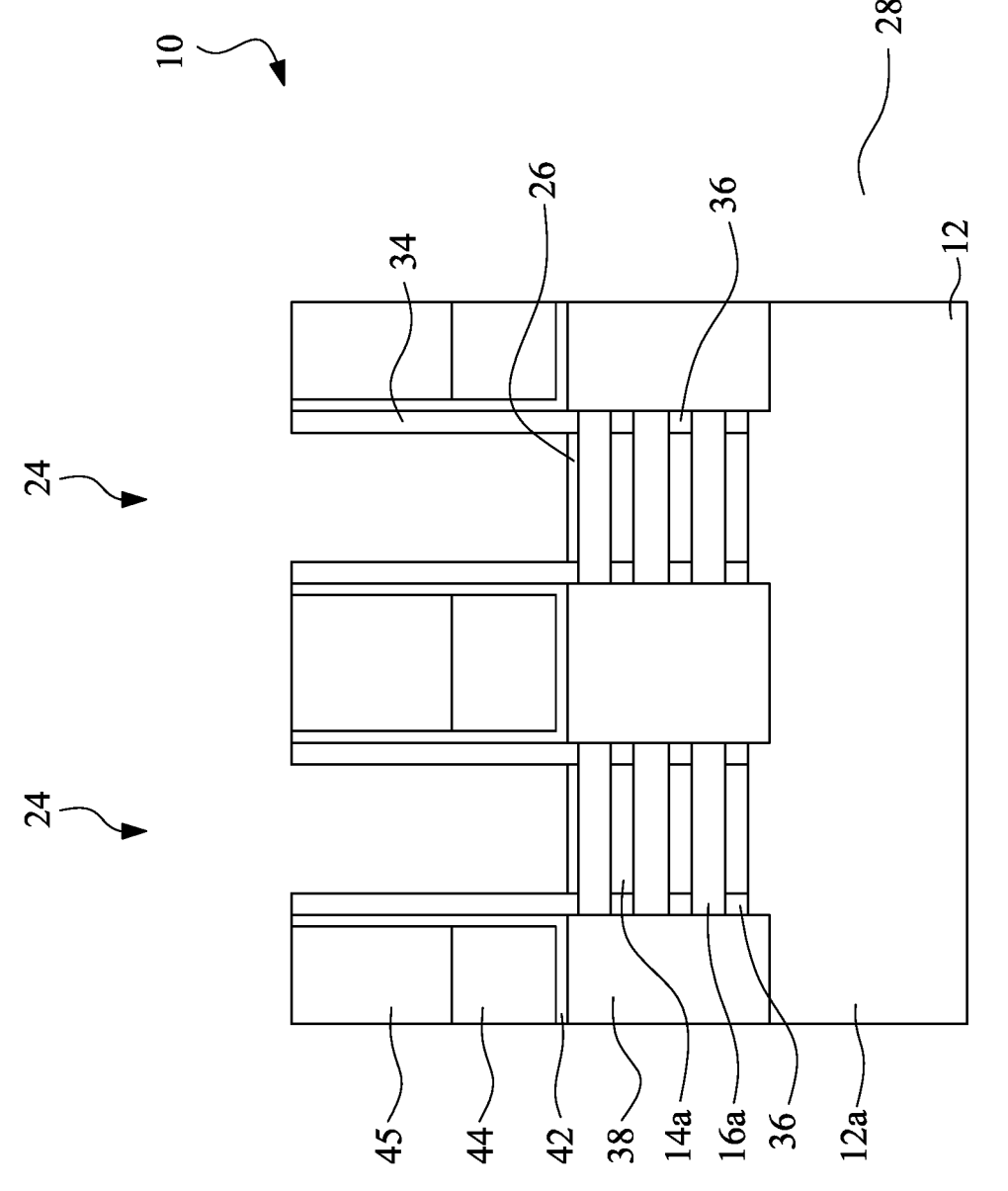
Figure 16B:
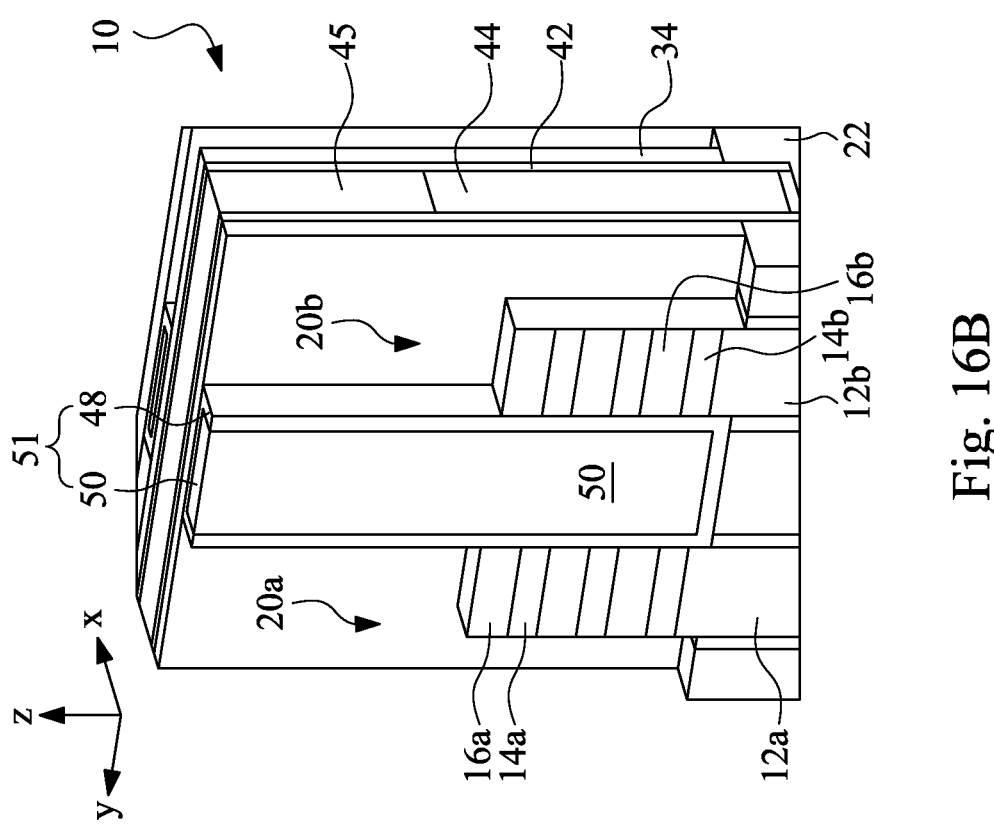
Figure 16A:
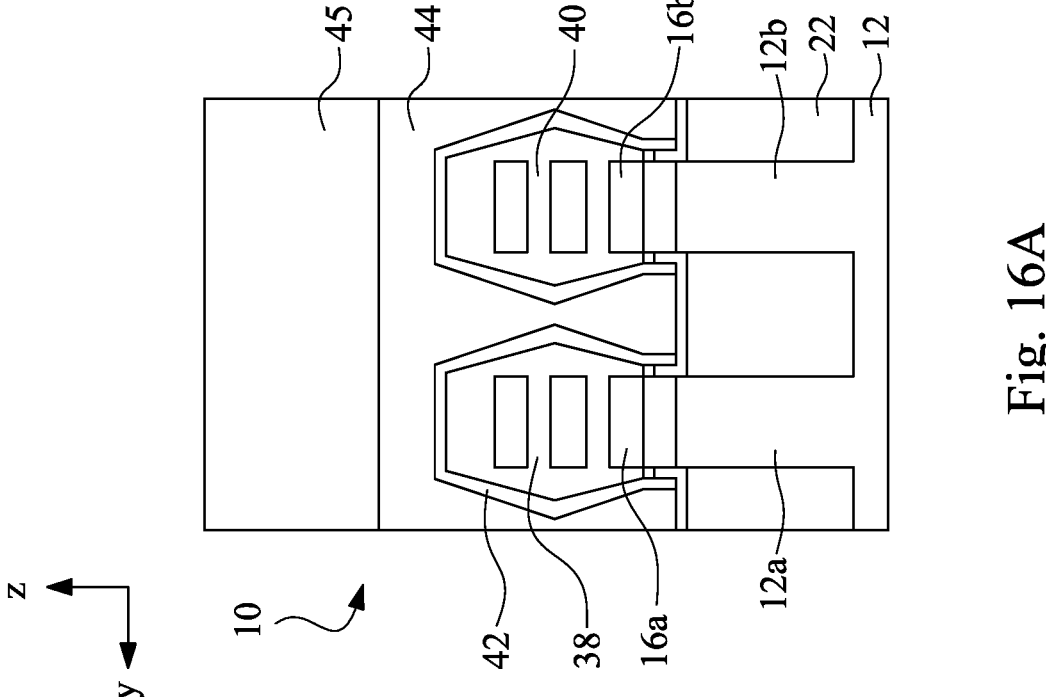
Figure 16C:
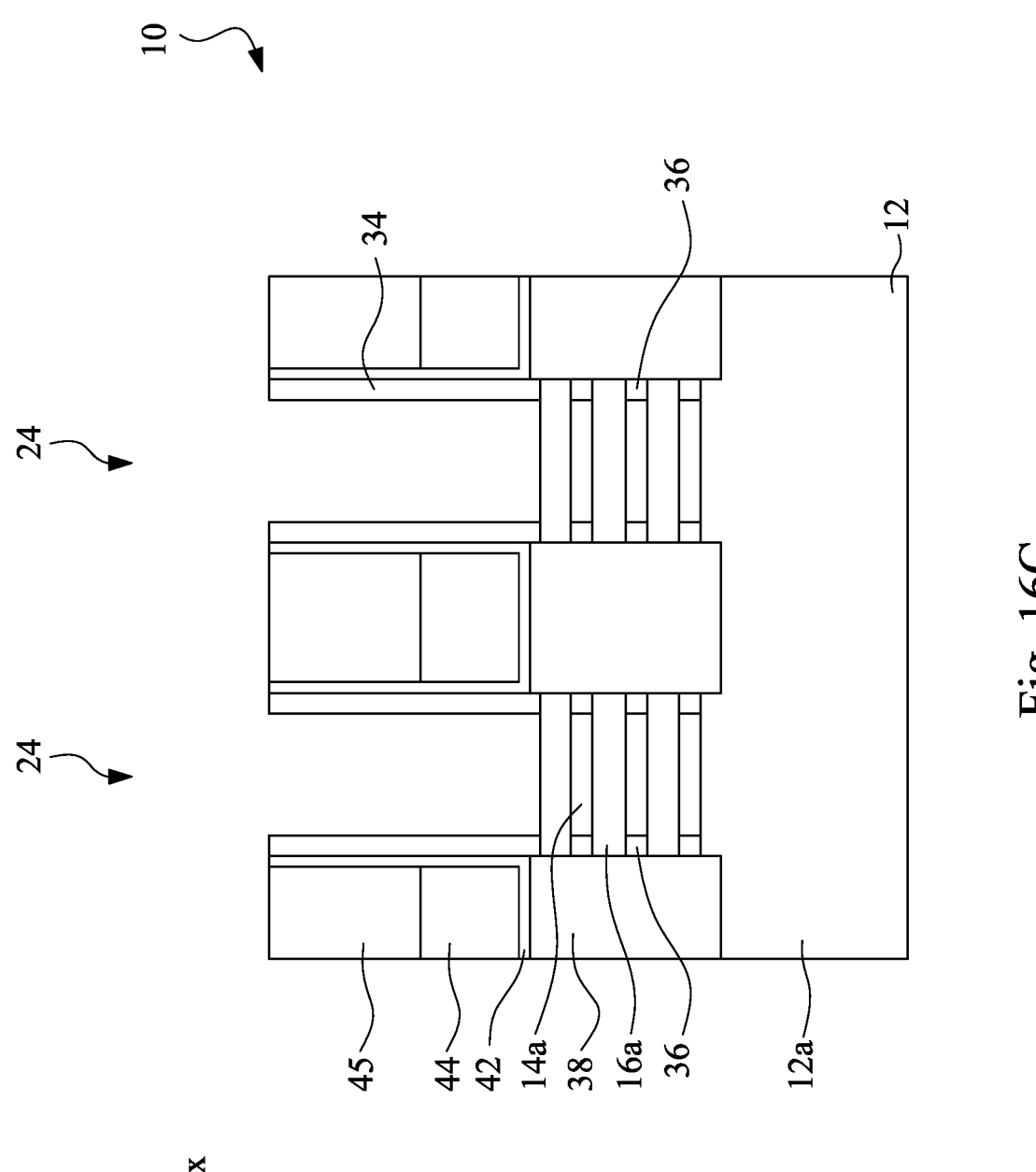

In operation 124, the sacrificial gate electrode layer 28 and the sacrificial gate dielectric layer 26 are sequentially removed, as shown in FIGS. 15A-15C and 16A-16C. FIG. 15A/16A is a schematic cross sectional view along the A-A line in FIG. 2. FIG. 15B/16B is a schematic perspective cross sectional view along the B-B line in FIG. 2. FIG. 15C/16C is a schematic cross sectional view along the D-D line in FIG. 2. The sacrificial gate electrode layer 28 can be removed using plasma dry etching and/or wet etching. When the sacrificial gate electrode layer 28 is polysilicon, a wet etchant such as a Tetramethylammonium hydroxide (TMAH) solution can be used to selectively remove the sacrificial gate electrode layer 28 without removing the dielectric materials of the ILD layer 44, the CESL 42 or the dielectric wall 51. The sacrificial gate dielectric layer 26 may be removed using a suitable etch process after removal of the sacrificial gate electrode layer.

Figure 17:
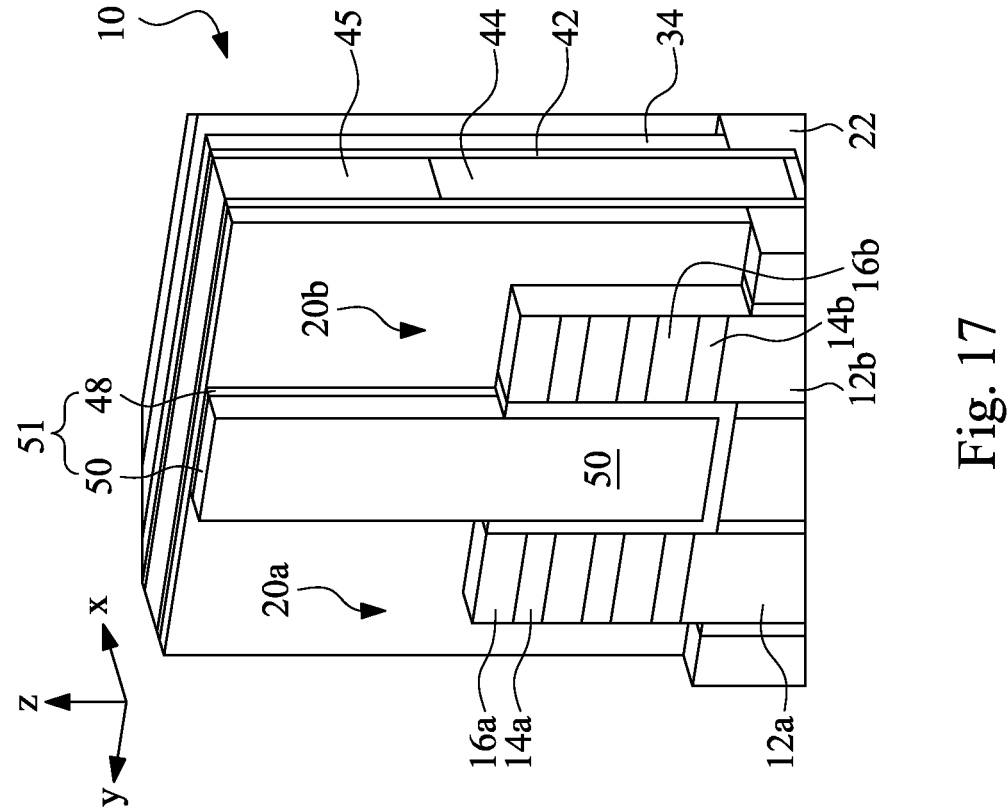

In some embodiments, when the dielectric wall 51 includes the dielectric liner layer 48, an optional operation 126 may be performed to remove a portion of the dielectric liner layer 48, as shown in FIG. 17. FIG. 17 is a schematic perspective cross sectional view along the B-B line in FIG. 2. In some embodiments, an isotropic removal process may be formed to remove the dielectric liner layer 48 that is above the fin structures 20a, 20b. A wet etch or a chemical dry etch may be used to remove the portion of the dielectric liner layer 48. After operation 126, portions of the dielectric liner layer 48 between the semiconductor fins 20a, 20b are exposed for subsequent process.

Figure 18B:
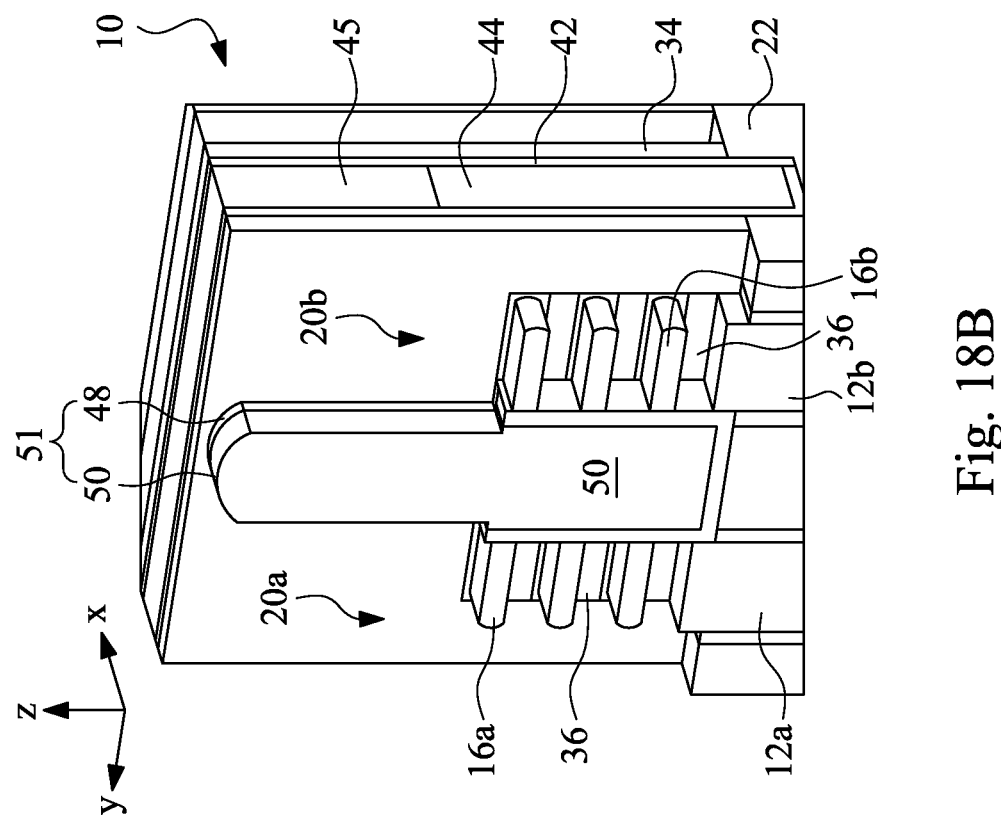
Figure 18A:
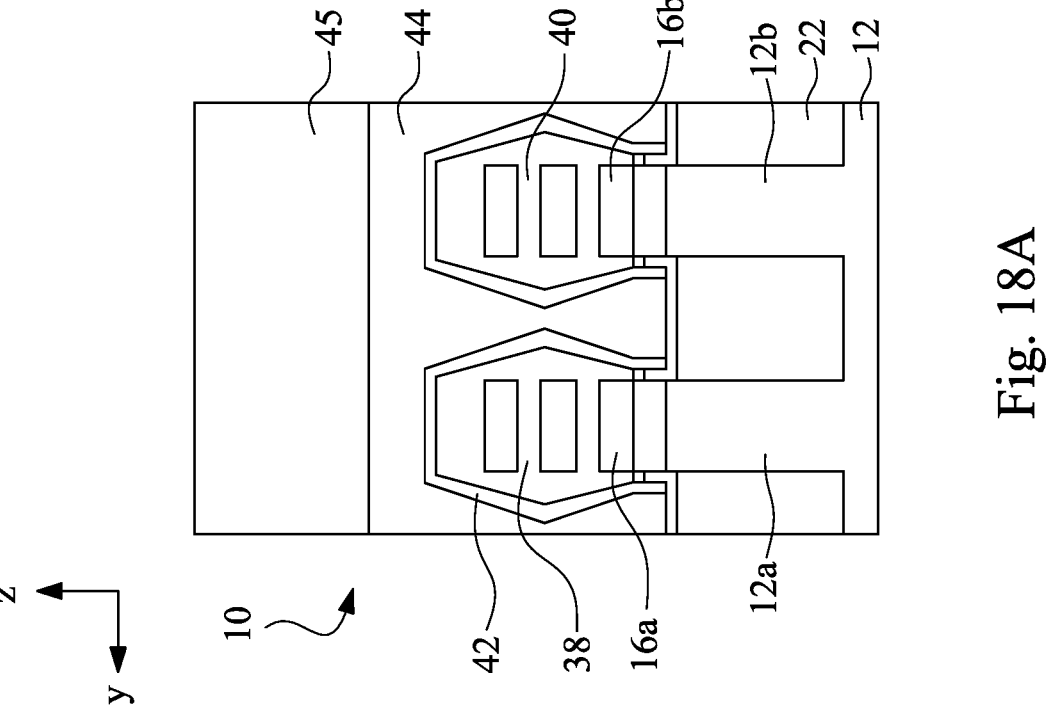
Figure 18C:
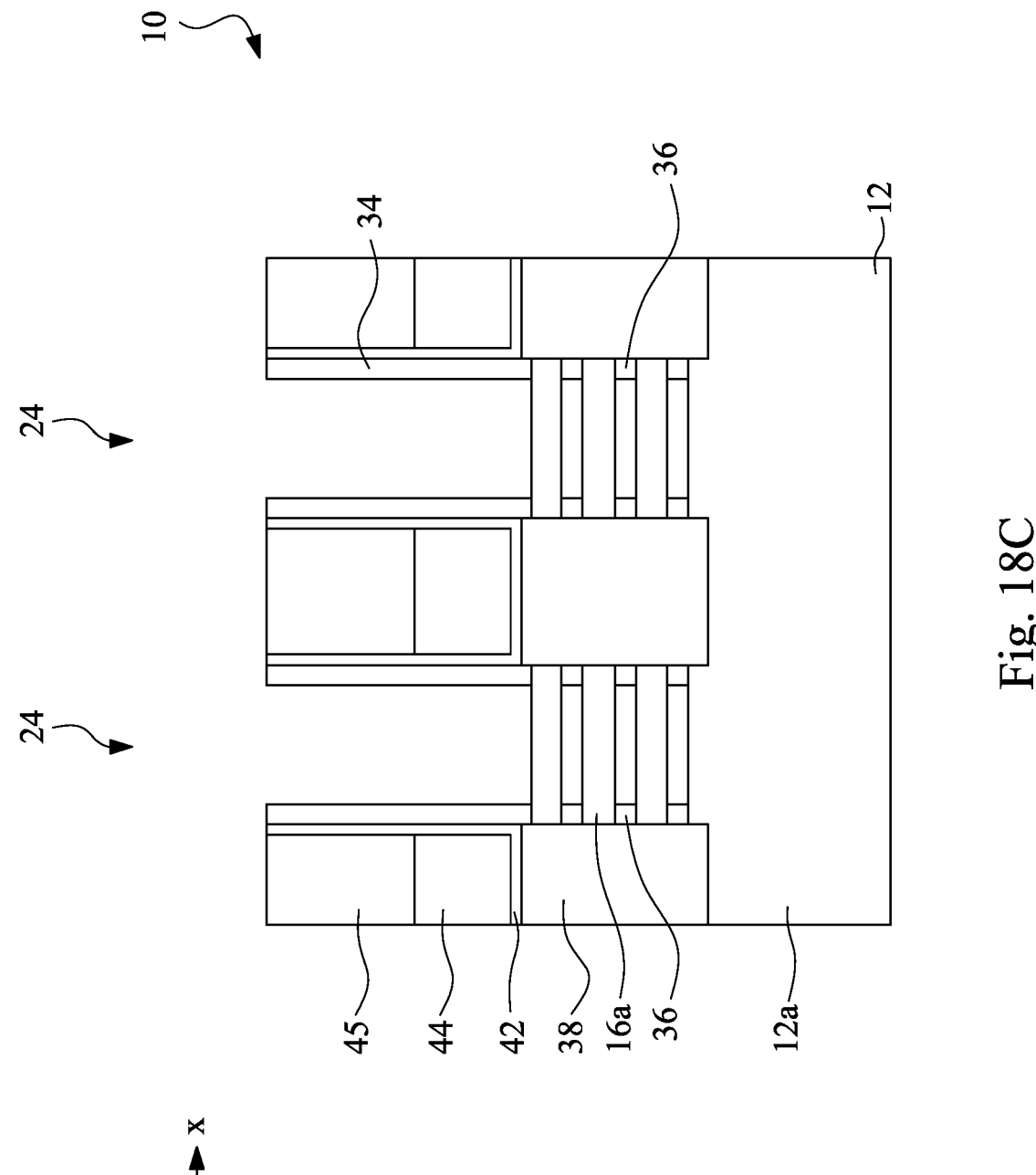

In operation 128, the sacrificial semiconductor layers 14a, 14b are removed from the fin structures 20a, 20b, as shown in FIGS. 18A-18C. FIG. 18A is a schematic cross sectional view along the A-A line in FIG. 2. FIG. 18B is a schematic perspective cross sectional view along the B-B line in FIG. 2. FIG. 18C is a schematic cross sectional view along the D-D line in FIG. 2. In some embodiments, the semiconductor layers 14a, 14b can be removed during the same etch process or different processes. The semiconductor layers 14a, 14b can be selectively removed using a wet etchant such as, but not limited to, ammonium hydroxide ($NH_4OH$), tetramethylammonium hydroxide (TMAH), ethylenedi-amine pyrocatechol (EDP), or potassium hydroxide (KOH) solution. Removal of the semiconductor layers 14a, 14b results in nanosheets of the semiconductor layers 16a, 16b on two sides of the dielectric wall 51 as shown in FIG. 18B. The portions of the dielectric liner layer 48 formed on sidewalls of the fin structures 20a, 20b are also exposed.

Figure 19A:
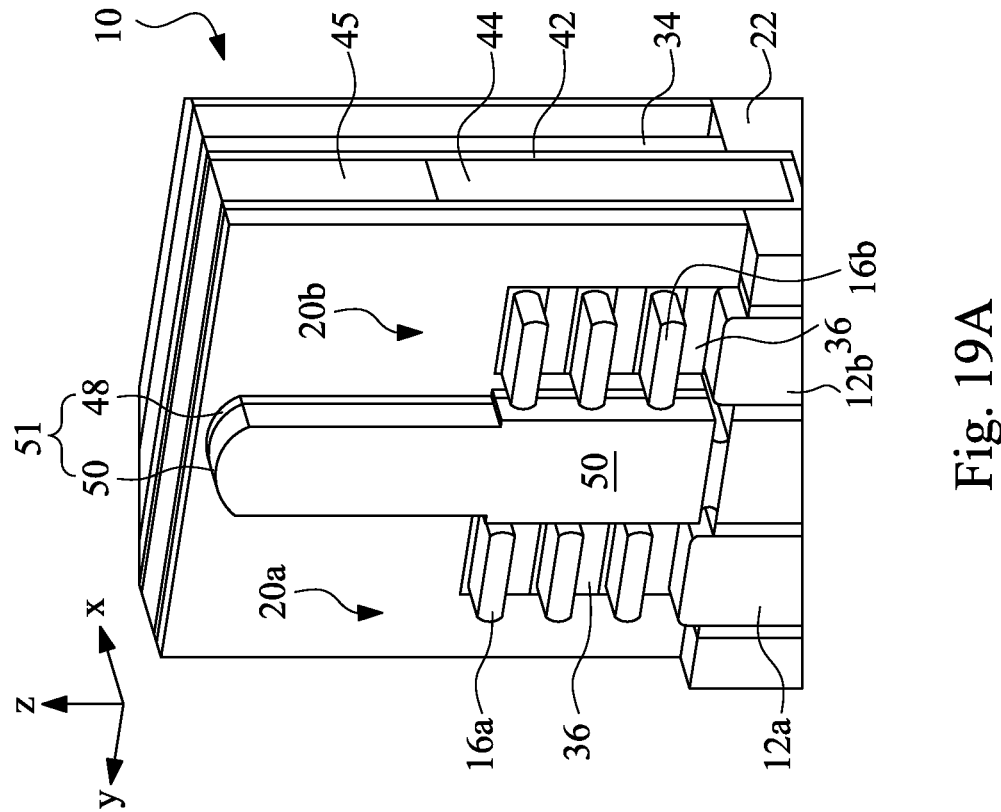
Figure 19C:
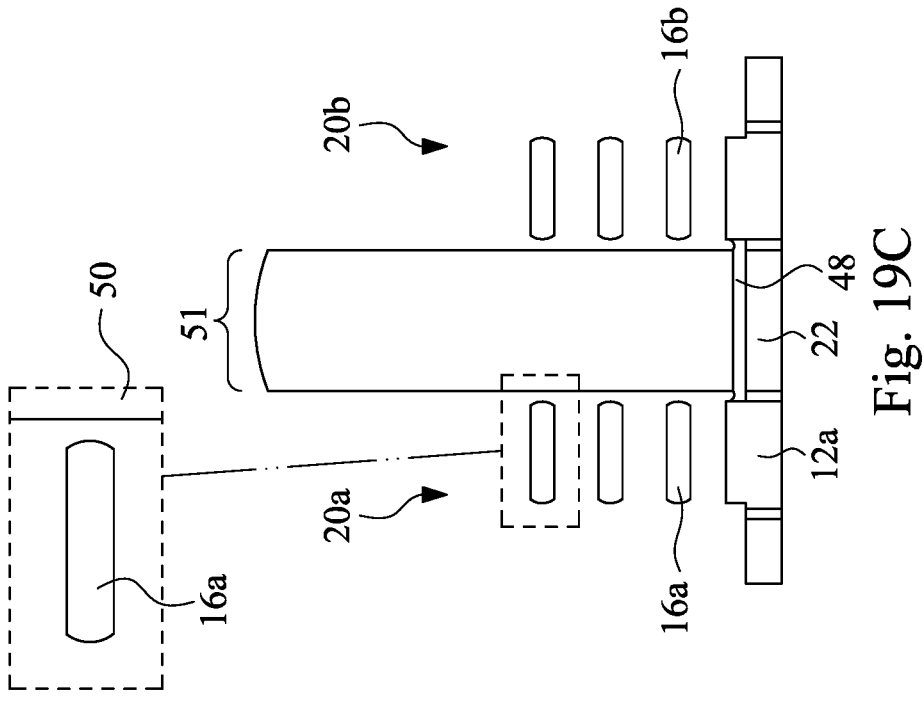
Figure 19B:
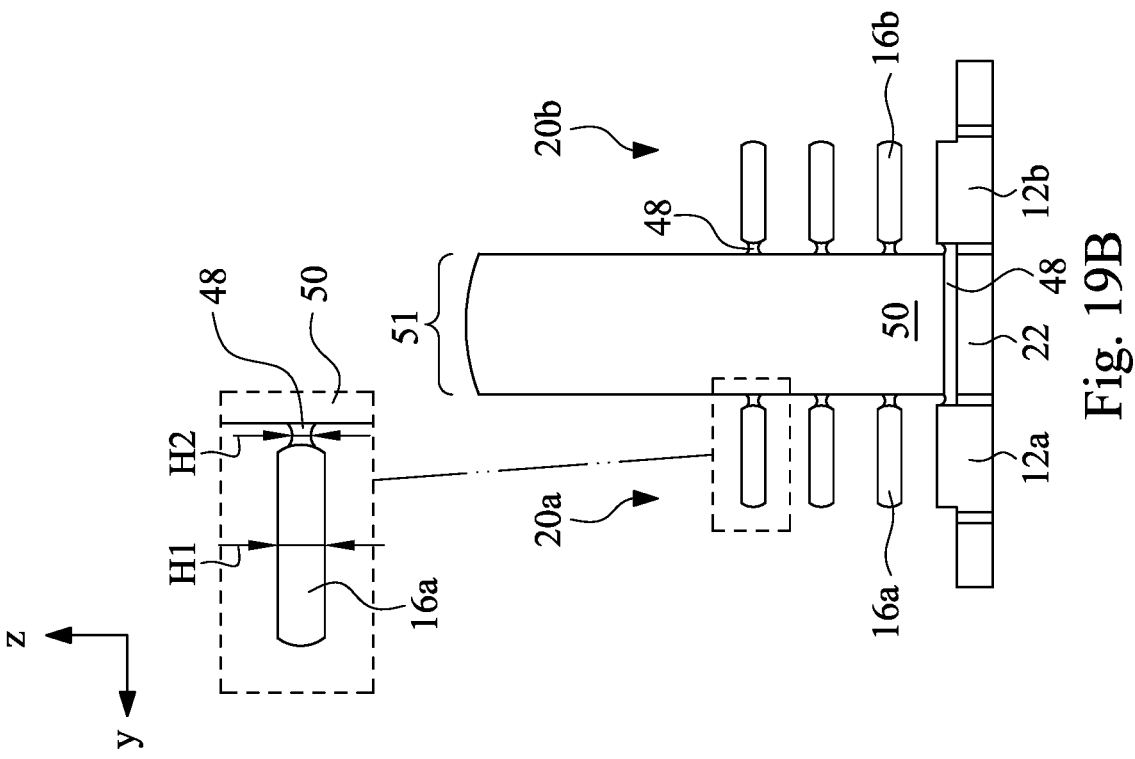

In operation 130, an etch process is performed to remove at least a portion of the dielectric liner layer 48 formed on sidewalls of the fin structures 20a, 20b, as shown in FIGS. 19A-19C. FIG. 19A is a schematic perspective cross sectional view along the B-B line in FIG. 2. FIGS. 19B-19C are schematic cross sectional views along the B-B line in FIG. 2.

In some embodiments, profiles of gate structures to be formed may be controlled by removing different amount of the dielectric liner layer 48 in operation 130. In FIG. 19B, a portion of the dielectric liner layer 48 remains between the semiconductor layer 16a/16b and the dielectric filling layer 50. The semiconductor layer 16a/16b may have a height H1 along the z-axis. The remaining dielectric liner layer 48 may have a height H2 along the z-axis. In some embodiments, the height H2 is less than the height H1 and the subsequent gate structure may have a π-shaped profile. In FIG. 19C, the dielectric liner 48 is completely removed and the subsequent gate structure may surround all sides of the semiconductor layer 16a/16b. In some embodiments, the operation 130 may be omitted and the subsequent gate structure may surround the semiconductor layers 16a, 16b from three sides. When more of the dielectric liner layer 48 is removed, the effective length of the subsequent gate structure increases, leading to improved gate control performance. When more of the dielectric liner layer 48 remains, the low-k dielectric material in the dielectric liner layer 48 improves average capacitance (AC) performance.

Figure 20B:
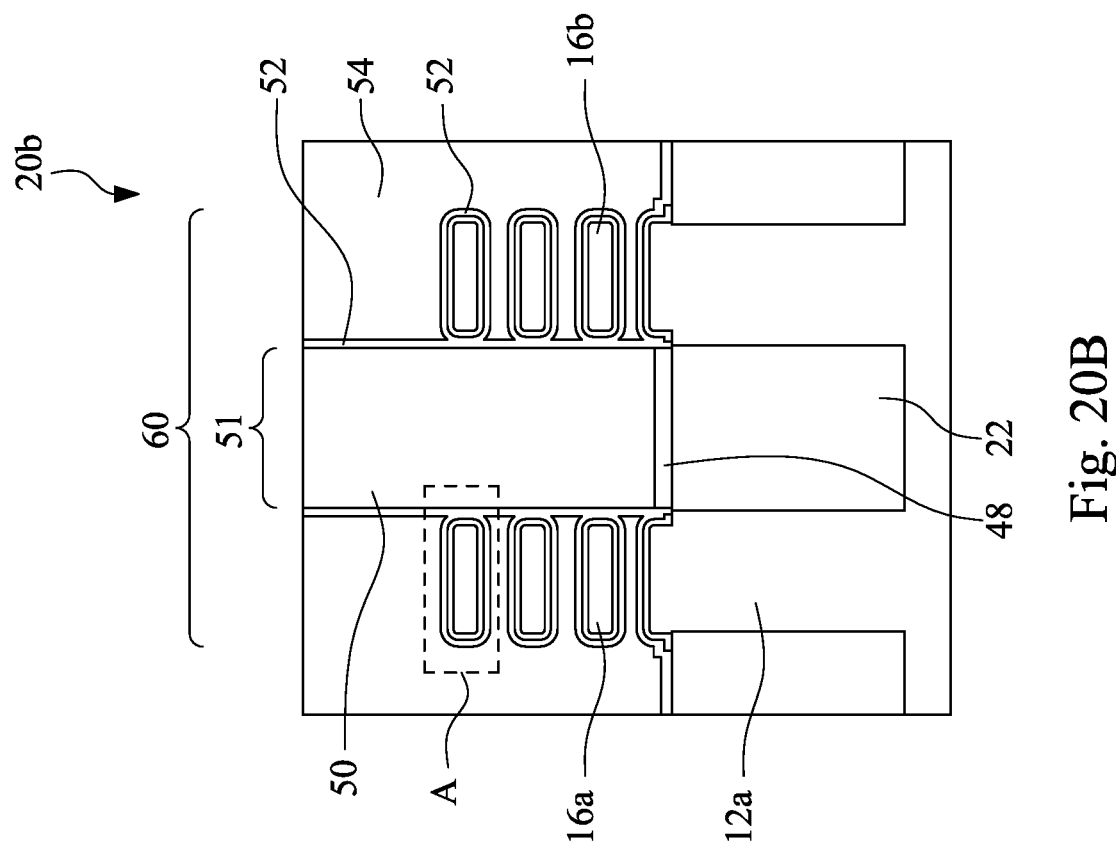
Figure 20A:
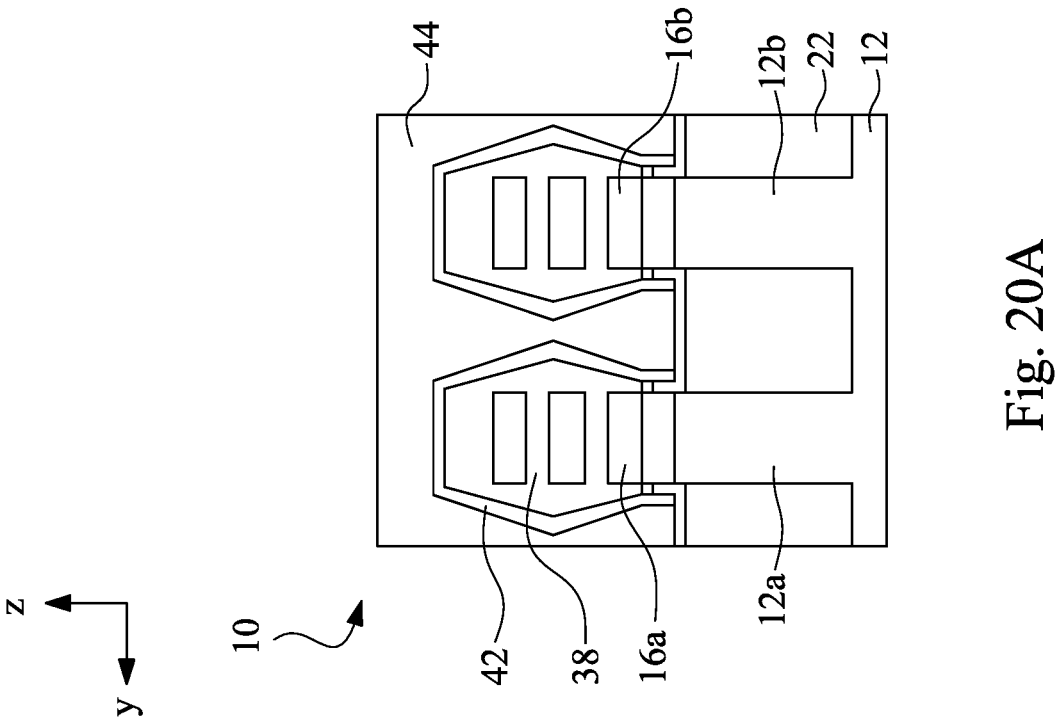
Figure 20C:
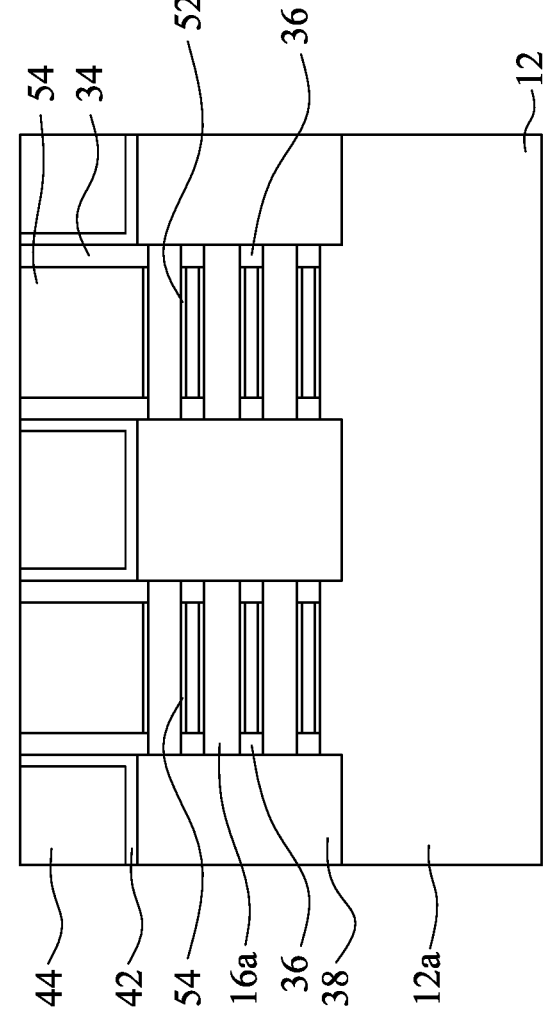
Figure 20D:
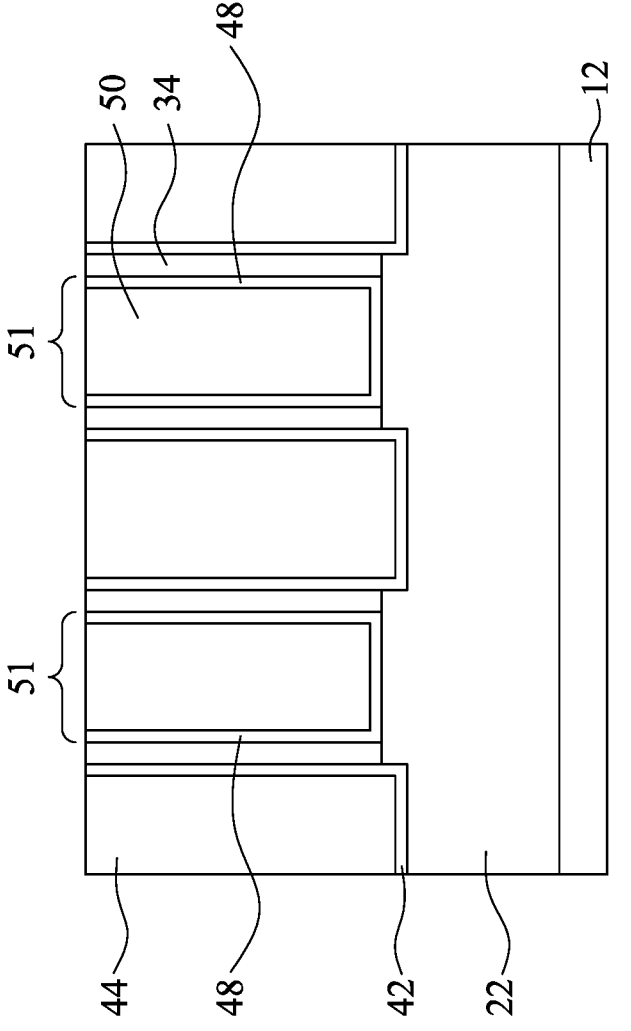
Figure 20D:
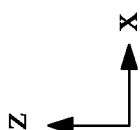

In operation 132, replacement gate structures 58 are formed, as shown in FIGS. 20A-20D. FIG. 20A is a schematic cross sectional view along the A-A line in FIG. 2. FIG. 20B is a schematic perspective cross sectional view along the B-B line in FIG. 2. FIG. 20C is a schematic cross sectional view along the C-C line in FIG. 2. FIG. 20D is a schematic cross sectional view along the D-D line in FIG. 2. The replacement gate structure 58 may include a gate dielectric layer 52, and a gate electrode layer 54. In some embodiments, the replacement gate structure 58 further includes a conductive cap layer 56.

The gate dielectric layer 52 is formed on exposed surfaces after removal of the sacrificial gate structures 24. In some embodiments, the gate dielectric layer 52 may have different composition and dimensions for the n-type devices and p-type devices and are formed separately using patterned mask layers and different deposition recipes. The gate dielectric layer 52 may include one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The gate dielectric layer 52 may be formed by CVD, ALD or any suitable method. In some embodiments, the thickness of the gate dielectric layer 52 is in a range between about 1 nm and about 6 nm. In some embodiments, an interfacial layer may be formed between the semiconductor layers 16a, 16b and the gate dielectric layer 52. The gate dielectric layer 52 is in contact with the dielectric wall 51.

The gate electrode layer 54 is formed on the gate dielectric layer 52 to fill the gate cavities. The gate electrode layer 54 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. In some embodiments, the gate electrode layer 54 may be formed by CVD, ALD, electro-plating, or other suitable method. In some embodiments, a planarization process may be performed after formation of the gate electrode layer 54. In some embodiments, the conductive cap layer 56 may be formed over the gate electrode layer 54. The conductive cap layer 56 may include tungsten.

As shown in FIG. 20B, the semiconductor layers 16a, 16b, the gate dielectric layer 52 formed on the semiconductor layers 16a, 16b, the gate electrode layer 54, and the dielectric wall 51 form a forksheet structure 60. The semiconductor layers 16a form a first channel region and the semiconductor layers 16b form a second channel region. The dielectric wall 51 is disposed between the first and second channel regions.

Figure 20E:
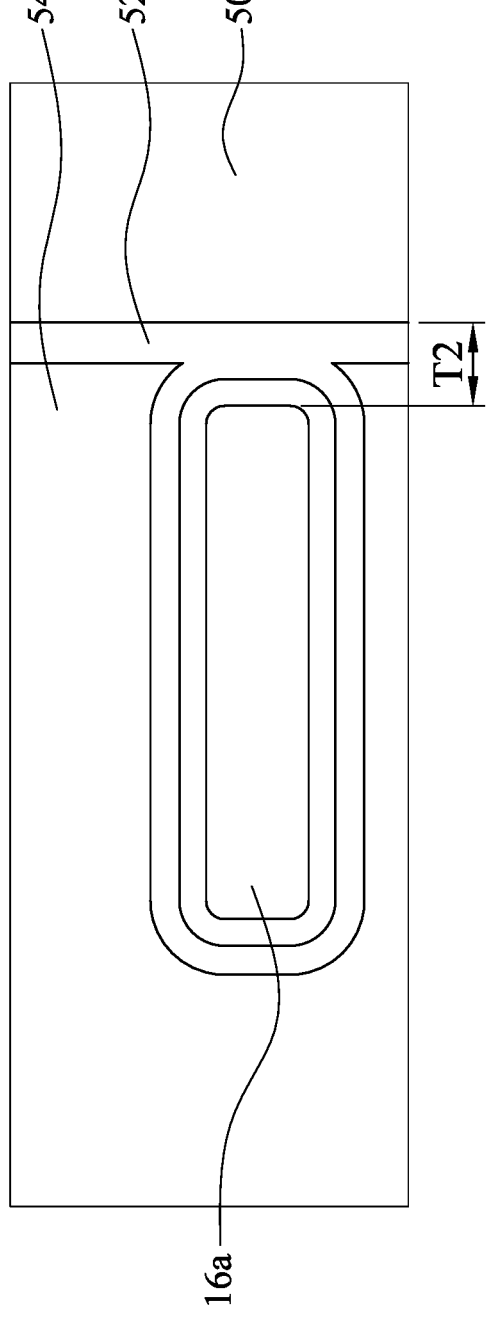
Figure 20E:
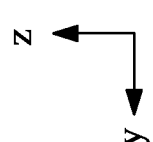
Figure 20F:
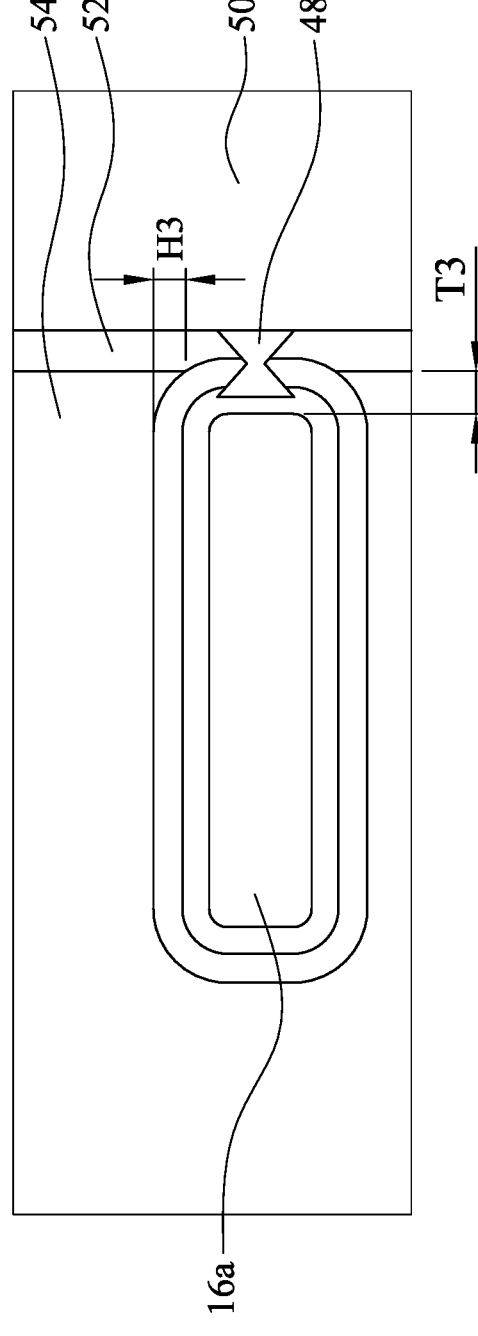
Figure 20F:
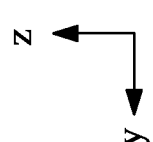
Figure 20G:
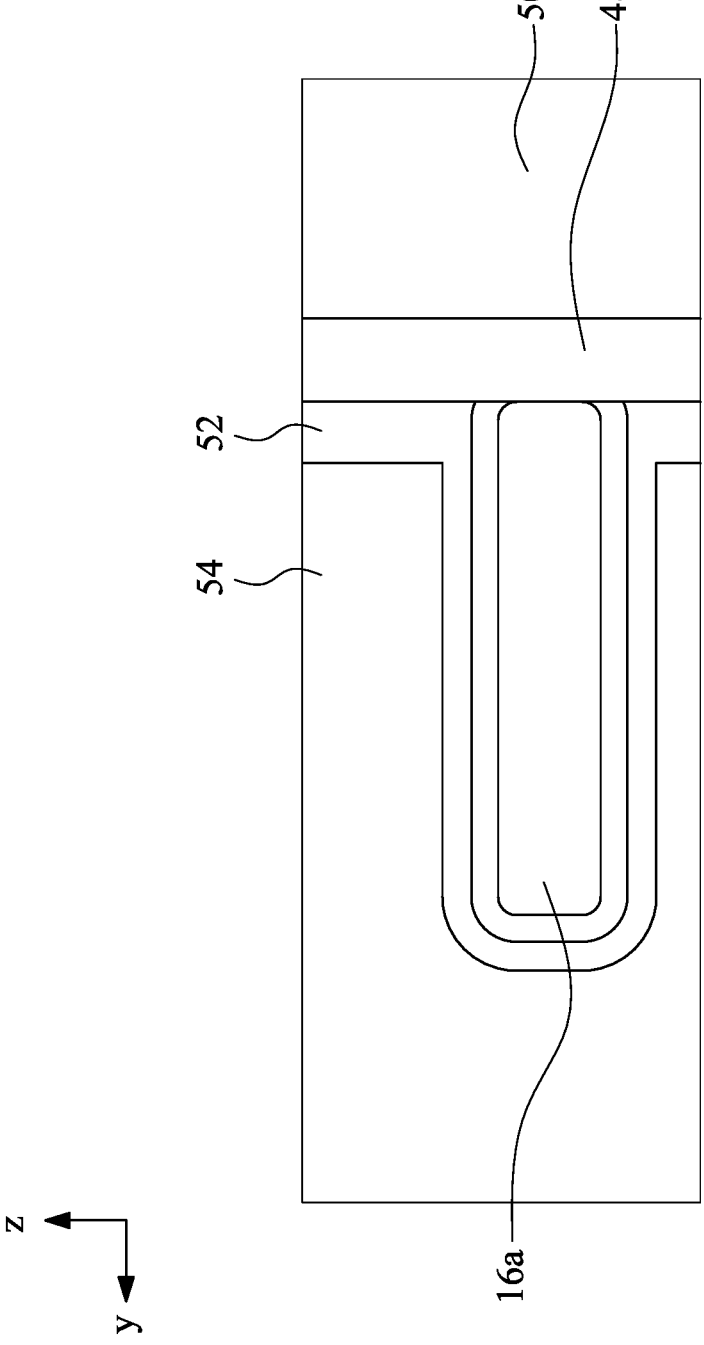

The gate structure around each channel layer or the semiconductor layer 16a, 16b may be adjusted to achieve desirable performance. FIGS. 20E, 20F, 20G are partial enlarged views of the area A in FIG. 20B to show different profiles of the gate structure. In FIG. 20E, the gate dielectric layer 52 surrounds all sides of the channel layer or the semiconductor layer 16a, 16b. The gate dielectric layer 52 is formed in the space defined by the dielectric liner layer 48 of the dielectric wall 51. In some embodiments, the dielectric layer 52 may have a thickness T2 between the semiconductor layer 16a, 16b and dielectric wall 51. In some embodiments, the thickness T2 is in range between about 2 nm and about 5 nm.

In FIG. 20F, a segment of the dielectric liner layer 48 remains on the end portion of the semiconductor layer 16a, 16b. The gate dielectric layer 52 surrounds of the channel layer or the semiconductor layer 16a, 16b not cover by the dielectric layer 48. As shown in FIG. 20F, the gate dielectric layer 52 has a π-shaped profile in the cross section of FIG. 20B. A portion of the gate electrode layer 54 may be present between the semiconductor layer 16a, 16b and the dielectric wall 51. The portion of the gate electrode layer 54 may have a thickness T3 between the semiconductor layer 16a, 16b and dielectric wall 51 and a height H3 from a top surface of the semiconductor layer 16a/16a and a top surface of the dielectric layer 48 as shown in FIG. 20F. In some embodiments, the thickness T3 may be less than about 1 nm. The height H3 may be in a range between 0 nm and about 3 nm.

In FIG. 20G, the dielectric liner layer 48 remains the entire end portion of the semiconductor layer 16a, 16b. The gate dielectric layer 52 surrounds of the channel layer or the semiconductor layer 16a, 16b on three sides.

Figure 21A:
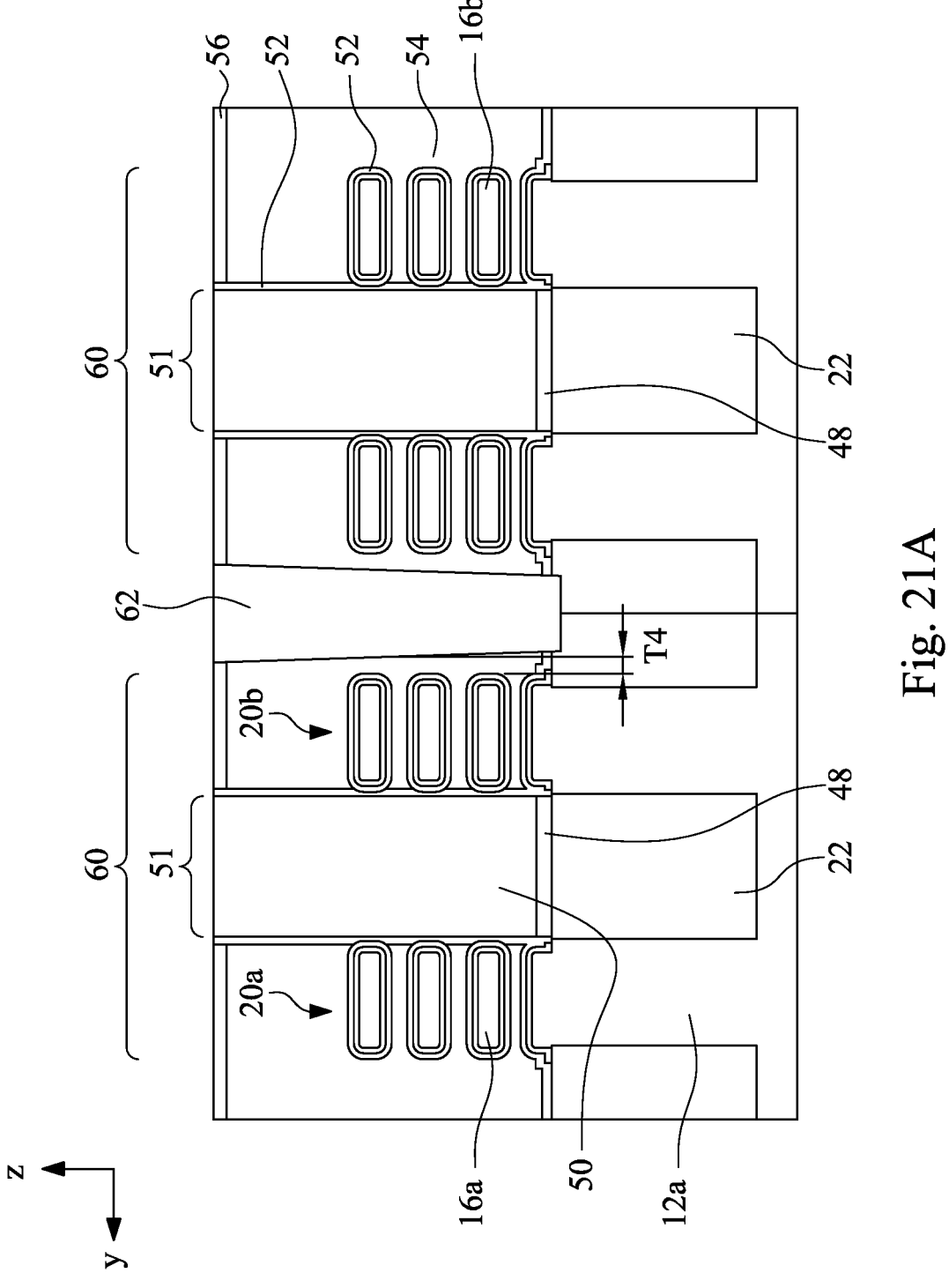

In operation 134, cut gate structure 62 may be formed within the gate structure 58 adjacent the forksheet structure 60, as shown in FIG. 21A. FIG. 21A is a schematic perspective cross sectional view along the B-B line in FIG. 2 through four fin structures. The gate electrode layer 54 and the conductive cap layer 56 may be patterned and cut into two sections by an opening. One or more dielectric material may then be filled in the opening to form the cut gate structure 62. The cut gate structure 62 electrically isolates the two sections of the gate electrode layer 54 and the conductive cap layer 56. The channel region including the semiconductor layers 16a are disposed between the dielectric wall 51 for the forksheet structure 60 and the cut gate structure 62.

The cut gate structure 62 may include one or more dielectric layers. In some embodiments, the cut gate structure 62 may be formed from one or more layers of low-k dielectric materials. For example, the cut gate structure 62 may be formed from one or more layers of dielectric materials having a dielectric constant lower than about 7. In some embodiments, the cut gate structure 62 is formed from one or more layers of SiO2, SiN, SiCN, SiOC, SiOCN, or other suitable dielectric material having a dielectric value less than 7.

As shown in FIG. 21A, a portion of the gate electrode layer 54 is disposed between the semiconductor layers 16b and the cut gate structure 62. The gate electrode layer 54 is disposed between the semiconductor layers 16b and the cut gate structure 62A has a thickness T4. In some embodiments, the thickness T4 may be in a range between about 5 nm and about 10 nm.

In some embodiments, the cut gate structure 62 may be formed prior to forming the replacement gate dielectric layer 52 and the gate electrode layer 54.

Figure 21B:
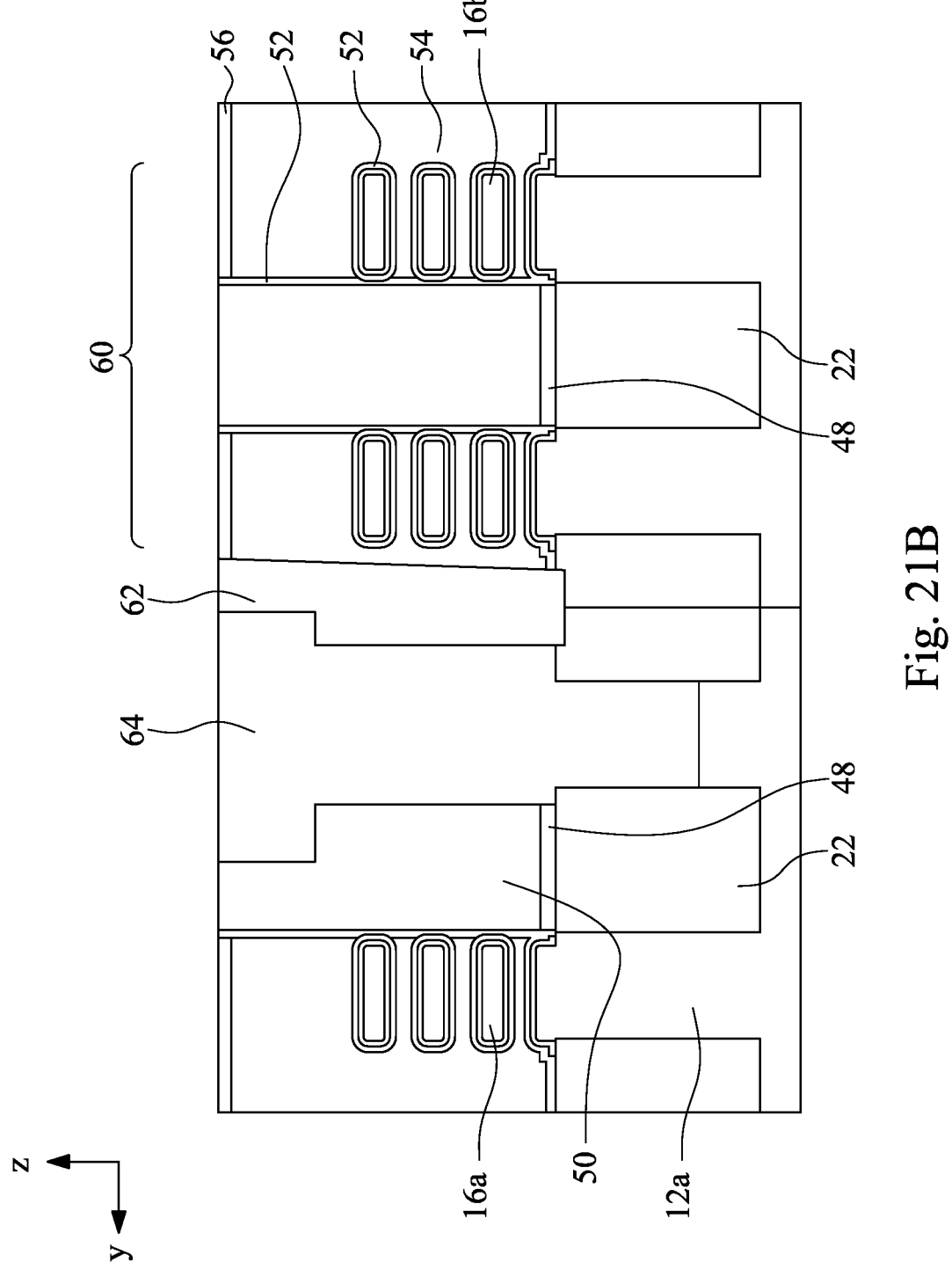

In some embodiments, a cut channel structure 64 may be formed between the dielectric wall 51 and the cut gate structure 62, as shown in FIG. 21B. The cut channel structure 64 may be formed by removing the semiconductor layers 16b and the gate structure therearound, and then depositing one or more dielectric layer. The cut channel structure 64 may be formed around cell edge to achieve desired circuit function.

Figure 22A:
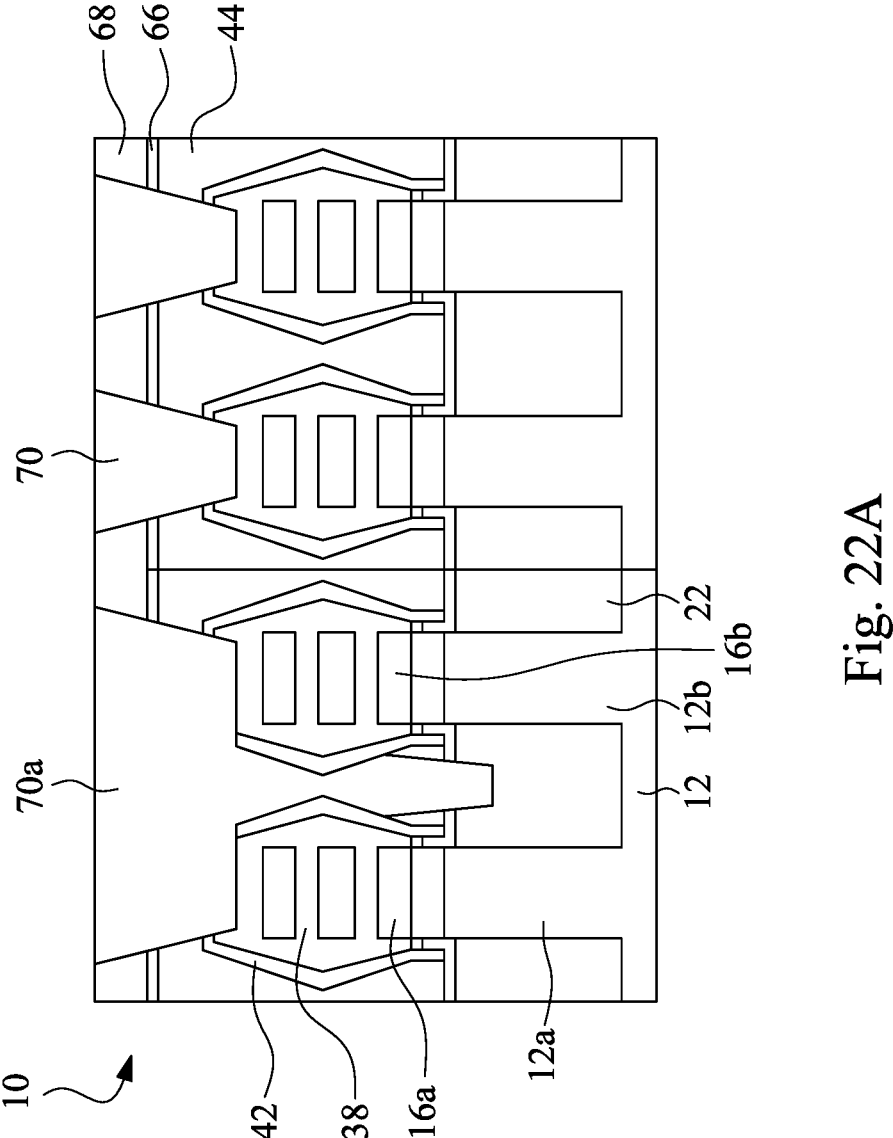
Figure 22A:
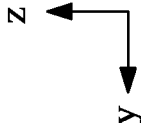
Figure 22B:
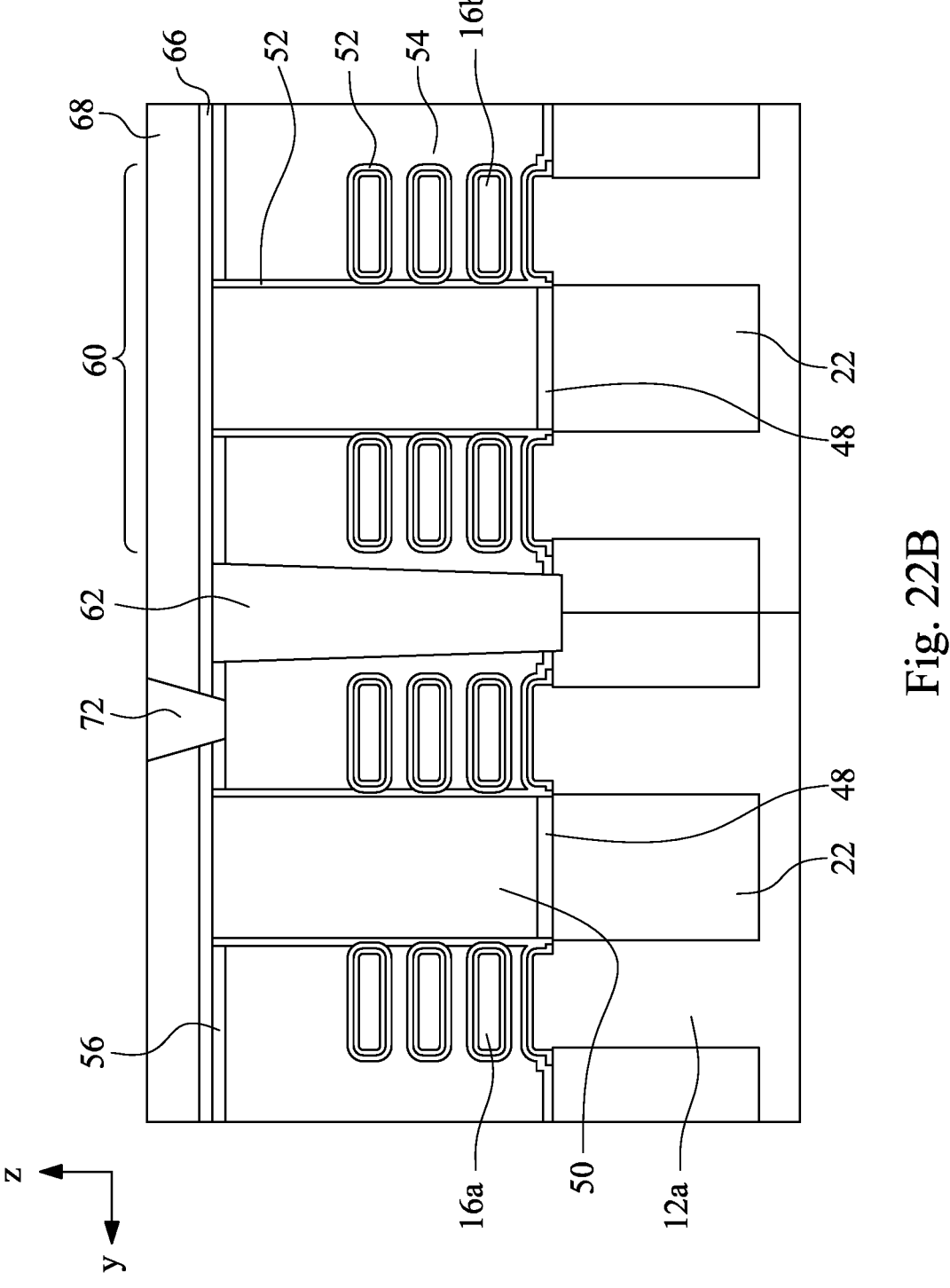
Figure 22C:
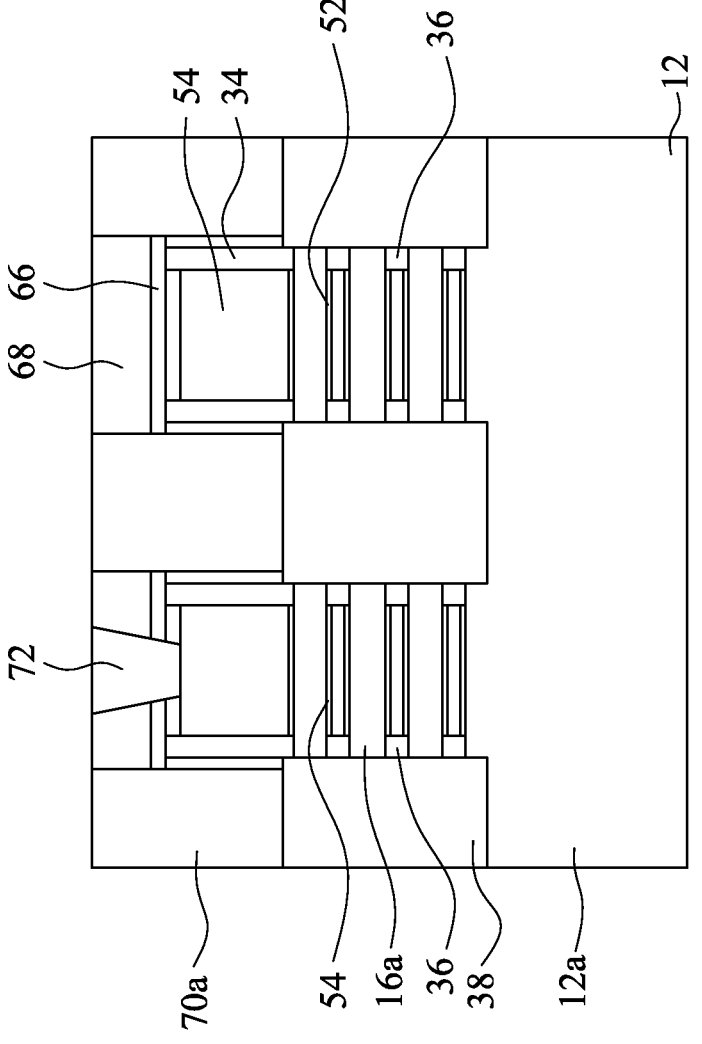
Figure 22C:
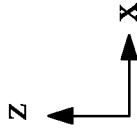
Figure 22D:
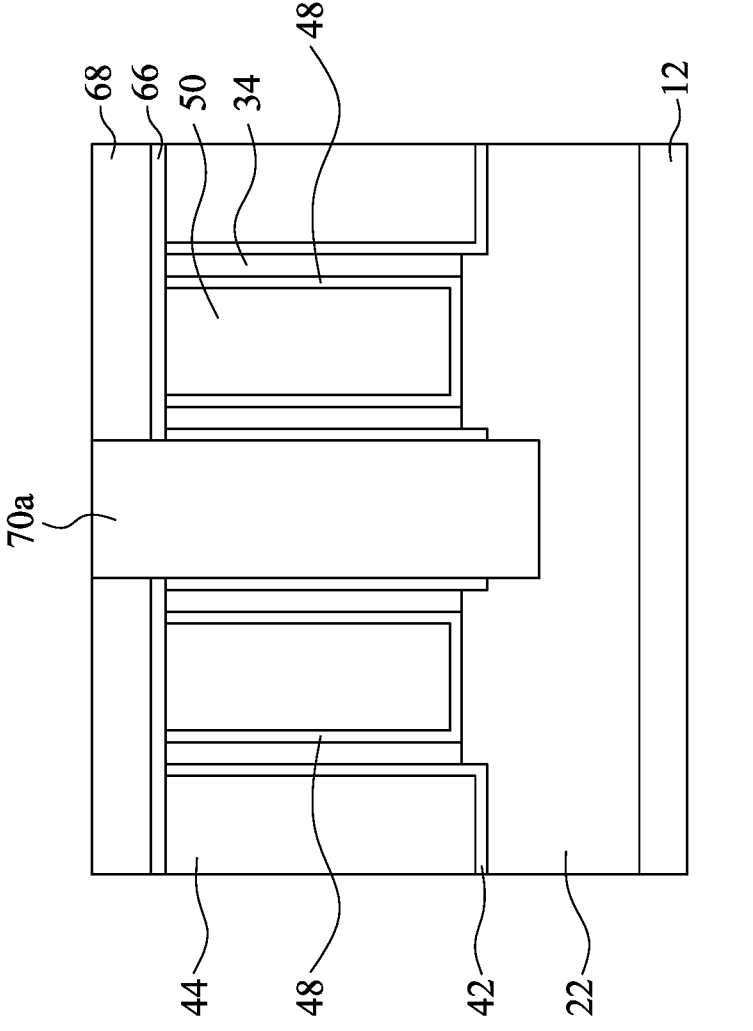
Figure 22D:
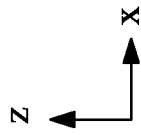

In operation 136, source/drain contact features 70 and gate contact features 72 are formed, as shown in FIGS. 22A-22D. FIG. 22A is a schematic cross sectional view along the A-A line in FIG. 2. FIG. 22B is a schematic perspective cross sectional view along the B-B line in FIG. 2. FIG. 22C is a schematic cross sectional view along the C-C line in FIG. 2. FIG. 22D is a schematic cross sectional view along the D-D line in FIG. 2.

In some embodiments, a planarization process may be first performed to expose the ILD layer 44 and the conductive cap layer 56. In some embodiments, an etch stop layer 66 and an ILD layer 68 may sequentially deposited over the ILD layer 44 and the conductive cap layer 56. Suitable photolithographic and etching techniques are used to form the contact holes through various layers to expose the source/drain regions 38 and 40. After the formation of the contact holes, the silicide layer (not shown) is selectively formed over an exposed top surface of the epitaxial source/drain regions 38, 40 exposed by the contact holes. The source/drain contact features 70 are then formed by filling the contact holes with a conductive material. In some embodiments, the conductive material for the source/drain contact may be formed by CVD, PVD, plating, ALD, or other suitable technique. In some embodiments, the conductive material may include TiN, TaN, Ta, Ti, Hf, Zr, Ni, W, Co, Cu, Ag, Al, Zn, Ca, Au, Mg, Mo, Cr, or the like. Similarly, suitable photolithographic and etching techniques are used to form the contact vias through various layers to expose the gate structure 58. A conductive material is then filled in contact vias to form the gate contact features 72.

The source/drain contact feature 70a is a shared contact feature for the source/drain regions 38, 40 connected to two channel regions of the forksheet structure 60. Because the dielectric wall 51 is not present between the source/drain regions 38 and 40, the dielectric wall 51 of the forksheet structure 60 would not be damaged during contact hole formation or hinder exposure of the source/drain regions 38, 40.

Figure 23:
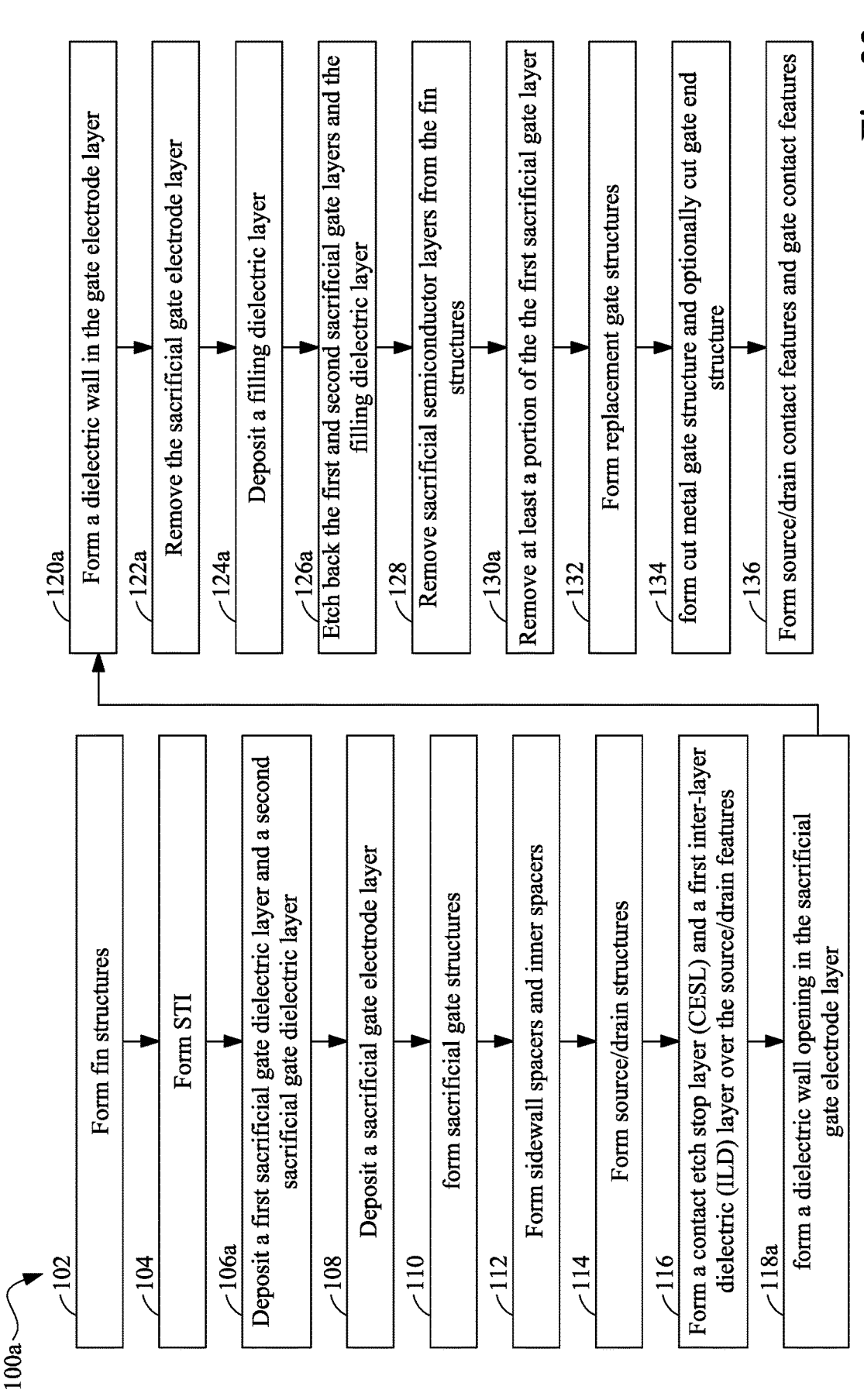
FIG. 23 is a flow chart of a method for manufacturing of a semiconductor device according to embodiments of the present disclosure.

FIG. 23 is a flow chart of a method 100a for manufacturing of a semiconductor device according to embodiments of the present disclosure. FIGS. 24-34, 35A-35B, 36A-36E, and 37A-37B schematically illustrate various stages of manufacturing a semiconductor device 10a using the method 10a. The method 100a includes operations similar to operations in the method 100 above. The same reference numerals are used to denote these similar operations.

Figure 24:
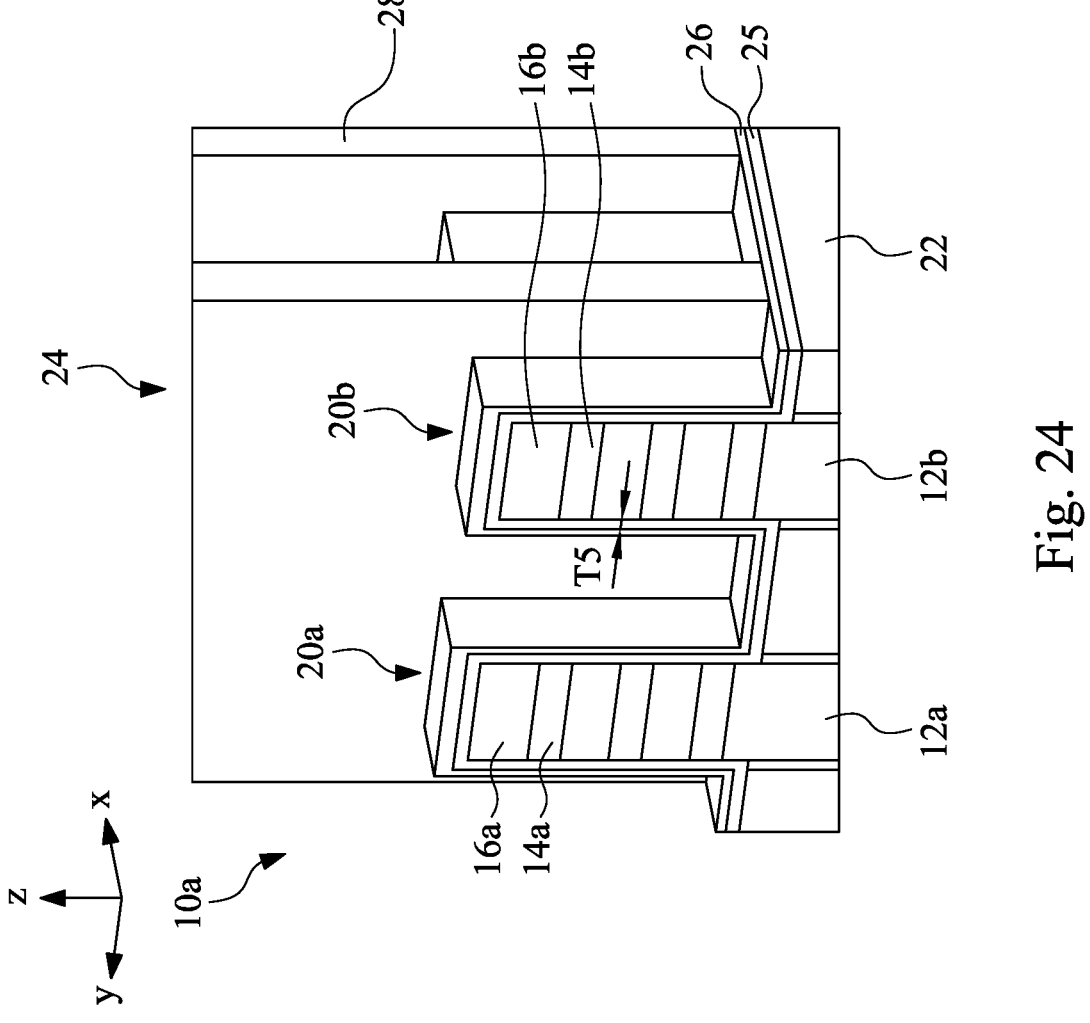
FIGS. 24-34, 35A-35B, 36A-36E, and 37A-37B schematically illustrate various stages of manufacturing a semiconductor device according to embodiments of the present disclosure.
Figure 25:
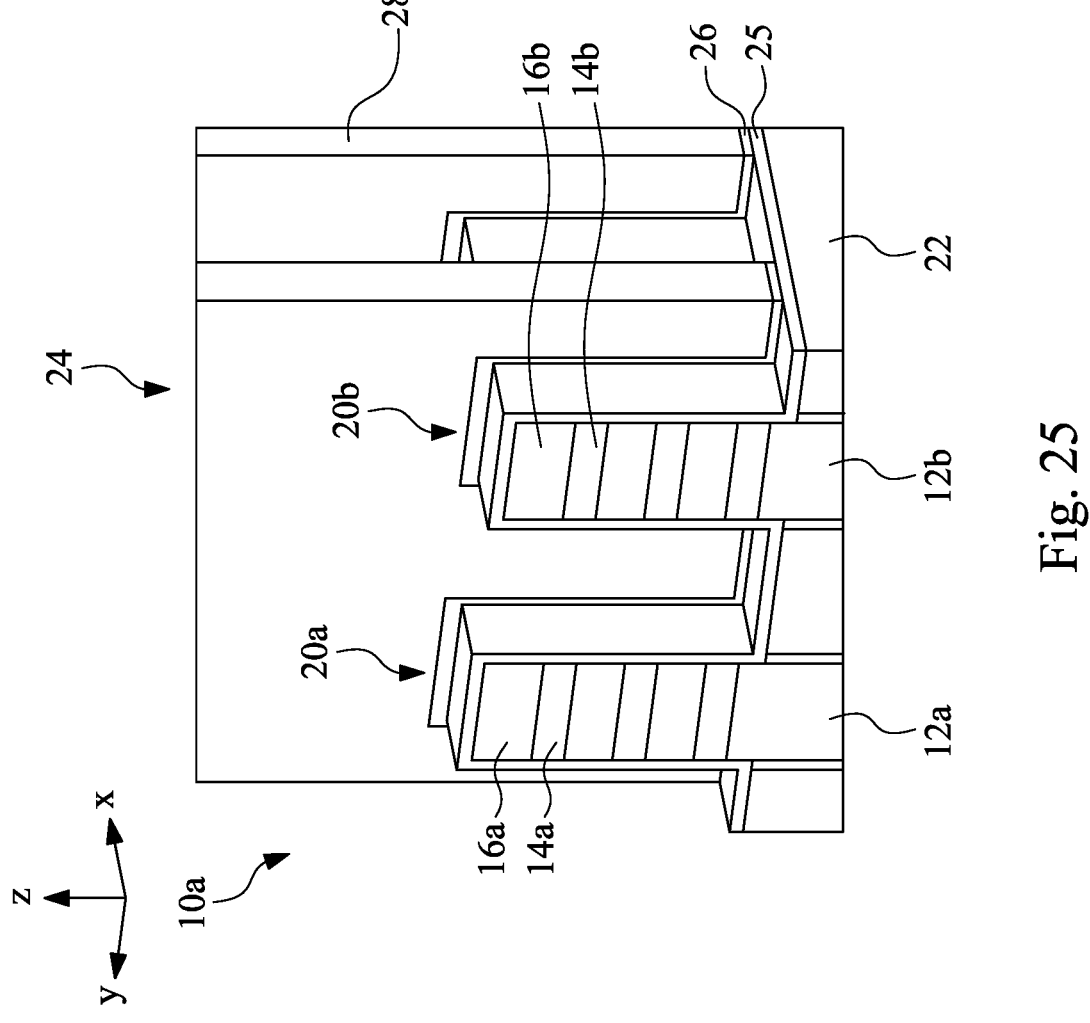
Figure 26:
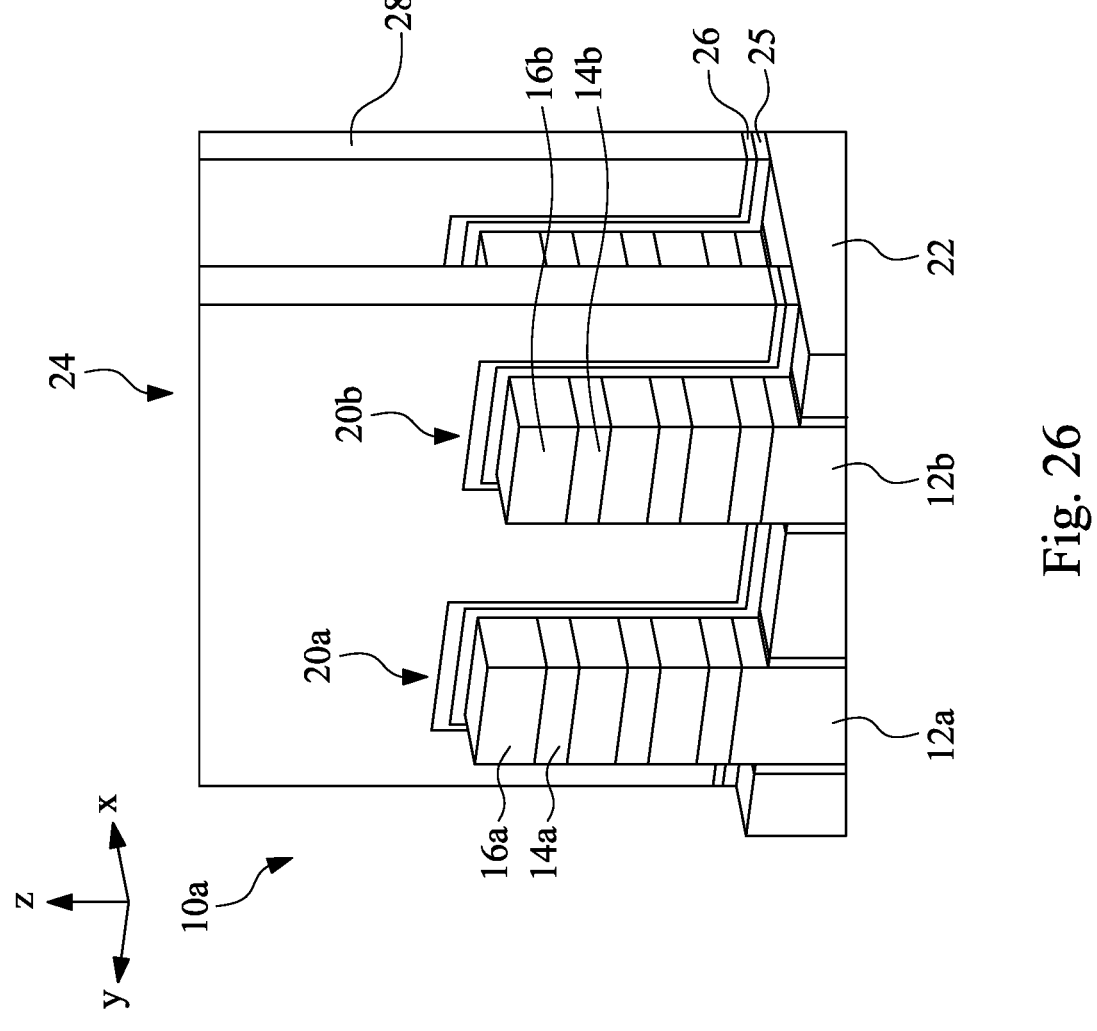
Figure 27:
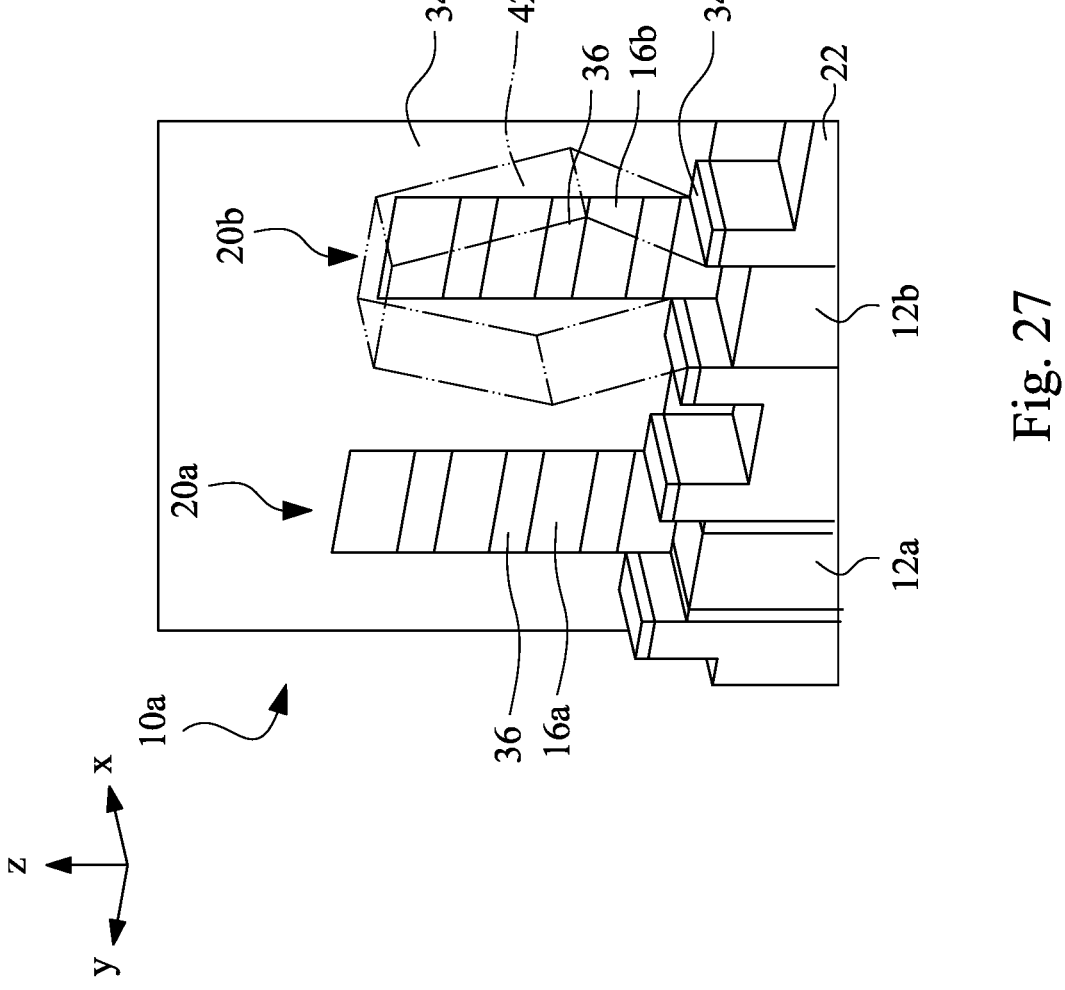
Figure 28:
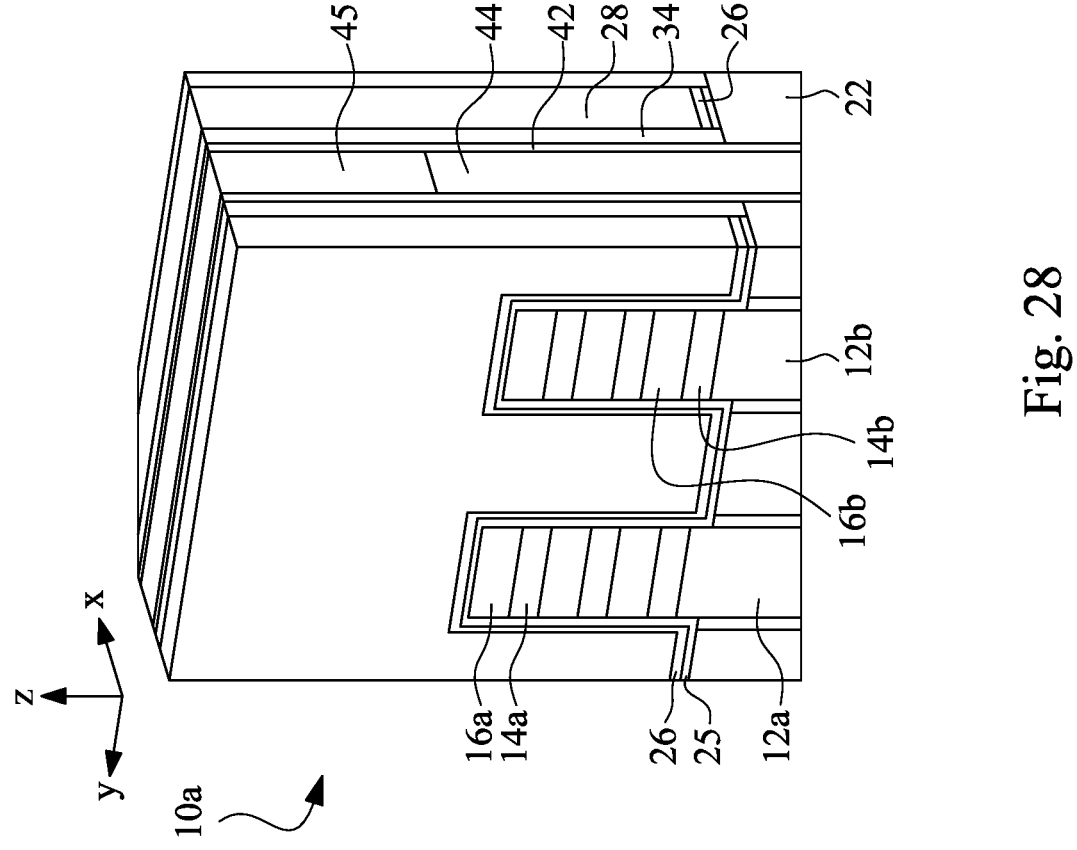

Operations 102 and 104 of the method 100a are similar to the operations 102 and 104 of the method 100, in which semiconductor fin structures 20a, 20b are formed, as shown in FIG. 24. FIG. 24 is a schematic perspective sectional view along the line A-A in FIG. 2.

In operation 106a, a first sacrificial gate dielectric layer 25 and a second sacrificial gate dielectric layer 26 are sequentially deposited over the exposed surfaces of the semiconductor device 10, as shown in FIG. 24. The first and sacrificial gate dielectric layers 25 and 26 may include one or more layers of dielectric material, such as SiO$_2$, SiN, a high-k dielectric material, and/or other suitable dielectric material, and have etch selectivity relative to each other. In some embodiments, the first and second sacrificial gate dielectric layers 25 and 26 are formed from a low-k dielectric material, such as a dielectric material with k value less than 7. In some embodiments, the first sacrificial gate dielectric layer 25 may be a SiN layer and the second sacrificial gate dielectric layer 26 includes SiO2. In some embodiments, the first sacrificial gate dielectric layer 25 may be conformally deposited and subsequently used to define a gate end cap on a channel in a forksheet structure. For example, a thickness T5 of the first sacrificial gate dielectric layer 25 are formed on the end portion the semiconductor layers 16a, 16b may be used to define a thickness of the gate end cap. In some embodiments, the thickness T5 may be in a range between about 2 nm and about 5 nm.

Operations 108, 110, 112, 114, and 116 of the method 100a are similar to the operations 108, 110, 112, 114, and 116 of the method 100, in which the sacrificial gate structures 24, the sidewall spacers 34, the inner spacers 36, the source/drain regions 38, 40, the CESL layer 42, and ILD layer 44 are sequentially formed as shown in FIGS. 24-28. FIGS. 24-28 are schematic perspective sectional views along the line A-A in FIG. 2 at various stages.

Figure 29:
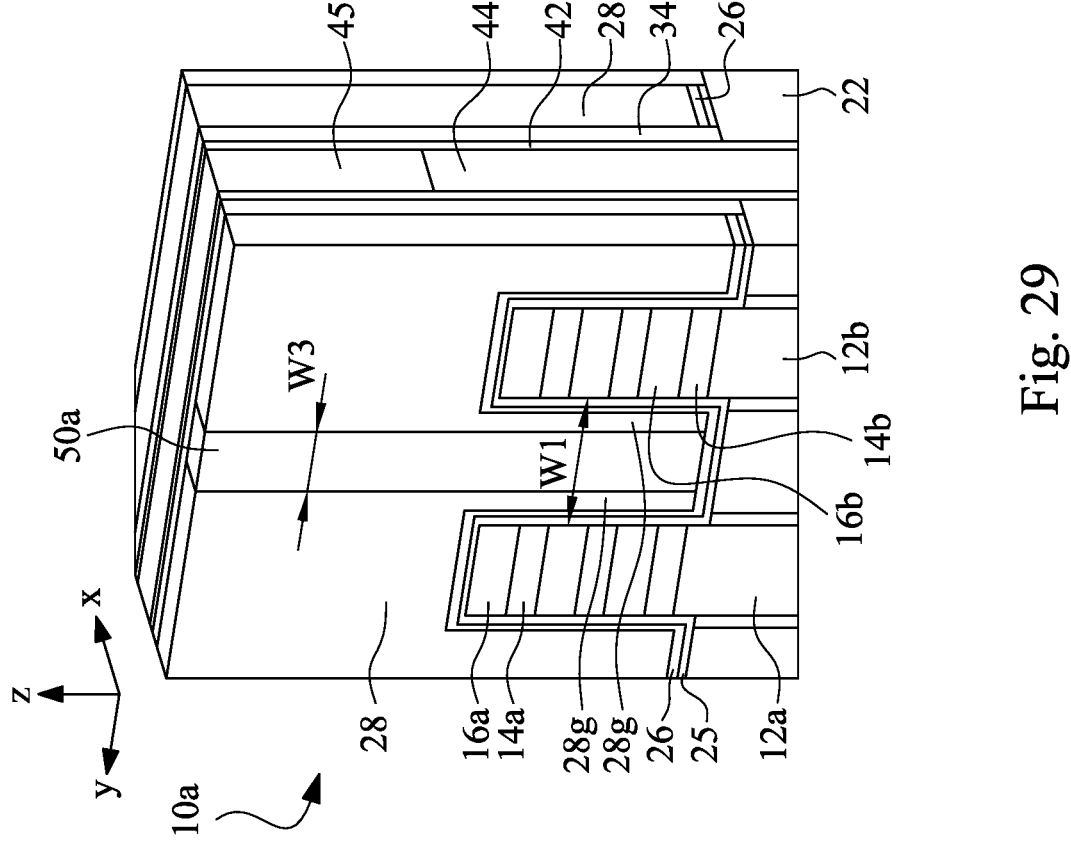

In operation 118a, a dielectric wall opening is formed within the sacrificial gate electrode layer 28, as shown in FIG. 29. FIG. 29 is a schematic perspective sectional view along the line B-B in FIG. 2. The dielectric filling opening extends along the x-axis within the sacrificial gate structure 24 and terminates at the sidewall spacers 34. Along the y-axis, the dielectric filling opening has a width W3 which is less than the width W1 of the trench 21 between the semiconductor fin structures 20a, 20b and leaving a gap volume 28g of the sacrificial gate electrode layer 28 between the dielectric filling layer 50a and the second sacrificial gate dielectric layer 26. The gap volume 28g ensures that the first sacrificial gate dielectric layer 25 is not damaged during patterning process of the dielectric wall opening.

In operation 120a, a dielectric filling layer 50a is deposited in the dielectric filling opening, as shown in FIG. 29. The dielectric filling layer 50a extends along the x-axis within the sacrificial gate structure 24 and terminates at the sidewall spacers 34. Along the y-axis, the dielectric filling layer 50a has the width W3 which is less than the width W1 of the trench 21. The dielectric filing layer 50a may be a low-k dielectric material, such as SiO2, SiN, SiCN, SiOC, SiOCN, or other suitable dielectric material having a dielectric value less than 7. In some embodiments, the dielectric filling layer 50a may be formed from a low-k dielectric material having etch selectivity from the second sacrificial gate dielectric layer 26 and the first sacrificial gate dielectric layer 26.

Figure 30:
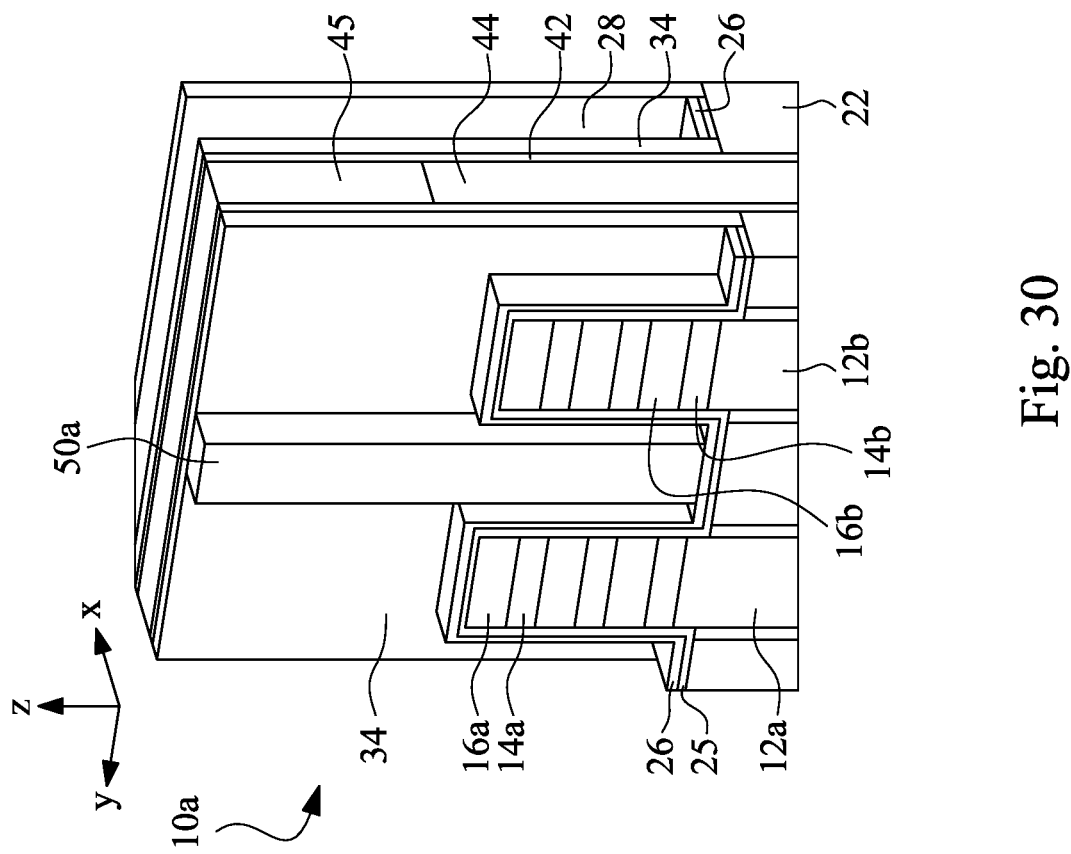

In operation 122a, the sacrificial gate electrode layer 28 is removed, as shown in FIG. 30. FIG. 30 is a schematic perspective sectional view along the line B-B in FIG. 2. The sacrificial gate electrode layer 28 can be removed using plasma dry etching and/or wet etching. When the sacrificial gate electrode layer 28 is polysilicon, a wet etchant such as a Tetramethylammonium hydroxide (TMAH) solution can be used to selectively remove the sacrificial gate electrode layer 28 without removing the dielectric materials of the ILD layer 44, the CESL 42 or the dielectric wall 51a. As shown in FIG. 30, the gap volume 28g is removed forming an air gap between the dielectric filling layer 50a and the second sacrificial gate dielectric layer 26.

Figure 31:
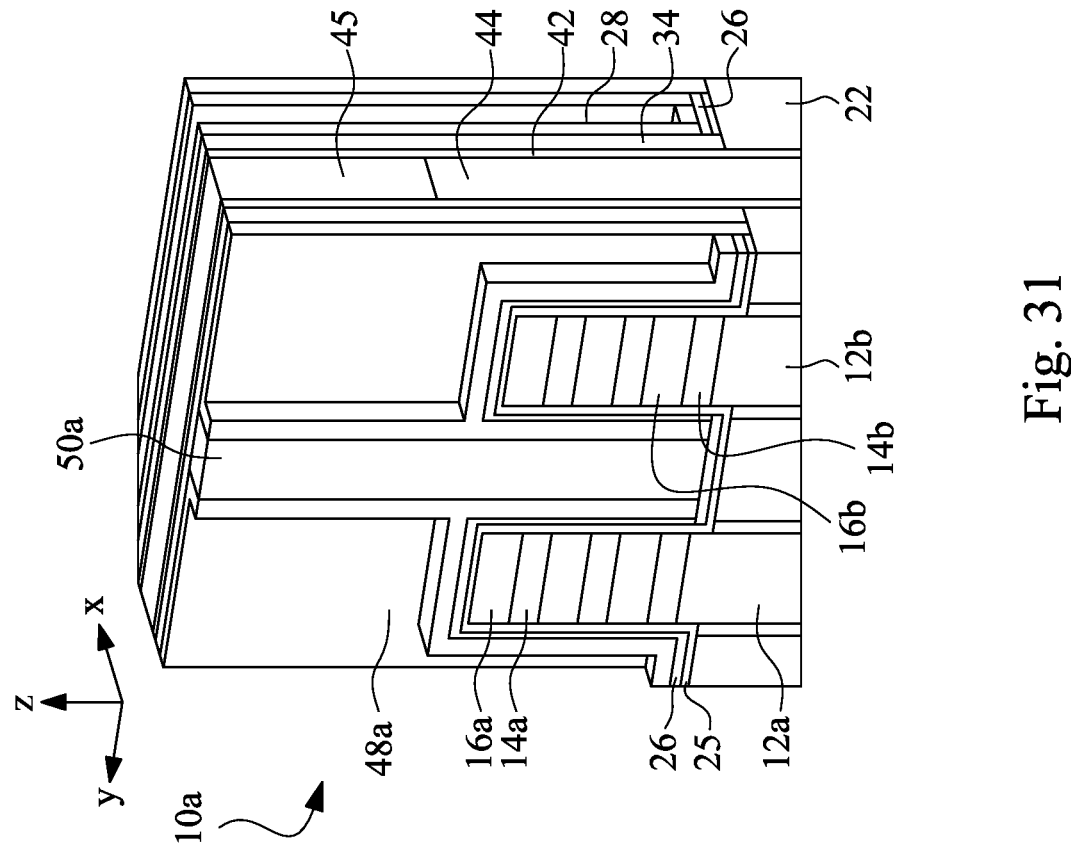

In operation 124a, a second dielectric filling layer 48a is filled in the air gap between the dielectric filling layer 50a and the second sacrificial gate dielectric layer 26, as shown in FIG. 31. FIG. 31 is a schematic perspective sectional view along the line B-B in FIG. 2. In some embodiments, the second dielectric filing layer 48a may be conformally deposited. In some embodiments, the second dielectric filing layer 48a may be formed from a low-k dielectric material, such as SiO2, SiN, SiCN, SiOC, SiOCN, or other suitable dielectric material having a dielectric value less than 7. In some embodiments, the second dielectric filing layer 48a may be selectively removed from the sidewall spacers 34, and from the first dielectric filing layer 50a. In some embodiments, the second sacrificial gate dielectric layer 26 and the second dielectric filling layer 48a may be formed from the same material.

Figure 32:
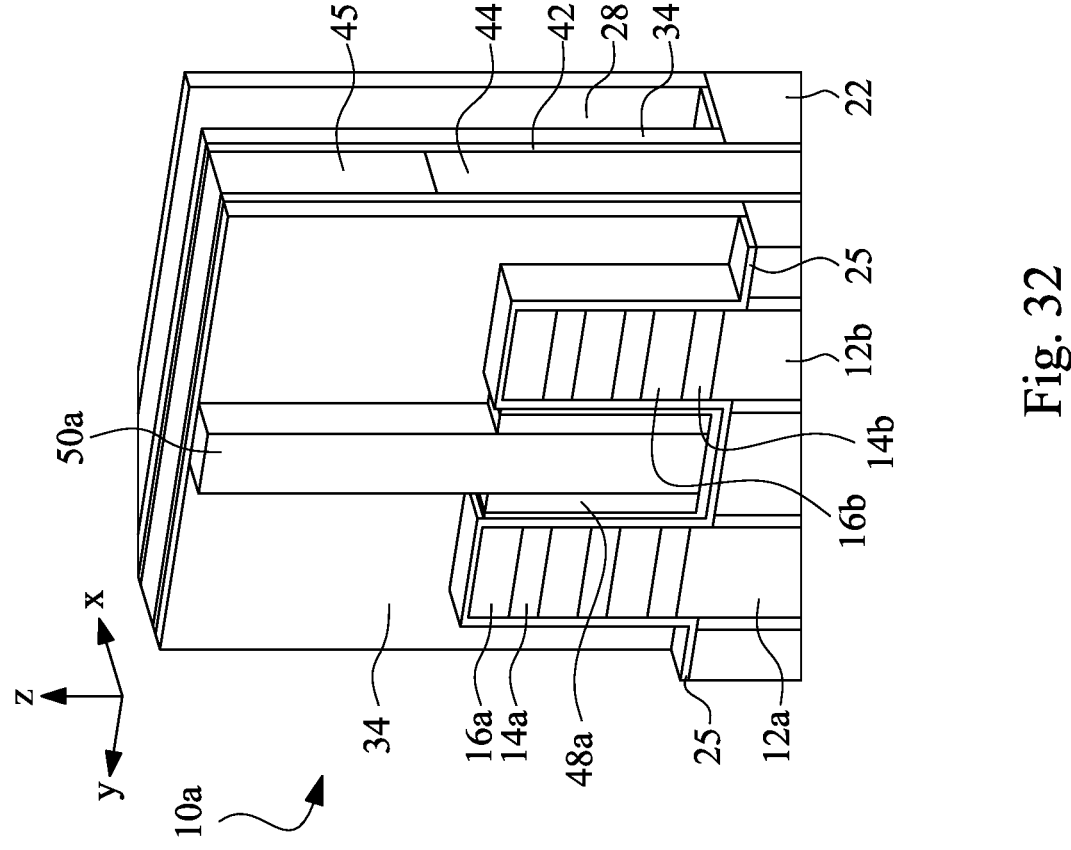
Figure 33:
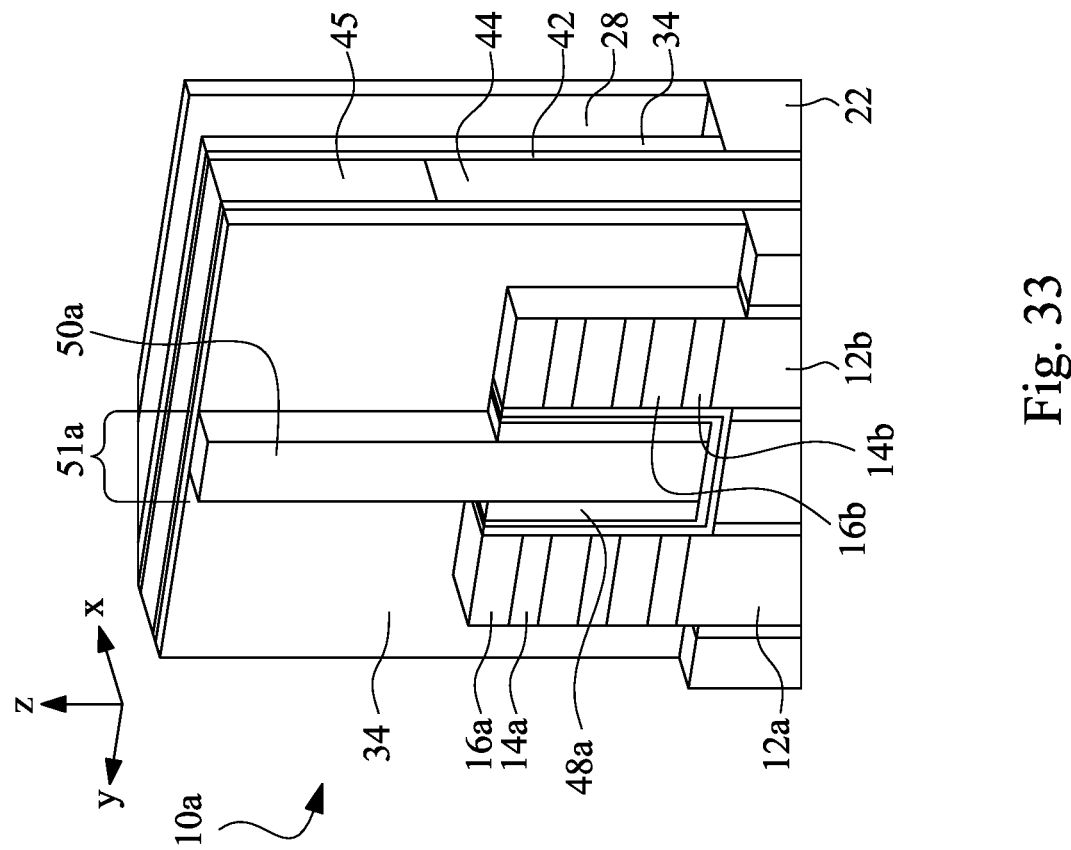

In operation 126a, the second dielectric filing layer 48a, the second sacrificial gate dielectric layer 26, and the first sacrificial gate dielectric layer 25 are sequentially removed to expose the fin structures 20a, 20b, as shown in FIGS. 32 and 33. FIGS. 32 and 33 are schematic perspective sectional views along the line B-B in FIG. 2.

In FIG. 32, the second dielectric filing layer 48a and the second sacrificial gate dielectric layer 26 are selectively removed. The second dielectric filing layer 48a and sacrificial gate dielectric layer 26 may be removed using a suitable etch process. In some embodiment, an isotropic etching process, such as a wet etching process, may be used to remove the second dielectric filing layer 48a and the second sacrificial gate dielectric layer 26 from exposed surface areas leaving portions of the second dielectric filing layer 48a and the second sacrificial gate dielectric layer 26 between the dielectric filling layer 50a and the semiconductor fin structures 20a, 20b. The first sacrificial gate dielectric layer 25 is exposed.

In FIG. 33, the sacrificial gate dielectric layer 25 is selectively removed using a suitable etch process. In some embodiment, an isotropic etching process, such as a wet etching process, may be used to remove the sacrificial gate dielectric layer 25 from exposed surface areas leaving portions of the sacrificial gate dielectric layer 25 between the dielectric filling layer 50a and the semiconductor fin structures 20a, 20b. The semiconductor layers 14a, 14b are exposed.

As shown in FIG. 33, a dielectric wall 51a for the forksheet structure is formed. The dielectric wall 51a includes the first dielectric filing layer 50a, the second dielectric filing layer 48a, the second sacrificial gate dielectric layer 26, and the first sacrificial gate dielectric layer 25. The first dielectric filling layer 50a is disposed between and extending above the semiconductor fin structures 20a, 20b. The first dielectric filling layer 50a may be a substantially rectangular column having first and second surfaces in contact with and terminating at the sidewall spacers 34, and third and fourth surfaces facing the semiconductor fin structures 20a, 20b. The second dielectric filling layer 48a are disposed on a lower portion of the first dielectric filling layer 50a on the third and fourth surfaces facing the semiconductor fin structures 20a, 20b. The second sacrificial gate dielectric layer 26 is disposed on a bottom surface of the first dielectric filling layer 50a, and on the second dielectric filling layer 48a. At this stage, the first sacrificial gate dielectric layer 25 disposed outside and surrounds the second sacrificial gate dielectric layer 26. Subsequently, portions of the first sacrificial gate dielectric layer 25 may be further removed to achieve a desired gate profile.

Figure 34:
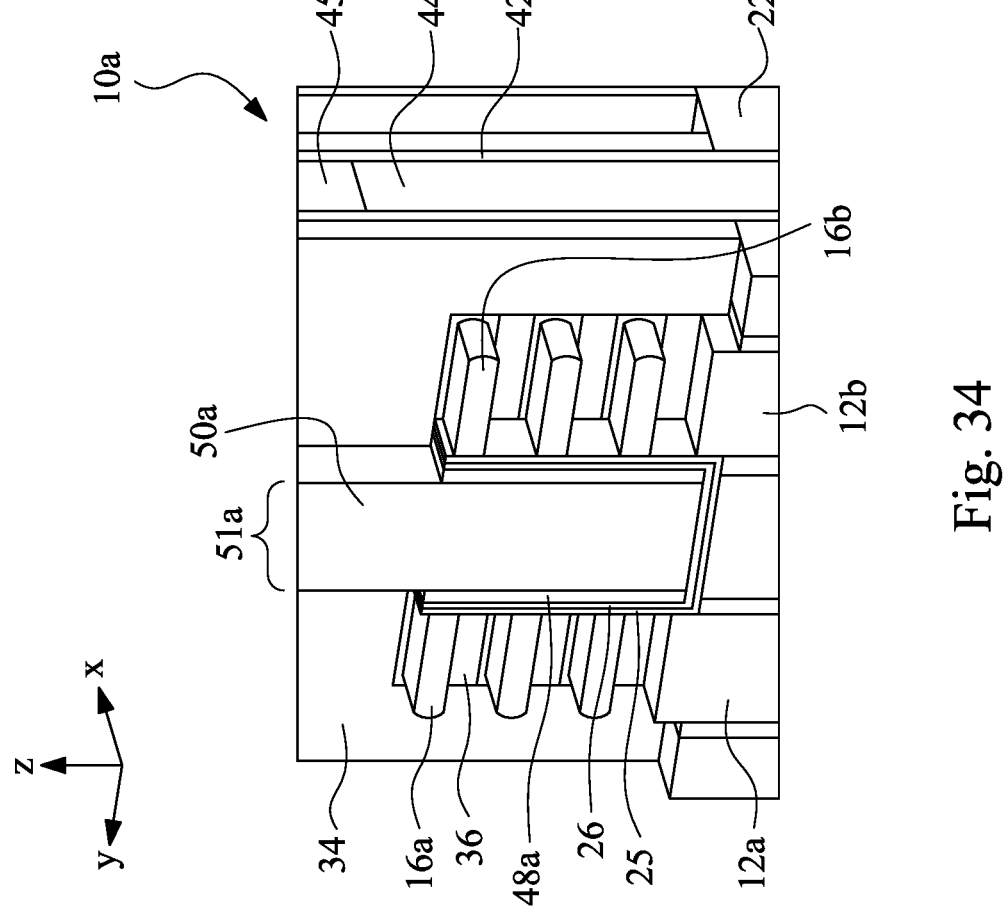

In operation 128, the sacrificial semiconductor layers 14a, 14b are removed from the fin structures 20a, 20b, as shown in FIG. 34. FIG. 34 is a schematic perspective sectional view along the line B-B in FIG. 2. In some embodiments, the semiconductor layers 14a, 14b can be removed during the same etch process or different processes. The semiconductor layers 14a, 14b can be selectively removed using a wet etchant such as, but not limited to, ammonium hydroxide (NH$_4$OH), tetramethylammonium hydroxide (TMAH), ethylenediamine pyrocatechol (EDP), or potassium hydroxide (KOH) solution. Removal of the semiconductor layers 14a, 14b results in nanosheets of the semiconductor layers 16a, 16b over the third and fourth surfaces of the dielectric wall 51a. The portions of the first sacrificial gate dielectric layer 25 formed on sidewalls of the fin structures 20a, 20b are also exposed.

Figure 35A:
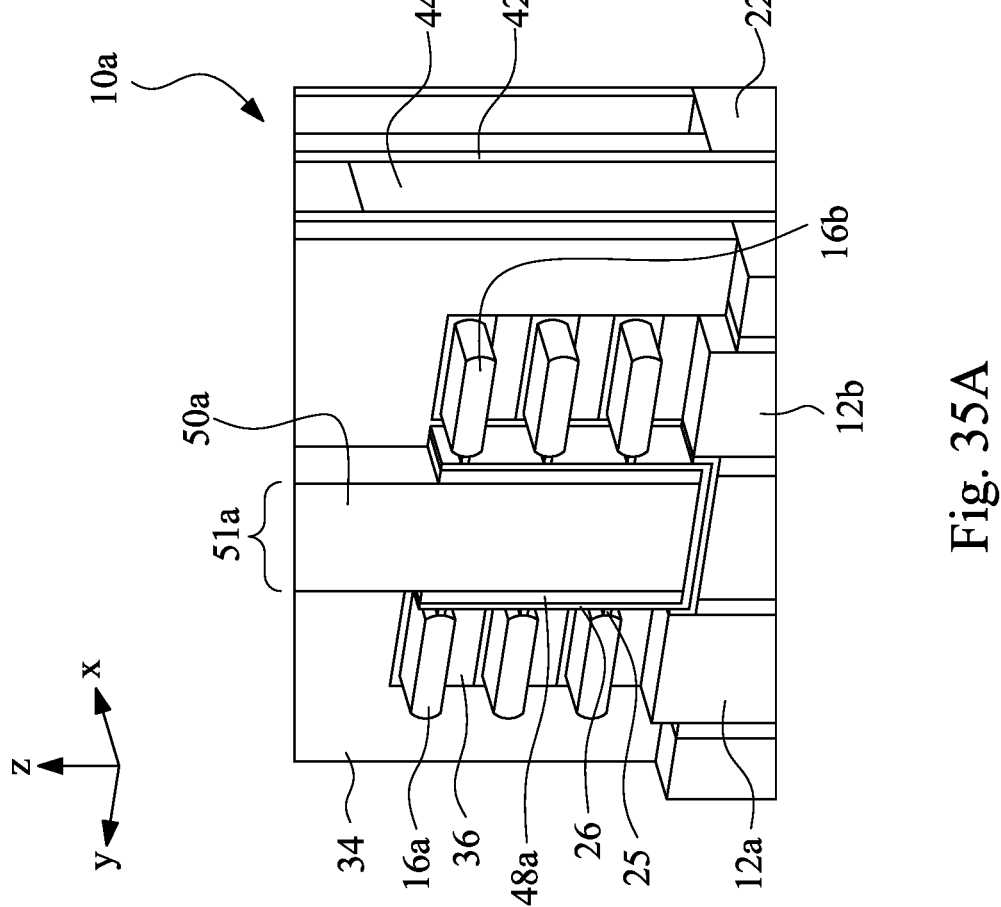
Figure 35B:
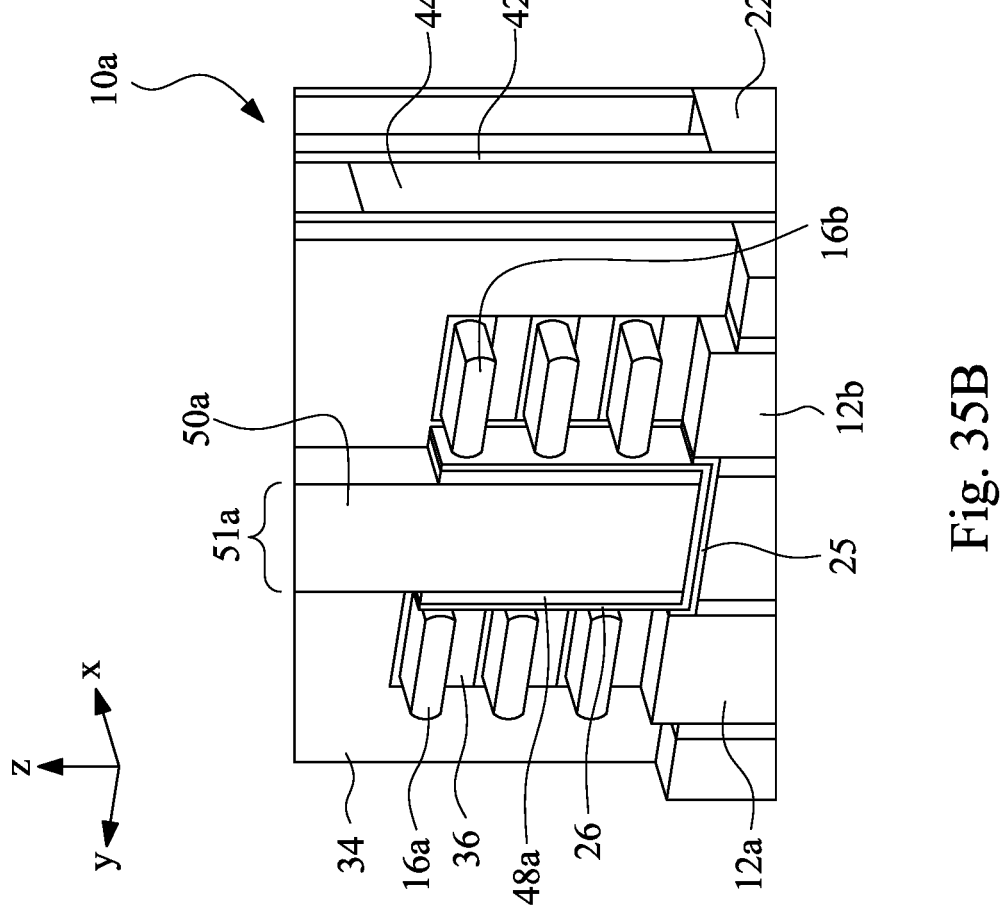

In operation 130a, an etch process is performed to remove at least a portion of first sacrificial gate dielectric layer 25 formed on sidewalls of the fin structures 20a, 20b, as shown in FIGS. 35A and 35B. FIGS. 35A and 35B are schematic perspective sectional views along the line B-B in FIG. 2.

In some embodiments, profiles of gate structures to be formed may be controlled by removing different amount of the first sacrificial gate dielectric layer 25 in operation 130a. In FIG. 35A, a portion of the first sacrificial gate dielectric layer 25 remains between the semiconductor layer 16a/16b and the second sacrificial gate dielectric layer 26. In FIG. 35B, the first sacrificial gate dielectric layer 25 is completely removed and the subsequent gate structure may surround all sides of the semiconductor layer 16a/16b. In some embodiments, the operation 130a may be omitted and the subsequent gate structure may surround the semiconductor layers 16a, 16b from three sides. When more of the first sacrificial gate dielectric layer 25 is removed, the effective length of the subsequent gate structure increases, leading to improved gate control performance. When more of the first sacrificial gate dielectric layer 25 remains, the low-k dielectric material in the dielectric liner layer 48 improves average capacitance (AC) performance.

Figure 36B:
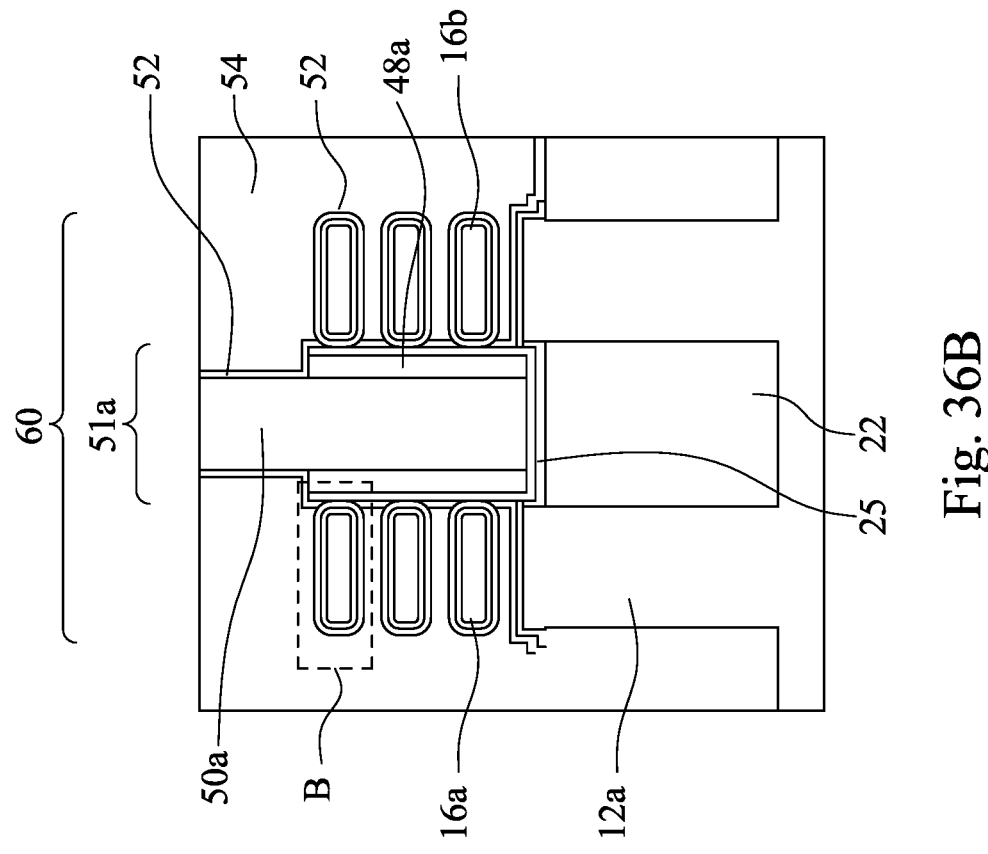
Figure 36A:
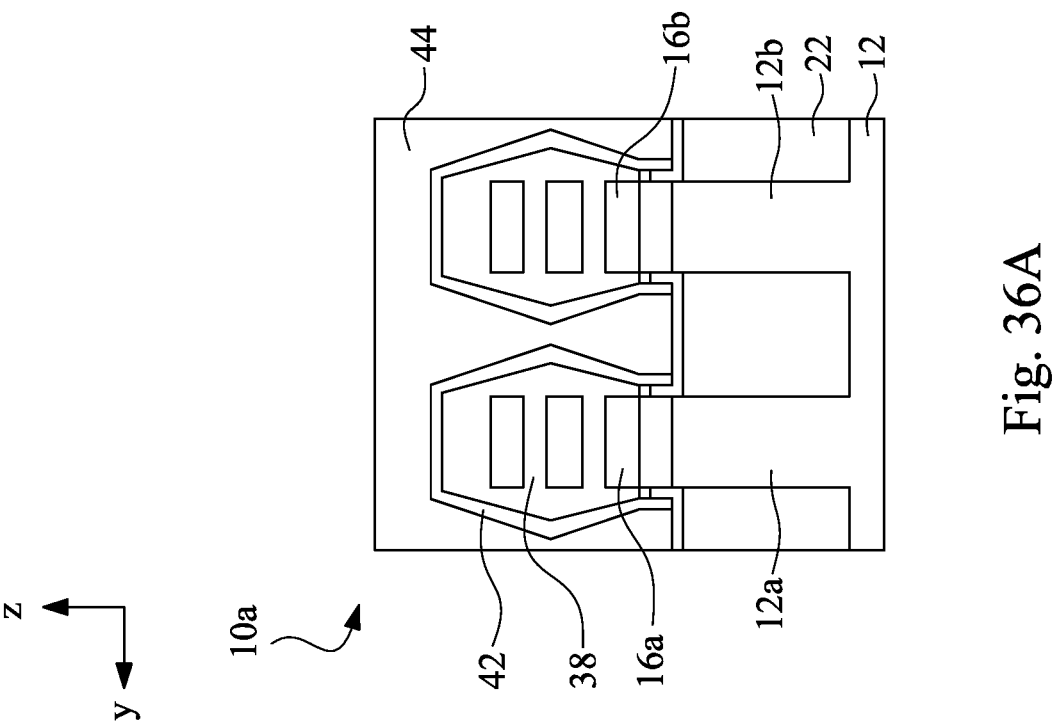
Figure 36C:
Figure 36C:
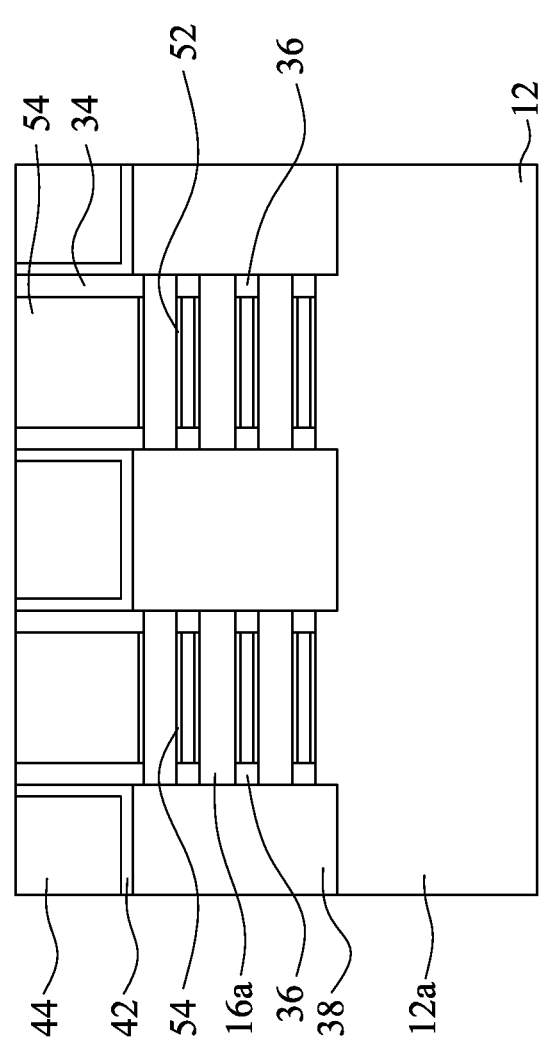
Figure 36C:
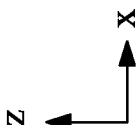
Figure 36D:
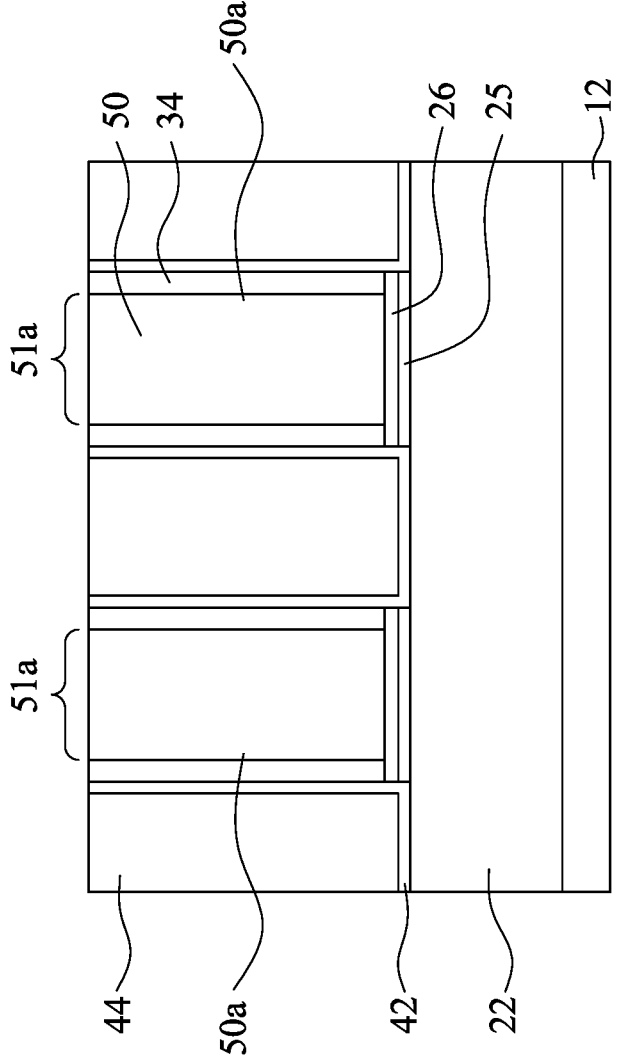
Figure 36D:
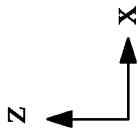
Figure 36E:
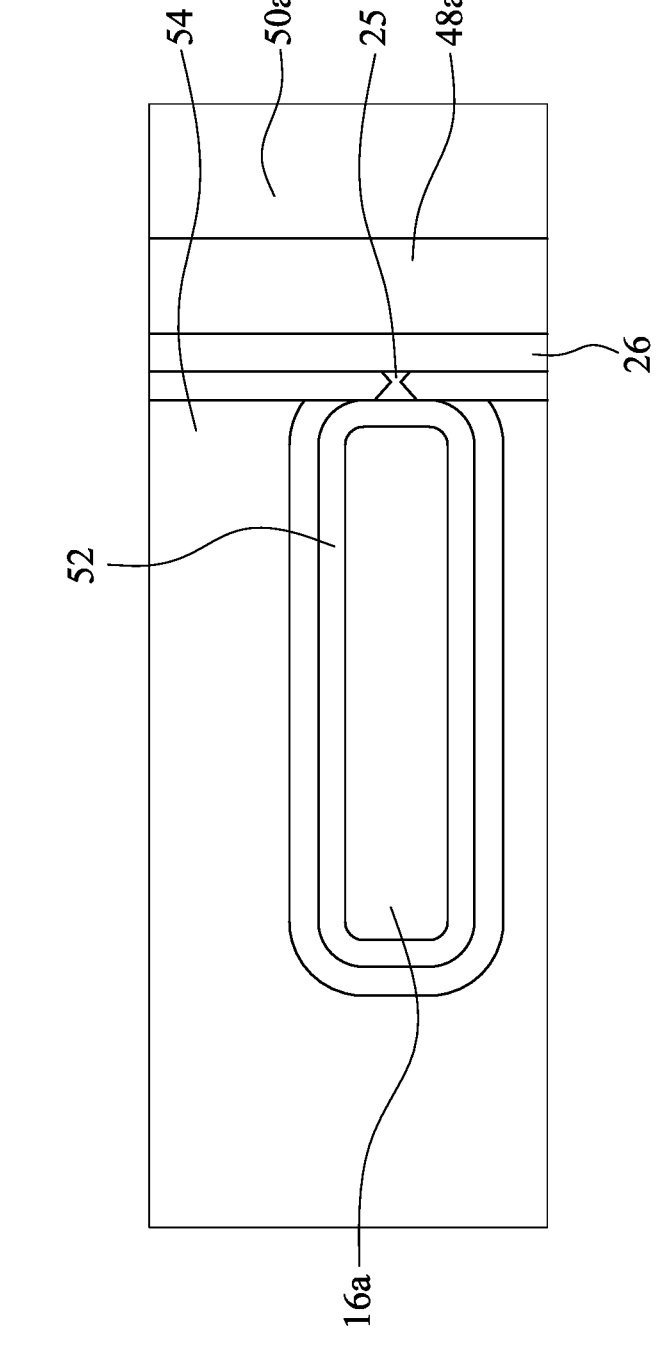

Operation 132 of the method 100a is similar to the operations 132 of the method 100, in which the replacement gate structures 58 are formed, as shown in FIGS. 36A-36E. FIG. 36A is a schematic cross sectional view along the A-A line in FIG. 2. FIG. 36B is a schematic perspective cross sectional view along the B-B line in FIG. 2. FIG. 36C is a schematic cross sectional view along the C-C line in FIG. 2. FIG. 36D is a schematic cross sectional view along the D-D line in FIG. 2. The replacement gate structure 58 may include a gate dielectric layer 52, and a gate electrode layer 54. In some embodiments, the replacement gate structure 58 further includes a conductive cap layer 56. FIG. 36E is a partial enlarged view of the cross sectional view in area B of FIG. 36B. FIG. 36E includes details of a π shaped gate profile according to embodiments of the present disclosure.

As shown in FIG. 36B, the semiconductor layers 16a, 16b, the gate dielectric layer 52 formed on the semiconductor layers 16a, 16b, the gate electrode layer 54, and the dielectric wall 51a form a forksheet structure 60a. The semiconductor layers 16a form a first channel region and the semiconductor layers 16b form a second channel region. The dielectric wall 51a is disposed between the first and second channel regions. In FIG. 36E, a segment of the first sacrificial gate dielectric layer 25 remains on the end portion of the semiconductor layer 16a, 16b. The gate dielectric layer 52 surrounds of the channel layer or the semiconductor layer 16a, 16b not cover by the first sacrificial gate dielectric layer 25. The gate dielectric layer 52 has a π-shaped profile in the cross section. A portion of the gate electrode layer 54 may be present between the semiconductor layer 16a, 16b and the dielectric wall 51a. Alternatively, the first sacrificial gate dielectric layer 25 may be removed completely or may remain entirely.

Figure 37A:
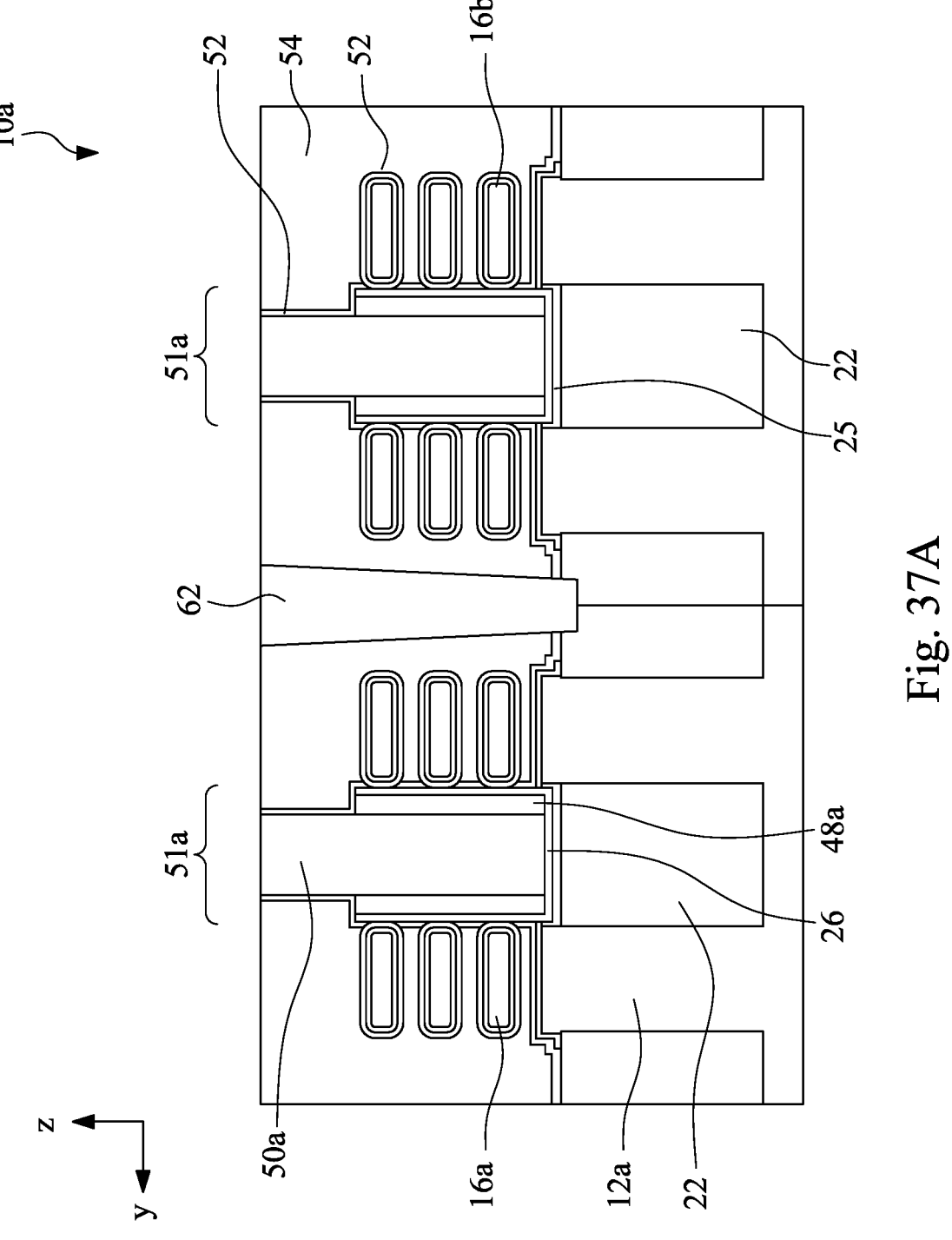

Operation 134 of the method 100a is similar to the operations 134 of the method 100, in which the cut gate structure 62 may be formed within the gate structure 58 adjacent the forksheet structure 60a, as shown in FIG. 37A. FIG. 37A is a schematic perspective cross sectional view along the B-B line in FIG. 2 through four fin structures. The gate electrode layer 54 and the conductive cap layer 56 may be patterned and cut into two sections by an opening. One or more dielectric material may then be filled in the opening to form the cut gate structure 62. The cut gate structure 62 electrically isolates the two sections of the gate electrode layer 54 and the conductive cap layer 56. The channel region including the semiconductor layers 16a are disposed between the dielectric wall 51a for the forksheet structure 60 and the cut gate structure 62.

Figure 37B:
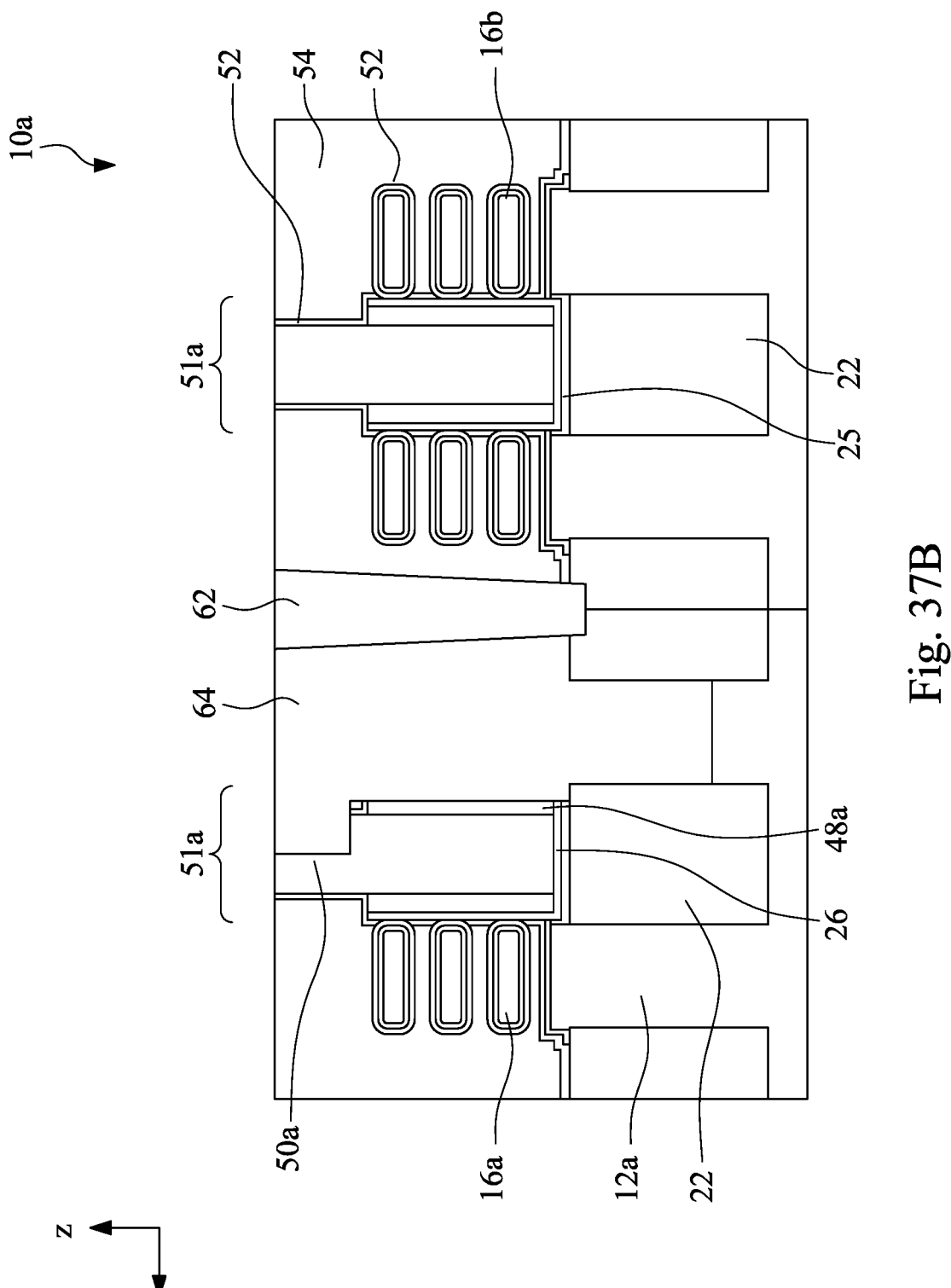

In some embodiments, the cut channel structure 64 may be formed between the dielectric wall 51 and the cut gate structure 62, as shown in FIG. 37B. The cut channel structure 64 may be formed by removing the semiconductor layers 16b and the gate structure therearound, and then depositing one or more dielectric layer. The cut channel structure 64 may be formed around cell edge to achieve desired circuit function.

Figure 38B:
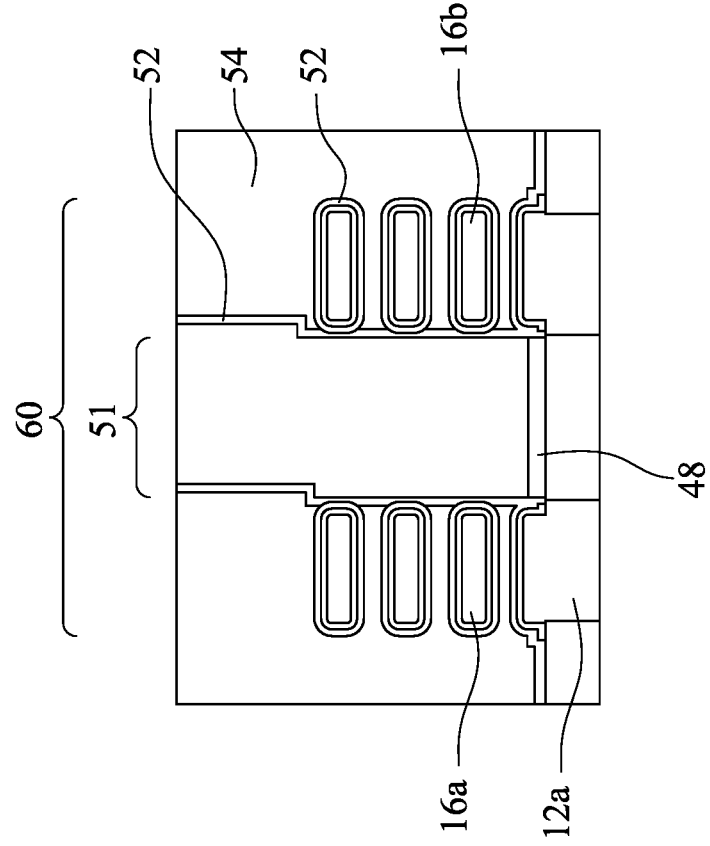
FIG. 38A-38B are schematic cross sectional views of a dielectric wall according to embodiments of the present disclosure.
Figure 38A:
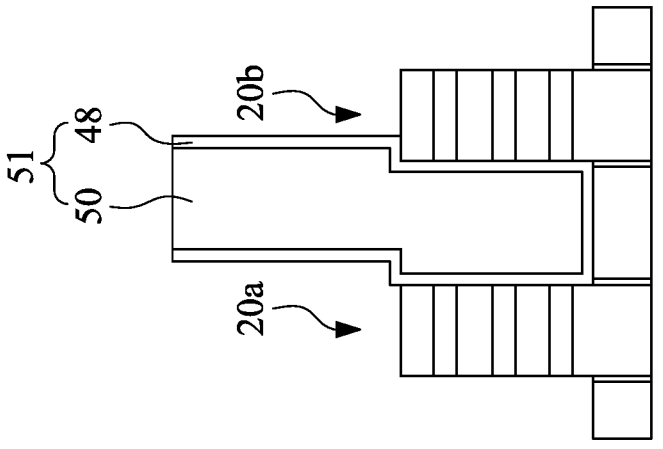

The methods of forming of a forksheet structure having a dielectric wall within a gate structure provide flexibility of gate profiles and also flexibilities to tolerant patterning overlay shift. FIGS. 38A and 38B schematically demonstrate the shape of the dielectric wall 51 there is an overlay shift in operation 118. Even though the opening 46 may be originally misaligned with the trench 21 between the semiconductor fin structures 20a, 20b, the lower portion of the dielectric wall 51 may shift back to align with the trench 21.

By limiting the dielectric wall to within the gate structure, the forksheet structure of the present disclosure eliminates leakage concerns, reduces source/drain pitch, and increases volume of the source/drain region, thus improving device performance. Embodiments of the present disclosure also provides flexibility to gate profile adjustment, thus, adjust capacitance performance or control. Additionally, the dielectric wall of the present disclosure may be formed from a low-k material, thus, with improved capacitance performance.

Some embodiments provide a semiconductor device, comprising: a first source/drain region; a second source/drain region disposed adjacent the first source/drain region; a forksheet structure comprising: a first channel region in contact with the first source/drain region; a second channel region in contact with the second source/drain region; a dielectric wall disposed between the first channel region and the second channel region, wherein the dielectric wall has a first surface facing the first channel region, a second surface facing the second channel region, a third surface connecting the first and second surfaces, and a fourth surface opposing the third surface; a first sidewall spacer disposed on a first side of the forksheet structure, wherein the first sidewall spacer is disposed between the first and second source/drain regions and the first and second channel regions; and a second sidewall spacer disposed on a second side of the forksheet structure, wherein the dielectric wall is disposed between the first sidewall spacer and the second sidewall spacer.

Some embodiments provide a semiconductor device, comprising: a first source/drain region; a second source/drain region; a first channel region disposed between and connected to the first source/drain region and the second source/drain region; a first gate structure comprising: a first gate dielectric layer disposed on the first channel region; and a first gate electrode layer disposed on the first gate dielectric layer; first and second sidewall spacers disposed on opposite sides of the first gate structure, wherein the first source/drain region is in contact with the first sidewall spacer, and the second source/drain region is in contact with the second sidewall spacer; and a dielectric wall, wherein the dielectric wall a first end, a second end, and a first surface connecting the first end and the second end, the first end of the dielectric wall terminates that the first sidewall spacers, the second end of the dielectric wall terminates at the second sidewall spacer, and the first dielectric layer in contact with the first surface of the dielectric wall.

Some embodiments provide a method comprising: forming a first fin structure and a second fin structure along a first direction; forming a sacrificial gate structure along a second direction and across the first and second fin structures; forming first and second sidewall spacers on opposing sidewalls of the sacrificial gate structure; etching back the first and second fin structures to form source/drain openings on opposing sides of the sacrificial gate structure; forming epitaxial source/drain regions in the source/drain openings; forming a wall opening in the sacrificial gate structure between the first and second sidewall spacers; forming a dielectric wall in the wall opening between the first and second sidewall spacers; removing the sacrificial gate structure; and forming a first replacement gate structure and a second replacement gate structure, wherein the dielectric wall isolates the first replacement gate structure from the second replacement gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:

forming a first fin structure and a second fin structure along a first direction;

forming a sacrificial gate structure along a second direction and across the first and second fin structures;

forming first and second sidewall spacers on opposing sidewalls of the sacrificial gate structure;

etching back the first and second fin structures to form source/drain openings on opposing sides of the sacrificial gate structure;

forming epitaxial source/drain regions in the source/drain openings;

forming a wall opening in the sacrificial gate structure between the first and second sidewall spacers and between the first and second fin structures;

forming a dielectric wall in the wall opening between the first and second sidewall spacers;

removing the sacrificial gate structure; and forming a first replacement gate structure and a second replacement gate structure, wherein the dielectric wall isolates the first replacement gate structure from the second replacement gate structure.

2. The method of claim 1, wherein forming the sacrificial gate structure comprises:

depositing a sacrificial gate dielectric layer;

depositing a sacrificial gate electrode layer over the sacrificial gate dielectric layer; and patterning the sacrificial gate electrode layer and the sacrificial gate dielectric layer to form the sacrificial gate structure, wherein the wall opening is formed through the sacrificial gate electrode layer, and the sacrificial gate dielectric layer is exposed in the wall opening.

3. The method of claim 2, wherein forming the dielectric wall comprises:

removing the sacrificial gate dielectric layer from the first fin structure and second fin structure;

depositing a dielectric liner layer in the wall opening; and depositing a dielectric filling layer over the dielectric liner layer.

4. The method of claim 3, wherein the first fin structure comprises two or more first semiconductor layers alternatively stacked with two or more second semiconductor layers, the method further comprising:

after removing the sacrificial gate structure, removing the two or more second semiconductor layers from the first fin structure; and removing at least a portion of the dielectric liner layer disposed between the two or more first semiconductor layers and the dielectric filling layer.

5. The method of claim 1, wherein forming the sacrificial gate structure comprises:

depositing a first sacrificial gate dielectric layer;

depositing a second sacrificial gate dielectric layer over the first sacrificial gate dielectric layer;

depositing a sacrificial gate electrode layer over the second sacrificial gate dielectric layer; and patterning the sacrificial gate electrode layer, the second sacrificial gate dielectric layer, and the first sacrificial gate dielectric layer to form the sacrificial gate structure, wherein the wall opening is formed within the sacrificial gate electrode layer, and a gap volume of the sacrificial gate electrode layer remains between the wall opening and the first fin structure.

6. The method of claim 5, wherein forming the dielectric wall comprises:

depositing a first dielectric filling layer in the wall opening;

removing the sacrificial gate electrode layer and forming an air gap in the gap volume; and depositing a second dielectric filling layer in the air gap.

7. A method, comprising:

forming a first fin structure and a second fin structure along a first direction;

forming a sacrificial gate structure along a second direction and across the first and second fin structures;

forming first and second sidewall spacers on opposing sidewalls of the sacrificial gate structure;

etching back the first and second fin structures to form source/drain openings on opposing sides of the sacrificial gate structure;

forming a first source/drain region and a second source/drain region in the source/drain openings, wherein the first source/drain region is connected to the first fin structure, and the second source/drain region is connected to the second fin structure; and forming a forksheet structure between the first and second sidewall spacers, wherein the forksheet structure comprises:

a first channel region comprising a portion of the first fin structure;

a second channel region comprising a portion of the second fin structure; and a dielectric wall disposed between the first channel region and the second channel region, wherein the dielectric wall has a first surface facing the first channel region, a second surface facing the second channel region, a third surface connecting the first and second surfaces, and a fourth surface opposing the third surface, the first sidewall spacer is disposed on a first side of the forksheet structure, and the second sidewall spacer is disposed on a second side of the forksheet structure, wherein the dielectric wall comprises a dielectric filling layer, wherein the dielectric filling layer includes a first dielectric filling layer extending from the third surface to the fourth surface of the dielectric wall, and a second dielectric filling layer disposed on a lower portion of the first surface and second surface of the dielectric wall.

8. The method of claim 7, wherein the forksheet structure further comprises:

a first gate dielectric layer disposed on the first channel region; and a first gate electrode layer disposed on the first gate dielectric layer, wherein the first gate dielectric layer is in contact with the first surface of the dielectric wall.

9. The method of claim 8, wherein the dielectric wall comprises one or more low-k dielectric material.

10. The method of claim 9, wherein the dielectric wall comprises:

a dielectric liner layer, wherein the dielectric filling layer is disposed over the dielectric liner layer, wherein the third surface and fourth surface of the dielectric wall comprises the dielectric liner layer.

11. The method of claim 10, wherein the first surface and second surface of the dielectric wall comprise the dielectric filling layer.

12. The method of claim 11, wherein a portion of the first surface and second surface of the dielectric wall comprise the dielectric liner layer.

13. The method of claim 9, wherein the dielectric wall further comprises:

a sacrificial dielectric layer disposed on the second dielectric filling layer.

14. The method of claim 8, further comprising forming a cut gate dielectric feature extending between the first and second sidewall spacers, wherein the cut gate dielectric feature and the dielectric wall are disposed on opposing sides of the first channel region.

15. A method, comprising:

forming a semiconductor device comprising:

a first source/drain region;

a second source/drain region;

a first channel region disposed between and connected to the first source/drain region and the second source/drain region;

a first gate structure comprising:

a first gate dielectric layer disposed on the first channel region; and a first gate electrode layer disposed on the first gate dielectric layer;

first and second sidewall spacers disposed on opposite sides of the first gate structure, wherein the first source/drain region is in contact with the first sidewall spacer, and the second source/drain region is in contact with the second sidewall spacer;

a dielectric wall, wherein the dielectric wall has a first end, a second end, and a first surface connecting the first end and the second end, the first end of the dielectric wall terminates at the first sidewall spacers, the second end of the dielectric wall terminates at the second sidewall spacer, and the first gate dielectric layer in contact with the first surface of the dielectric wall, wherein the dielectric wall comprises:

a dielectric liner layer; and a dielectric filling layer disposed over the dielectric liner layer, wherein the first surface includes the dielectric filling layer and a portion of the dielectric liner layer extending from the dielectric filling layer, and the portion of the dielectric liner layer is in contact with the first channel region.

16. The method of claim 15, wherein the first channel region comprises two or more semiconductor channels, and the first gate dielectric layer is formed on each of the semiconductor channel, and the portion of the dielectric liner layer has a height shorter than a height of the semiconductor channels.

17. The method of claim 16, wherein the first gate dielectric layer has a T-shaped profile.

18. The method of claim 15, further comprising:

a third source/drain region;

a fourth source/drain region;

a second channel region disposed between and connected to the third source/drain region and the fourth source/drain region; and a second gate structure comprising:

a second gate dielectric layer disposed on the second channel region; and a second gate electrode layer disposed on the second gate dielectric layer, wherein the dielectric wall has a second surface opposing the first surface and connecting the first end and second end of the dielectric wall, and the second gate dielectric layer in contact with the second surface of the dielectric wall.

19. The method of claim 7, wherein forming the sacrificial gate structure comprises:

depositing a first sacrificial gate dielectric layer;

depositing a second sacrificial gate dielectric layer over the first sacrificial gate dielectric layer; and depositing a sacrificial gate electrode layer over the second sacrificial gate dielectric layer, wherein the dielectric filling layer is disposed over the second sacrificial gate dielectric layer.

20. The method of claim 19, wherein the first sacrificial gate dielectric layer is a nitrogen containing layer and the second sacrificial gate dielectric layer is an oxygen containing layer.

* * * * *